(12) United States Patent
Inukai

(10) Patent No.: US 7,053,890 B2
(45) Date of Patent: May 30, 2006

(54) DISPLAY DEVICE

(75) Inventor: Kazutaka Inukai, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 574 days.

(21) Appl. No.: 09/886,148

(22) Filed: Jun. 22, 2001

(65) Prior Publication Data

US 2002/0000576 A1    Jan. 3, 2002

(30) Foreign Application Priority Data

Jun. 22, 2000  (JP) .............................. 2000-188518

(51) Int. Cl.
*G09G 5/00*   (2006.01)
(52) U.S. Cl. .............................. 345/211; 345/76; 345/80
(58) Field of Classification Search .................. 345/82, 345/76, 45, 36, 80, 211, 212
See application file for complete search history.

(56) References Cited

U.S. PATENT DOCUMENTS

| | | |
|---|---|---|
| 4,356,429 A | 10/1982 | Tang |
| 4,539,507 A | 9/1985 | VanSlyke et al. |
| 4,720,432 A | 1/1988 | VanSlyke et al. |
| 4,769,292 A | 9/1988 | Tang et al. |
| 4,885,211 A | 12/1989 | Tang et al. |
| 4,950,950 A | 8/1990 | Perry et al. |
| 5,047,687 A | 9/1991 | VanSlyke |
| 5,059,861 A | 10/1991 | Littman et al. |
| 5,073,446 A | 12/1991 | Scozzafava et al. |
| 5,151,629 A | 9/1992 | VanSlyke |
| 5,247,190 A | 9/1993 | Friend et al. |
| 5,294,869 A | 3/1994 | Tang et al. |
| 5,294,870 A | 3/1994 | Tang et al. |
| 5,399,502 A | 3/1995 | Friend et al. |
| 5,839,456 A | 11/1998 | Han |
| 5,936,686 A | 8/1999 | Okumura et al. |
| 5,943,032 A | 8/1999 | Nagaoka et al. |
| 5,962,962 A | 10/1999 | Fujita et al. |
| 5,973,311 A * | 10/1999 | Sauer et al. ............. 250/208.1 |
| 6,069,600 A | 5/2000 | Saishu et al. |
| 6,229,508 B1 * | 5/2001 | Kane ........................... 345/82 |
| 6,246,180 B1 | 6/2001 | Nishigaki |
| 6,246,384 B1 | 6/2001 | Sano |
| 6,362,798 B1 | 3/2002 | Kimura et al. |

(Continued)

FOREIGN PATENT DOCUMENTS

EP           0 717 445           6/1996

(Continued)

OTHER PUBLICATIONS

Han et al., "3.8 Green OLED with low temperature poly Si TFT," EuroDisplay '99, Sep. 6-9, 1999, pp. 27-30.

(Continued)

*Primary Examiner*—Kent Chang
(74) *Attorney, Agent, or Firm*—Fish & Richardson P.C.

(57) ABSTRACT

An active matrix display device capable of vivid color display having many tones is provided. The display device is characterized in that each of a plurality of pixels comprises a first TFT for switching, a second TFT for switching, a TFT for erasing, a TFT for EL driving, and an EL element, driving of the TFT for EL driving is controlled by the first TFT for switching, the second TFT for switching, and the TFT for erasing, and light emission by the EL element is controlled by the TFT for EL driving.

82 Claims, 28 Drawing Sheets

U.S. PATENT DOCUMENTS

| | | | |
|---|---|---|---|
| 6,384,804 B1 * | 5/2002 | Dodabalapur et al. | ........ 345/82 |
| 6,414,653 B1 | 7/2002 | Kobayashi | |
| 6,424,326 B1 | 7/2002 | Yamazaki et al. | |
| 6,426,734 B1 | 7/2002 | Sano | |
| 2002/0044140 A1 | 4/2002 | Inukai | |
| 2002/0070913 A1 | 6/2002 | Kimura et al. | |
| 2003/0169218 A1 | 9/2003 | Kimura et al. | |

FOREIGN PATENT DOCUMENTS

| | | |
|---|---|---|
| EP | 0 781 075 | 6/1997 |
| EP | 1 003 150 | 5/2000 |
| EP | 1061497 | 12/2000 |
| EP | 1 103 946 | 5/2001 |
| EP | 1 148 467 | 10/2001 |
| JP | 08-078159 | 3/1996 |
| JP | 08/241048 | 9/1996 |
| JP | 10-189525 | 7/1998 |
| JP | 11-272235 | 10/1999 |
| JP | 11-338786 | 12/1999 |
| JP | 2000-221942 | 8/2000 |
| JP | 2000-235370 | 8/2000 |
| JP | 2000-347621 | 12/2000 |
| JP | 2001-42822 | 2/2001 |
| JP | 2001-60076 | 3/2001 |
| JP | 2001-343933 | 12/2001 |
| WO | WO90/13148 | 11/1990 |

OTHER PUBLICATIONS

Shimoda et al., "Technology for Active Matrix Light Emitting Polymer Displays," IEDM '99, pp. 107-110.

Shimoda et al., "High Resolution Light Emitting Polymer Display Driven by Low Temperature Polysilicon Thin Film Transistor with Integrated Driver," Asia Display 1998, pp. 217-220.

Shimoda et al., "Invited Paper: Current Status and Future of Light-Emitting Polymer Display Driven by Poly-Si TFT," SID '99 Digest, pp. 372-375.

Kimura et al., "TFT-LEPD with Image Uniformity by Area Ratio Gray Scale," EuroDisplay '99, Sep. 6-9, 1999, pp. 71-74.

Kimura et al., "Low-Temperature Poly-Si TFT Driven Light-Emitting-Polymer Displays and Digital Gray Scale for Uniformity," AMD3-1, IDW '99, pp. 171-174.

Japanese Patent Application Laid-Open No. 10-92576.

Tsutsui et al., "Electroluminescence in Organic Thin Films," Photochemical Processes in Organized Molecular Systems, 1991, pp. 437-450.

M.A. Baldo et al., "Highly Efficient Phosphorescent Emission from Organic Electroluminescent Devices," Nature vol. 395, Sep. 10, 1998, pp. 151-154.

M.A. Baldo et al., "Very High-Efficiency Green Organic Light-Emitting Devices Based on Electrophosphorescence," Applied Physics Letters vol. 75, No. 1, Jul. 5, 1999, pp. 4-6.

Tsutsui et al., "High Quantum Efficiency in Organic Light-Emitting Devices with Iridium-Complex as a Triplet Emissive Center," Japanese Journal of Applied physics vol. 38, Part 12B, Dec. 15, 1999, pp. L1502-L1504.

H. Shenk et al. "Polymers for Light-Emitting Diodes," Euro Display Proceedings 1999, p. 33-37.

Kazutaka Inukai, "Electronic Device", specification, claims and drawings, filed Nov. 28, 2000, U.S. Appl. No. 09/724,387.

Jun Koyama, "Electric Device", specification, claims and drawings, filed Nov. 29, 2000, U.S. Appl. No. 09/725,798.

Kazutaka Inukai, "Electronic Device", specification, claims and drawings, filed Dec. 22, 2000, U.S. Appl. No. 09/747,646.

Hajime Kimura et al., "Electronic Device and Method of Driving the Same", specification, claims and drawings, filed Apr. 17, 2001, U.S. Appl. No. 09/836,719.

Kazutaka Inukai, "Light Emitting Device", specification, claims and drawings, filed Apr. 23, 2001, U.S. Appl. No. 09/840,584.

Hajime Kimura, "Light Emitting Device and Electronic Device", specification, claims and drawings, filed Nov. 6, 2001, U.S. Appl. No. 09/992,569.

Hajime Kimura, "Light Emitting Device and Electronic Device", specification, claims and drawings, filed Feb. 20, 2002, U.S. Appl. No. 10/079,072.

Singapore Search and Examination Report (Application No. 200103832-2), Oct. 13, 2004, 8 pages.

* cited by examiner

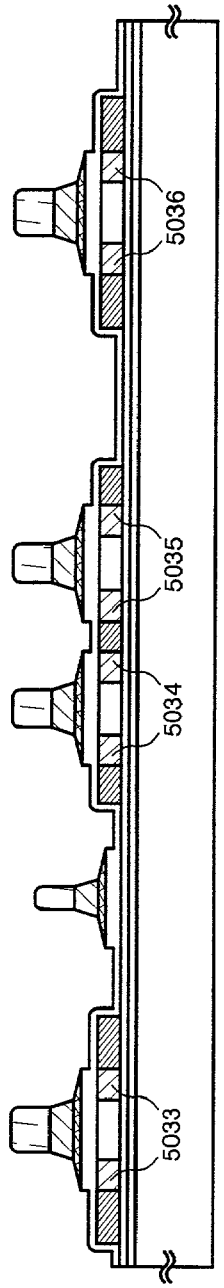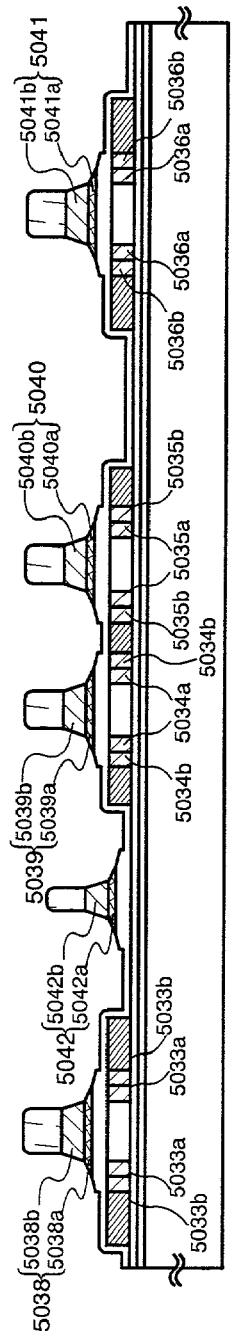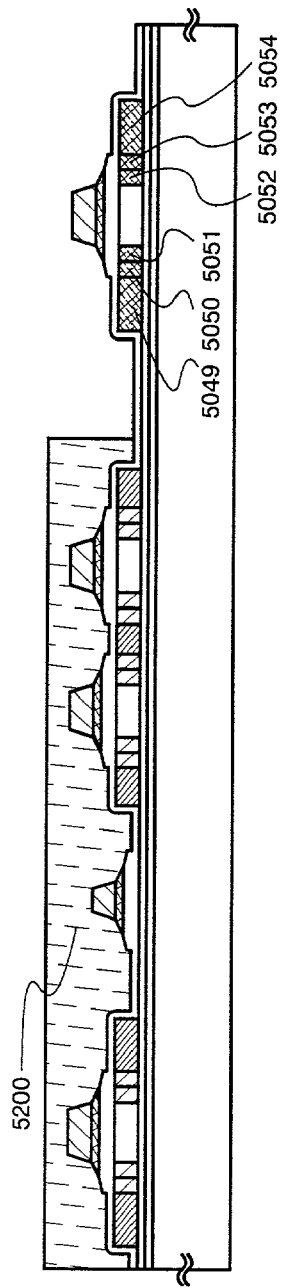
Fig. 12A
Fig. 12B
Fig. 12C

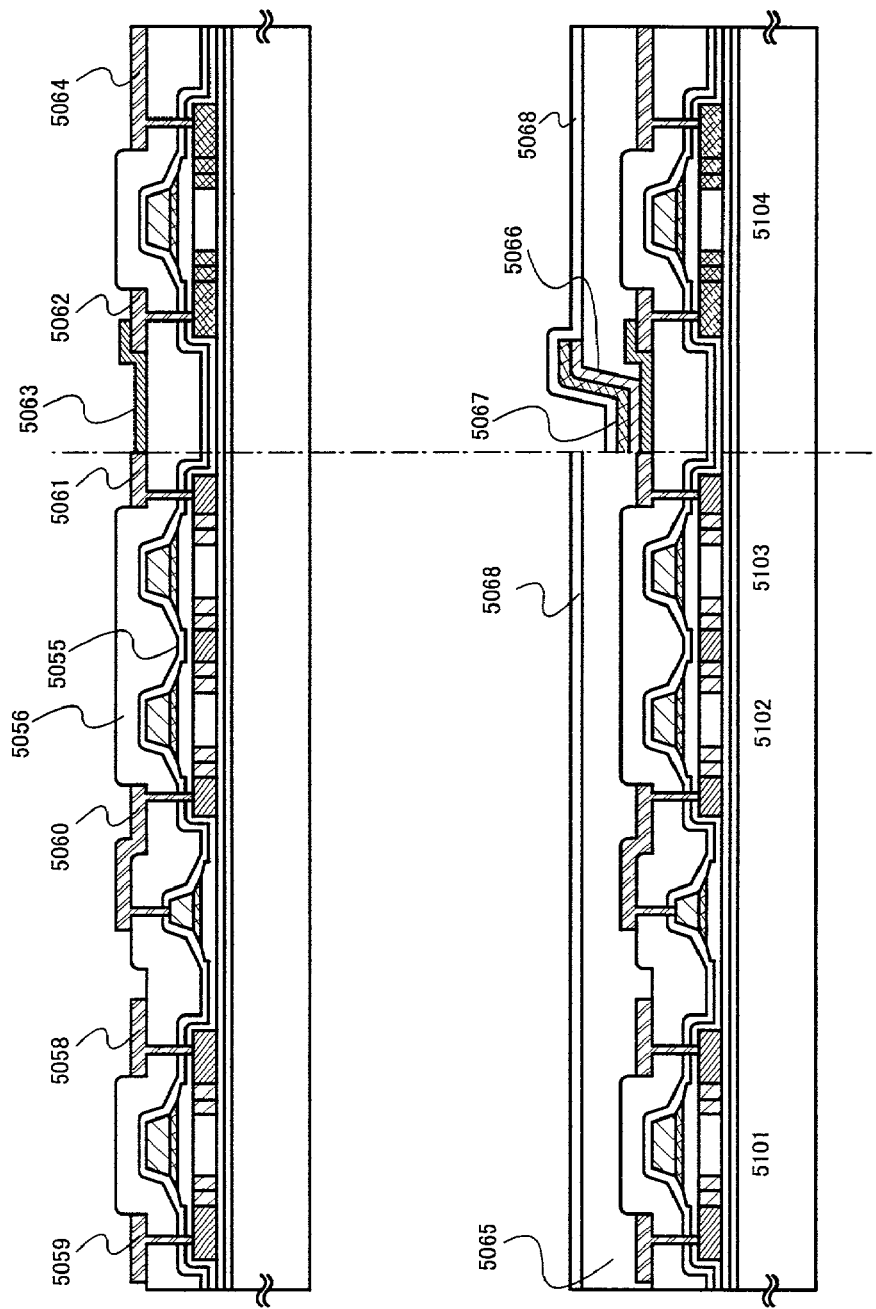

DISPLAY DEVICE

BACKGROUND OF THE INVENTION

1. Field of the Invention

The present invention relates to an electronic display formed by forming EL (electroluminescence) elements on a substrate. In particular, the present invention relates to an EL display using semiconductor elements (elements using a semiconductor thin film). Further, the present invention relates to a display device with an EL display used in its display portion.

2. Description of the Related Art

Recently, technology for forming TFTs on a substrate has greatly progressed, and its application to an active matrix electronic display is actively developed. In particular, TFTs using a polysilicon film have higher field effect mobility (also referred to as mobility) than that of conventional TFTs using an amorphous silicon film, and thus, they are capable of high-speed operation, which makes it possible to control pixels with a driver circuit formed on the substrate having the pixels formed thereon, while, conventionally, such control of pixels is performed by a driver circuit provided outside the substrate.

Since various kinds of circuits and elements are formed on one substrate in such an active matrix electronic display, there are various advantages such as reduction in the manufacturing cost, miniaturization of the electronic display, improvement in yield, and improvement in throughput.

In addition, active matrix EL displays having EL elements as light emitting elements are actively researched. EL displays are also referred to as organic EL displays (OELDs) or organic light emitting diodes (OLEDs).

Different from a liquid crystal display, an EL display is of a light emitting type. An EL element is structured such that a layer containing an organic compound which causes luminescence by applying an electric field thereto (hereinafter referred to as an EL layer) is sandwiched between a pair of electrodes (an anode and a cathode). Normally, the EL layer has a laminated structure. A typical laminated structure is "a positive hole transport layer/a light emission layer/an electron transport layer" proposed by Tang et al. of Eastman Kodak Company. This structure has a very high light emission efficiency, and thus, is adopted by almost all EL displays under research and development at present.

The structure may also be such that "a positive hole injection layer/a positive hole transport layer/a light emission layer/an electron transport layer" or "a positive hole injection layer/a positive hole transport layer/a light emission layer/an electron transport layer/an electron injection layer" are laminated in this order on an anode. Further, a fluorescent pigment or the like may be doped into the light emission layer.

In the present specification, all layers provided between a cathode and an anode are collectively referred to as an EL layer. Therefore, all of the above-mentioned positive hole injection layer, positive hole transport layer, light emission layer, electron transport layer, and electron injection layer are included in the EL layer.

When the pair of electrodes apply predetermined voltage to the EL layer structured as in the above, carriers recombine in the light emission layer to emit light. That an EL element emits light is herein referred to as "the EL element is driven". It is also to be noted that a light emitting element formed of an anode, an EL layer, and a cathode is herein referred to as an EL element.

Light emitted by an EL layer can be broken down into light emitted when a particle returns from a singlet excited state to a ground state (fluorescence) and light emitted when a particle returns from a triplet excited state to a ground state (phosphorescence). In the present invention, either one of the above two kinds of light emission may be used, or alternatively, both of them may be used.

Methods of driving an EL display include an analog driving method (analog driving). An analog-driven EL display is described with reference to FIGS. 26 and 27.

FIG. 26 illustrates a structure of a pixel portion 1800 of an analog-driven EL display. Gate signal lines G1–Gy to which a gate signal from a gate signal line driver circuit is inputted are connected to gate electrodes of TFTs 1801 for switching of the respective pixels. One of a source region and a drain region of each of the TFTs 1801 for switching of each pixel is connected to a source signal line (also referred to as a data signal line) S1, . . . , Sx to which an analog video signal is inputted, while the other is connected to a gate electrode of a TFT 1804 for EL driving of each pixel and to a capacitor 1808 of each pixel.

A source region of the TFT 1804 for EL driving of each pixel is connected to a power supply line V1, . . . , Vx, while a drain region of the TFT 1804 for EL driving is connected to an EL element 1806. Electric potential of the power supply lines V1 to Vx is referred to as power source potential. Further, the power supply lines V1 to Vx are connected to capacitors 1808 of the respective pixels.

The EL element 1806 has an anode, a cathode, and an EL layer provided between the anode and the cathode. In case the anode of the EL element 1806 is connected to the drain region of the TFT 1804 for EL driving, the anode of the EL element 1806 is a pixel electrode while its cathode is an opposing electrode. Conversely, in the case where the cathode of the EL element 1806 is connected to the drain region of the TFT 1804 for EL driving, the anode of the EL element 1806 is an opposing electrode while its cathode is a pixel electrode.

It is to be noted that the electric potential of an opposing electrode is herein referred to as opposing potential, and a power source which applies the opposing potential to an opposing electrode is herein referred to as an opposing power source. The difference between the potential of a pixel electrode and the potential of an opposing electrode is voltage for EL driving, which is applied to the EL layer.

FIG. 27 illustrates a timing chart in the case where the EL display illustrated in FIG. 26 is driven in an analog method. A period from the time when one gate signal line is selected to the time when the next gate signal line is selected is referred to as one line period (L). A period from the time when one image is displayed to the time when the next image is displayed is one frame period (F). With regard to the EL display illustrated in FIG. 26, since the number of the gate signal lines is y, y line periods (L1 to Ly) are provided in one frame period.

In the present specification, that a gate signal line is selected means that all the thin film transistors whose gate electrodes are connected to the gate signal line are in the ON state.

As the resolution becomes higher, the number of line periods in one frame period increases, and accordingly, a driver circuit has to be driven at a higher frequency.

First, the power supply lines V1 to Vx are held at a certain power source potential. The opposing potential which is the potential of the opposing electrodes is also held at a certain potential, which has different power source potential such that the EL elements emit light.

In a first line period (L1), the gate signal line G1 is selected according to a gate signal inputted from a gate signal line driver circuit to the gate signal line G1.

Then, an analog video signal is sequentially inputted to the source signal lines S1 to Sx. Since all the TFTs 1801 for switching connected to the gate signal line G1 are in the ON state, the analog video signal inputted to the source signal lines S1 to Sx is inputted through the TFTs 1801 for switching to the gate electrodes of the TFTs 1804 for EL driving.

The amount of electric current through channel forming regions of the TFTs 1804 for EL driving is controlled by the magnitude of the potential (voltage) of the signal inputted to the gate electrodes of the TFTs 1804 for EL driving. Therefore, the potential applied to the pixel electrodes of the EL elements 1806 is determined by the magnitude of the potential of the analog video signal inputted to the gate electrodes of the TFTs 1804 for EL driving. The EL elements 1806 emit light under control of the potential of the analog video signal.

The above-described operation is repeated. When the analog video signal has been inputted to all the source signal lines S1 to Sx, the first line period (L1) ends. It is to be noted that the period inputting of the analog video signal to the source signal lines S1 to Sx and a horizontal retrace line period may be one line period.

Then, in a second line period (L2), the gate signal line G2 is selected by the gate signal. As in the case of the first line period (L1), an analog video signal is sequentially inputted to the source signal lines S1 to Sx.

When the gate signal is inputted to all the gate signal lines G1 to Gy, all the line periods L1 to Ly end. When all the line periods L1 to Ly end, one frame period ends. During one frame period, all the pixels carry out display to form one image. It is to be noted that all the line periods L1 to Ly plus a vertical retrace line period may be one frame period.

As described above, the amount of light emitted by the EL elements 1806 is controlled according to the analog video signal. By controlling the amount of the emitted light, gradation display is carried out. This method is the so-called analog driving method, where gradation display is carried out by changing the potential of the analog video signal inputted to the source signal lines.

The control of the amount of current supplied to the EL elements by the gate voltage of the TFTs for EL driving in the above-described analog driving method will be described in detail with reference to FIG. 28.

FIG. 28A is a graph illustrating the transistor characteristics of the TFT for EL driving. Reference numeral 2801 is referred to as $I_{DS}$-$V_{GS}$ characteristics (or an $I_{DS}$-$V_{GS}$ curve), wherein $I_{DS}$ is drain current and $V_{GS}$ is voltage between the gate electrode and the source region (gate voltage). By using this graph, the amount of current with regard to arbitrary gate voltage can be known.

When gradation display is carried out in the analog driving method, a region indicated by a dotted line 2802 of the above-mentioned $I_{DS}$-$V_{GS}$ characteristics is used to drive the EL element. FIG. 28B is an enlarged view of the region surrounded by the dotted line 2802.

In FIG. 28B, a region illustrated by diagonal lines is referred to as a saturated region. More specifically, in the region, the gate voltage satisfies $|V_{GS}-V_{TH}|<|V_{DS}|$, wherein $V_{TH}$ is threshold voltage. In this region, the drain current changes exponentially as the gate voltage changes. This region is used to perform current control by the gate voltage.

When a TFT for switching is turned on, an analog video signal inputted to a pixel is gate voltage of a TFT for EL driving. Here, according to the $I_{DS}$-$V_{GS}$ characteristics illustrated in FIG. 28A, drain current with regard to certain gate voltage is decided in a ratio of one to one. More specifically, correspondingly to the voltage of the analog video signal inputted to the gate electrode of the TFT for EL driving, the potential of the drain region is decided. Predetermined drain current passes through the EL element, and the EL element emits light in an amount which corresponds to the amount of current.

As described above, the amount of light emitted from the EL element is controlled by the video signal, and, by controlling the amount of light emission, gradation display is carried out.

However, the above-described analog driving method has a defect in that it is easily affected by variation in the characteristics of the TFTs. Even in the case where equal gate voltage is applied to the TFTs for EL driving of the respective pixels, if there is variation in the $I_{DS}$-$V_{GS}$ characteristics of the TFTs for EL driving, the same drain current can not be outputted. Further, as is clear from FIG. 28A, since the saturated region where the drain current changes exponentially as the gate voltage changes is used, a slight shift in the $I_{DS}$-$V_{GS}$ characteristics can result in considerable variation in the amount of outputted current even if equal gate voltage is applied. In this case, slight variation in the $I_{DS}$-$V_{GS}$ characteristics results in considerable difference in the amount of light emitted from the EL elements between adjacent pixels even if a signal of equal voltage is inputted thereto.

In this way, analog driving is quite sensitive to variation in the characteristics of the TFTs for EL driving, which is an obstacle to gradation display by a conventional active matrix EL display.

SUMMARY OF THE INVENTION

The present invention is made in view of the above problem, and an object of the present invention is to provide an active matrix EL display capable of vivid color display having many tones. Another object of the present invention is to provide a high-performance display device (electronic apparatus) provided with such an active matrix EL display as a display.

The inventor of the present invention thought that the problem with regard to the analog driving is attributable to gradation display performed by using the saturated region, which is easily affected by variation in the $I_{DS}$-$V_{GS}$ characteristics since the drain current changes exponentially as the gate voltage changes.

More specifically, in the case where there is variation in the $I_{DS}$-$V_{GS}$ characteristics, since, in the saturated region, the drain current changes exponentially as the gate voltage changes, different current (drain current) is outputted even when equal gate voltage is applied. As a result, there is a problem that desired gradation can not be attained.

Accordingly, the inventor of the present invention proposes a method where control of the amount of light emitted from EL elements is carried out not through control of current using the saturated region but mainly through control of time during which the EL elements emit light. According to the present invention, the amount of light emitted from the EL elements is controlled by time to carry out gradation display. Such a driving method where gradation display is carried out by controlling the light emission time of EL elements is referred to as a time-division driving method (hereinafter referred to as digital driving). It is to be noted that gradation display carried out by such a time-division driving method is referred to as time-division gradation display.

By the above-mentioned structure, according to the present invention, even if there is variation in the $I_{DS}$–$V_{GS}$ characteristics to some extent, a situation can be avoided that there is considerable difference in the amount of light emitted from the EL elements between adjacent pixels even if a signal of equal voltage is inputted thereto.

BRIEF DESCRIPTION OF THE DRAWINGS

FIGS. 12A–12C illustrate the manufacturing process of the EL display according to the present invention.

FIGS. 13A and 13B illustrate the manufacturing process of the EL display according to the present invention.

DETAILED DESCRIPTION OF THE PREFERRED EMBODIMENTS

A structure and a driving method of an EL display according to the preset invention are described in the following. Here, a case where $2^n$ tones are displayed according to an n-bit digital video signal is described.

Figure 1:
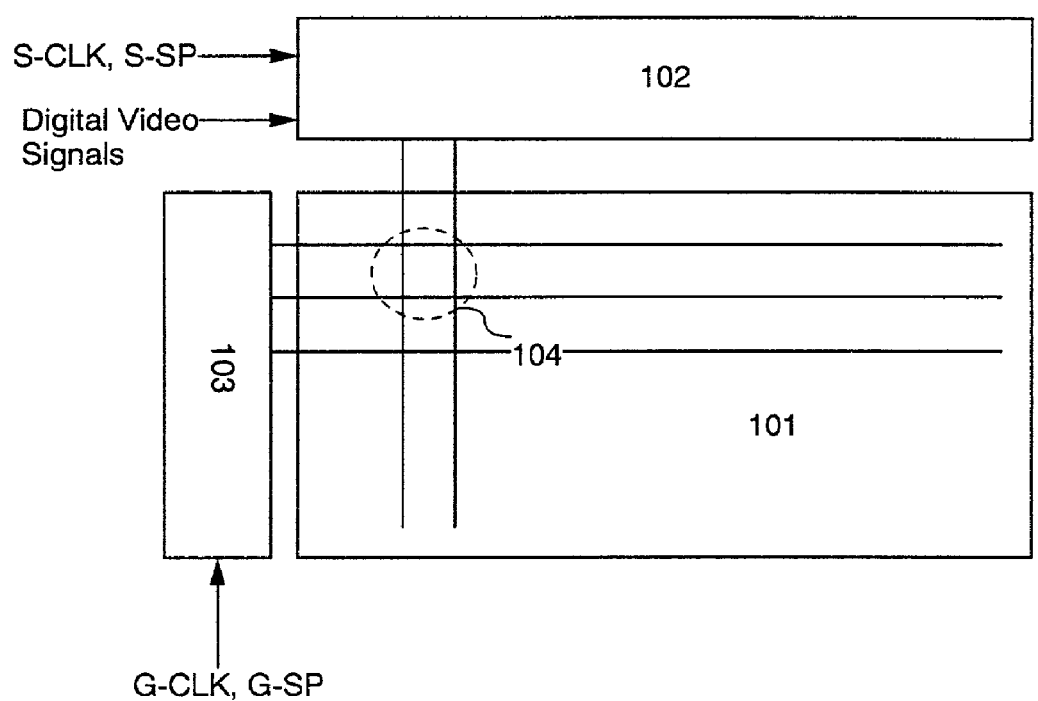
FIG. 1 is a block diagram illustrating a circuit structure of an EL display according to the present invention.

FIG. 1 illustrates an exemplary block diagram of an EL display according to the present invention. The EL display illustrated in FIG. 1 has a pixel portion 101 formed of TFTs formed on a substrate, a source signal line driver circuit 102 disposed on the periphery of the pixel portion 101, and a gate signal line driver circuit 103. It is to be noted that, though the EL display of the present embodiment has one source signal line driver circuit and one gate signal line driver circuit, the present invention is not limited thereto, and there may be two or more source signal line driver circuits and two or more gate signal line driver circuits.

A clock signal for sources (S-CLK) and a start pulse signal for the sources (S-SP) are inputted to the source signal line driver circuit 102. The source signal line driver circuit 102 is driven by the clock signal for the sources (S-CLK) and the start pulse signal for the sources (S-SP).

A clock signal for gates (G-CLK) and a start pulse signal for the gates (G-SP) are inputted to the gate signal line driver circuit 103. The gate signal line driver circuit 103 is driven by the clock signal for the gates (G-CLK) and the start pulse signal for the gates (G-SP).

In the present invention, the source signal line driver circuit 102 and the gate signal line driver circuit 103 may be provided on the substrate having the pixel portion 101 provided thereon, or alternatively, may be provided on an IC chip and connected through an FPC or a TAB to the pixel portion 101.

Figure 2:
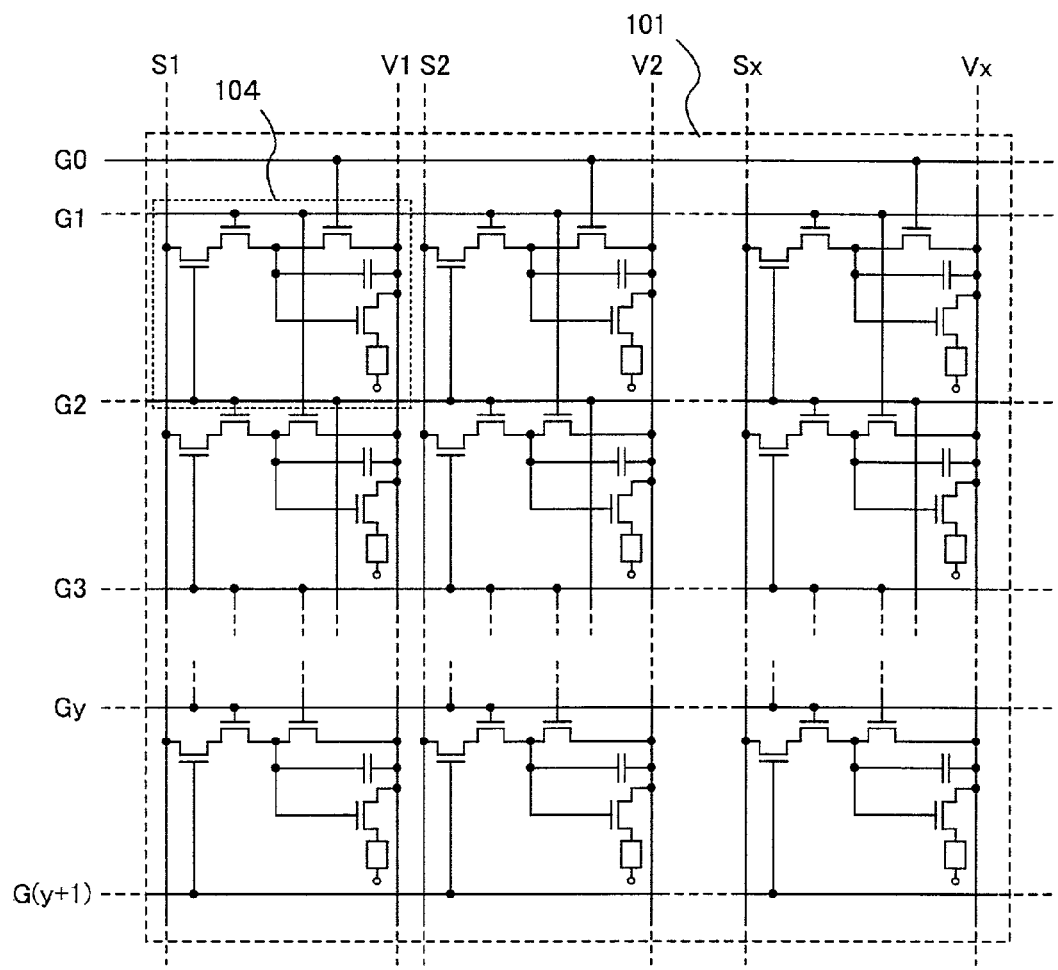
FIG. 2 is a circuit diagram of a pixel portion of the EL display according to the present invention.

FIG. 2 is an enlarged view of the pixel portion 101. Source signal lines S1 to Sx, power supply lines V1 to Vx, and gate signal lines G0, G1 to Gy, and G(y+1) are provided in the pixel portion 101.

A pixel 104 is a region having one of the source signal lines S1 to Sx, one of the power supply lines V1 to Vx, and one of the gate signal lines G1 to Gy. A plurality of pixels 104 are arranged like a matrix in the pixel portion 101.

It is to be noted that, though no pixel is formed between the gate signal lines G0 and G1 in FIG. 2, the present invention is not limited thereto, and dummy pixels may be formed between the gate signal lines G0 and G1.

Figure 3:
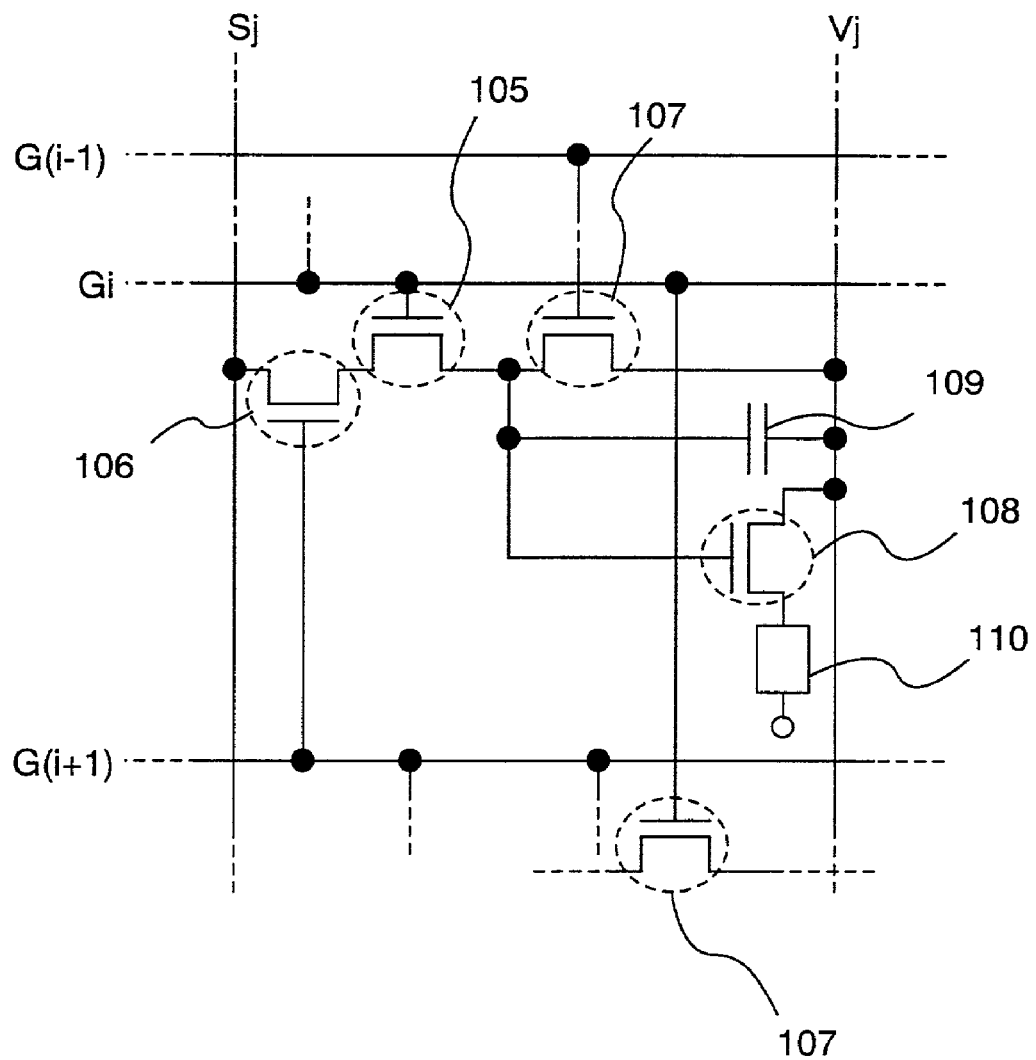
FIG. 3 is a circuit diagram of a pixel of the EL display according to the present invention.

FIG. 3 is a circuit diagram of the pixel 104. Reference numerals 105, 106, 107, 108, 109, and 110 denote a first TFT for switching, a second TFT for switching, a TFT for erasing, a TFT for EL driving, a capacitor, and an EL element, respectively. A pixel (j, i) illustrated in FIG. 3 has a source signal line Sj (j is an arbitrary number from 1 to x), a power supply line Vj, and a gate signal line Gi (i is an arbitrary number from 1 to y).

A gate electrode of the first TFT 105 for switching is connected to the gate signal line Gi. A gate electrode of the second TFT 106 for switching is connected to a gate signal line G(i+1) of a pixel (j, i+1) located next to the pixel (j, i). It is to be noted that, though the present embodiment has the above-described structure, it may be that the gate electrode of the second TFT 106 for switching is connected to the gate signal line G1 and the gate electrode of the first TFT 105 for switching is connected to the gate signal line G(i+1) of the pixel (j, i+1) located next to the pixel (j, i).

A source region or drain region of the first TFT 105 for switching and a source region or drain region of the second TFT 106 for switching are connected in series. The source region or drain region of the second TFT 106 for switching not connected to the source region or drain region of the first TFT 105 for switching is connected to the source signal line Sj. Further, the source region or drain region of the first TFT 105 for switching not connected to the source region or drain region of the second TFT 106 for switching is connected to a gate electrode of the TFT 108 for EL driving.

A gate electrode of the TFT 107 for erasing is connected to a gate signal line G (i−1) of a pixel (j, i−1) located next to the pixel (j, i) illustrated in FIG. 3. One of a source region or a drain region of the TFT 107 for erasing is connected to the power supply line Vj, and the other is connected to the gate electrode of the TFT 108 for EL driving.

The capacitor 109 is provided so as to be connected to the gate electrode of the TFT 108 for EL driving and to the power supply line Vj. The capacitor 109 is provided for the purpose of retaining the gate voltage of the TFT 108 for EL driving when the TFT 107 for switching is in a nonselected state (an OFF state). It is to be noted that, though the capacitor 109 is provided in the structure of the present embodiment, the present invention is not limited thereto, and the capacitor 109 may not be provided.

A source region of the TFT 108 for EL driving is connected to the power supply line Vj, while a drain region of the TFT 108 for EL driving is connected to the EL element 110.

It is to be noted that a power supply line may be commonly used by two pixels adjacent to each other in one line. In other words, it may be structured such that the source regions of the TFTs for EL driving of the two pixels are connected to one common power supply line.

The EL element 110 is formed of an anode, a cathode, and an EL layer provided between the anode and the cathode. In case the anode is connected to the drain region of the TFT 108 for EL driving, the anode is a pixel electrode while the cathode is an opposing electrode. Conversely, in case the cathode is connected to the drain region of the TFT 108 for EL driving, the cathode is a pixel electrode and the anode is an opposing electrode.

The opposing electrode of the EL element 110 is connected to an opposing power source (not shown) provided outside the substrate having the pixel portion 101 formed thereon, and the opposing potential which is constant is always applied to the opposing electrode of the EL element 110. The power supply lines V1 to Vx are connected to a power source (not shown) provided outside the substrate having the pixel portion 101 formed thereon, and the power source potential which is constant is always applied to the power supply lines V1 to Vx. The difference between the opposing potential and the power source potential is always held such that the EL element 110 emits light when the power source potential is applied to the pixel electrode.

With regard to a typical present EL display, in the case where the amount of light emission per area of the pixel portion is 200 cd/m$^2$, necessary current per area of the pixel portion is several mA/cm$^2$. Therefore, as the size of the pixel portion becomes larger, it becomes more difficult to control by a switch the potential applied to the power supply lines by a power source provided in an IC or the like. According to the present invention, since the power source potential and the opposing potential are always held constant and it is not necessary to control using a switch the potential applied from the power source provided in the IC, the present invention is useful in materializing panels of a larger screen size.

As the first TFT 105 for switching, the second TFT 106 for switching, the TFT 107 for erasing, and the TFT 108 for EL driving, both n-channel TFTs and p-channel TFTs can be used. However, it is necessary that the first TFT 105 for switching, the second TFT 106 for switching, and the TFT 107 for erasing are of the same polarity. Further, in case the anode of the EL element 110 is a pixel electrode and its cathode is an opposing electrode, it is preferable that the TFT 108 for EL driving is a p-channel TFT. Conversely, in the case where the anode of the EL element 110 is an opposing electrode and its cathode is a pixel electrode, it is preferable that the TFT 108 for EL driving is an n-channel TFT.

Still further, the first TFT 105 for switching, the second TFT 106 for switching, the TFT 107 for erasing, the TFT 108 for EL driving may have not only a single-gate structure but also a multi-gate structure such as a double-gate structure or a triple-gate structure.

Figure 4:
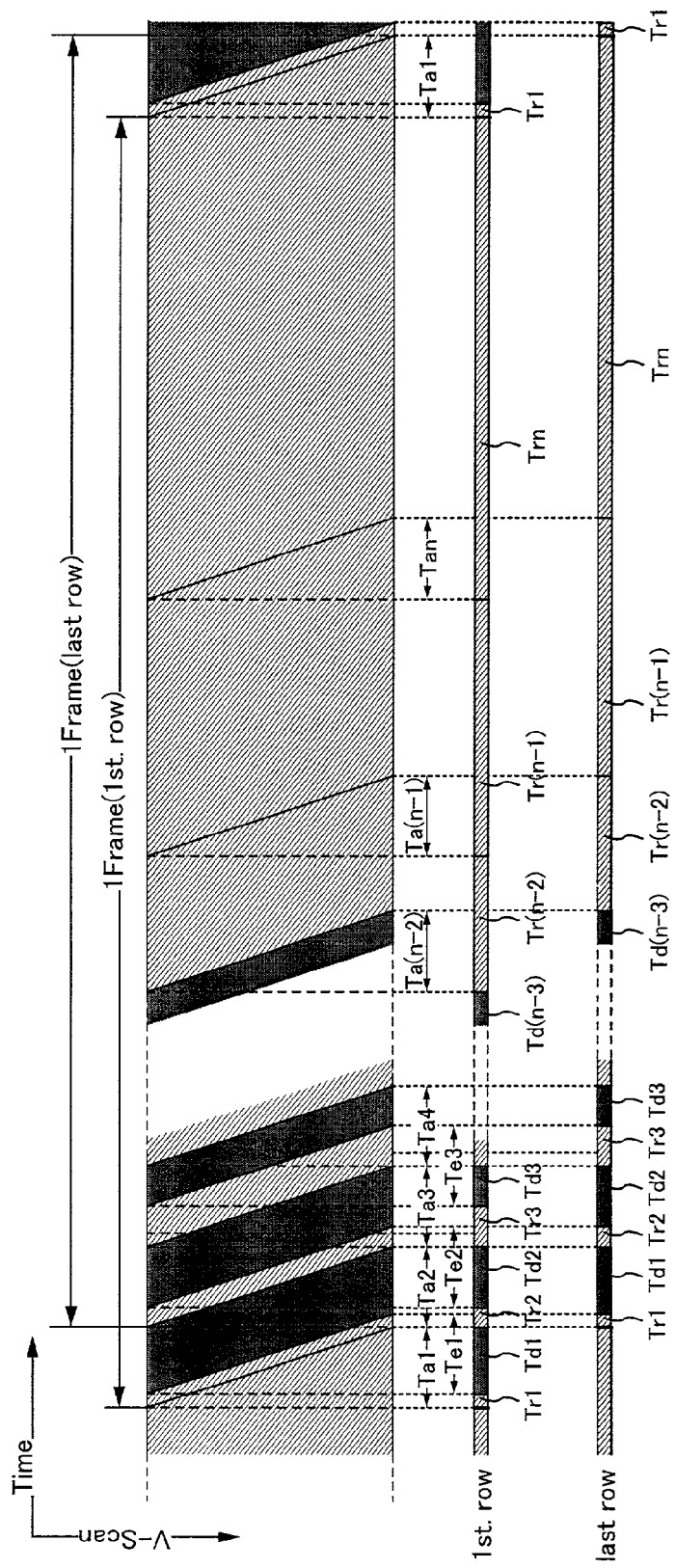
FIG. 4 illustrates a driving method of the EL display according to the present invention.

Next, a method of driving the EL display according to the present invention illustrated in FIGS. 1 to 3 is described with reference to a timing chart illustrated in FIG. 4. In FIG. 4, a horizontal axis denotes time while a vertical axis denotes the position of a selected gate signal line.

First, during a writing period Ta1, the gate signal line G0 is selected according to a selection signal for writing (a first selection signal) inputted from the gate signal line driver circuit 103 to the gate signal line G0. Then, the TFTs 107 for erasing of the pixels in the first line whose gate electrodes are connected to the gate signal line G0 are turned on. When the TFT 107 for erasing is turned on, the gate electrode and the source region of the TFT 108 for EL driving are electrically connected to each other. Therefore, the gate voltage (the potential difference between the gate electrode and the source region) of the TFT 108 for EL driving becomes zero, which makes the TFTs 108 for EL driving of the pixels in the first line in the OFF state.

Then, with the gate signal line G0 being in the selected state according to the selection signal for writing, the gate signal line G1 is selected according to the selection signal for writing inputted to the gate signal line G1. Then, the first TFTs 105 for switching of the pixels in the first line, the gate electrodes of which are connected to the gate signal line G1, and the TFTs 107 for erasing of the pixels in the second line, the gate electrodes of which are also connected to the gate signal line G1 are turned on.

Then, with the gate signal line G1 being in the selected state according to the selection signal for writing, the gate signal line G0 becomes nonselected, and at the same time, the gate signal line G2 is selected. Then, the second TFTs 106 for switching of the pixels in the first line, the gate electrodes of which are connected to the gate signal line G2, the first TFTs 105 for switching of the pixels in the second line, the gate electrodes of which are also connected to the gate signal line G2, and the TFTs 107 for erasing of the pixels in the third line, the gate electrodes of which are also connected to the gate signal line G2 are turned on.

Therefore, by simultaneously selecting the gate signal lines G0 and G1 according to the selection signal for writing, the first TFTs 105 for switching and the second TFTs 106 for switching of the pixels in the first line are simultaneously turned on.

When the first TFTs 105 for switching and the second TFTs 106 for switching are simultaneously in the ON state, a first bit of a digital video signal is inputted from the source signal line driver circuit 102 to the source signal lines S1 to Sx. The first bit of the digital video signal is inputted through the first TFTs 105 for switching and the second TFTs 106 for switching to the gate electrodes of the TFTs 108 for EL driving of the pixels in the first line. That a digital video signal is inputted to a gate electrode of a TFT 108 for EL driving is herein referred to as "a digital video signal is inputted to a pixel".

A digital video signal has information which is either "0" or "1". One of the "0" digital video signal and the "1" digital video signal is a signal having voltage of Hi while the other is a signal having voltage of Lo.

In the present embodiment, in case the digital video signal has the information "0", the TFT 108 for EL driving is in the OFF state, and thus, the power source potential is not applied to the pixel electrode of the EL element 110. As a result, the EL element 110 of the pixel to which the "0" digital video signal is inputted does not emit light.

Conversely, in the case where the digital video signal has the information "1", the TFT 108 for EL driving is in the ON state, and thus, the power source potential is applied to the pixel electrode of the EL element 110. As a result, the EL element 110 of the pixel to which the "0" digital video signal is inputted emits light.

In the present embodiment, in the case where the digital video signal has the information "0", the TFT 108 for EL driving is in the OFF state, and in the case where the digital video signal has the information "1", the TFT 108 for EL driving is in the ON state. However, the present invention is not limited thereto, and it may be that, in case the digital video signal has the information "0", the TFT 108 for EL driving is in the ON state, and in the case where the digital video signal has the information "1", the TFT 108 for EL driving is in the OFF state.

In this way, simultaneously with the input of the digital video signal to the pixels in the first line, the EL elements 110 perform light emission or do not perform light emission such that the pixels in the first line carry out display. A period during which a pixel carries out display is referred to as a display period Tr. In particular, a display period started with the input of the first bit of the digital video signal to the pixels is referred to as Tr1. The timings when the display periods of the respective lines are started have time differences with one another.

Then, with the gate signal line G2 being in the selected state according to the selection signal for writing, the gate signal line G1 becomes nonselected, and at the same time, the gate signal line G3 is selected. Then, the first TFTs 105 for switching of the pixels in the second line the gate electrodes of which are connected to the gate signal line G3, the second TFTs 106 for switching of the pixels in the third line the gate electrodes of which are also connected to the gate signal line G3, and the TFTs 107 for erasing of the pixels in the fourth line the gate electrodes of which are also connected to the gate signal line G3 are turned on.

Therefore, the first TFTs 105 for switching and the second TFTs 106 for switching of the pixels in the second line are simultaneously turned on. When the first TFTs 105 for switching and the second TFTs 106 for switching are simultaneously in the ON state, a digital video signal of a first bit is inputted from the source signal line driver circuit 102 to the source signal lines S1 to Sx. The first bit of the digital video signal is inputted through the first TFTs 105 for switching and the second TFTs 106 for switching to the gate electrodes of the TFTs 108 for EL driving of the pixels in the second line.

Then, all the gate signal lines are sequentially selected according to the selection signal for writing to input the first bit of the digital video signal to all the pixels. The period until the first bit of the digital video signal is inputted to all the pixels is the writing period Ta1.

In this way, during a writing period, two gate signals are simultaneously selected according to the selection signal for writing.

On the other hand, before the first bit of the digital video signal is inputted to all the pixels, that is, before the writing period Ta1 ends, in parallel with the input of the first bit of the digital video signal to the pixels, the gate signal line G0 is selected according to a selection signal for erasing (a second selection signal) inputted from the gate signal line driver circuit 103 to the gate signal line G0.

When the gate signal line G0 is selected according to the selection signal for erasing, the TFTs 107 for erasing of the pixels in the first line, the gate electrodes of which are connected to the gate signal line G0, are turned ON. Therefore, the power source potential of the power supply lines V1 to Vx is applied through the TFTs 107 for erasing to the gate electrodes of the TFTs 108 for EL driving. By applying the power source potential to the gate electrodes of the TFTs 108 for EL driving, the first bit of the digital video signal retained by the gate electrodes of the TFTs 108 for EL driving since the gate signal lines G1 and G2 are selected according to the selection signal for writing is erased. In this way, the power source potential is not applied to the pixel electrodes of the EL elements 110, all the EL elements 110 of the pixels in the first line no longer emit light, and the pixels in the first line do not carry out display.

A period during which a pixel does not carry out display is referred to as a non-display period Td. With regard to the pixels in the first line, simultaneously with the selection of the gate signal line G0 according to the selection signal for erasing, the display period Tr1 ends and a non-display period Td1 starts. Similarly to the case of the display periods, the timings when the non-display periods of the respective lines are started have time differences with one another.

Then, the gate signal line G0 becomes nonselected by the selection signal for erasing, and the gate signal line G1 is selected. When the gate signal line G1 is selected, the TFTs 107 for erasing in the second line, the gate electrodes of which are connected to the gate signal line G1, are turned on. In this way, the non-display period Td is started with regard to the pixels in the second line, and the pixels in the second line no longer carry out display.

Then, all the gate signal lines are sequentially selected according to the selection signal for erasing. The period until all the gate signal lines are selected according to the selection signal for erasing to erase the first bit of the digital video signal from all the pixels is an erasing period Te1.

In this way, during an erasing period, only one gate signal line is always selected according to the selection signal for erasing, and two or more gate signal lines are by no means simultaneously selected according to the selection signal for erasing.

On the other hand, before the first bit of the digital video signal retained by all the pixels are erased, that is, before the erasing period Te1 ends, in parallel with the erasing of the first bit of the digital video signal retained by the pixels, the gate signal line G0 is again selected according to the selection signal for writing. Then, a second bit of the digital video signal is inputted to the pixels in the first line. As a result, the pixels in the first line again carry out display, and thus, with regard to the pixels in the first line, the non-display period Td1 ends and a display period Tr2 starts.

Similarly, all the gate signal lines are sequentially selected according to the selection signal for writing to input the second bit of the digital video signal to all the pixels. The period until the second bit of the digital video signal is inputted to all the pixels is referred to as a writing period Ta2.

On the other hand, before the second bit of the digital video signal is inputted to all the pixels, that is, before the writing period Ta2 ends, in parallel with the input of the second bit of the digital video signal to the pixels, the gate signal line G0 is selected according to the selection signal for erasing. In this way, all the EL elements 110 of the pixels in the first line no longer emit light, and the pixels in the first line do not carry out display. Therefore, with regard to the pixels in the first line, the display period Tr2 ends and a non-display period Td2 starts.

Then, all the gate signal lines are sequentially selected according to the selection signal for erasing to erase the second bit of the digital video signal from all the pixels. The period until the second bit of the digital video signal are erased from all the pixels is an erasing period Te2.

The above operation is repeated until an mth bit of the digital video signal is inputted to the pixels. During that period, the display period Tr and the non-display period Td repeatedly appear. The display period Tr1 is a period from the time when the writing period Ta1 is started to the time when the erasing period Te1 is started. The non-display period Td1 is a period from the time when the erasing period Te1 is started to the time when the next writing period (Ta2 in this case) is started. Similarly to the display period Tr1 and the non-display period Td1, display periods Tr2, Tr3, . . . , Tr(m−1) and non-display periods Td2, Td3, . . . , Td(m−1) are defined by the writing periods Ta1, Ta2, . . . , Tam and the erasing periods Te1, Te2, . . . , Te(m−1), respectively.

For the sake of simplicity of description, a case where m=n−2 is illustrated in FIG. 4 by way of example. However, it goes without saying that the present invention is not limited thereto. In the present invention, m can be arbitrarily selected among numbers from 1 to n.

Then, a writing period Tam[n−2] starts (hereinafter the case where m=n−2 is shown in brackets). An m[n−2]th bit of the digital video signal is inputted to the pixels in the first line, a display period Trm[n−2] starts with regard to the pixels in the first line, and the pixels in the first line carry out display. The m[n−2]th bit of the digital video signal is retained in the pixels until the next writing period is started.

Then, a writing period Ta(m+1)[n−1] starts, and the m[n−2]th bit of the digital video signal retained in the pixels is erased. Instead, an (m+1)[n−1]th bit of the digital video signal is inputted to the pixels in the first line, a display period Tr(m+1)[n−1] starts with regard to the pixels in the first line, and the pixels in the first line carry out display. The (m+1)[n−1]th bit of the digital video signal is retained in the pixels until the next bit of the digital video signal is inputted.

The above operation is repeated until an nth bit of the digital video signal is inputted to the pixels. Display periods Trm[n−2], . . . , Trn are periods from the time when writing periods Tam[n−2], . . . , Tan are started to the time when the next writing periods are started, respectively.

When all the display periods Tr1-Trn end, one image can be displayed. In the present invention, a period during which one image is displayed is referred to as one frame period (F).

After one frame period ends, the gate signal line G0 is again selected according to the selection signal for writing. When the gate signal lines G1 and G2 are simultaneously selected, the first bit of the digital video signal is inputted to the pixels, and, with regard to the pixels in the first line, the display period Tr1 starts again. Then, the above operation is repeated again.

FIG. 5 shows a timing chart of the selection signal for writing to be inputted to the gate signal lines and of the clock signal for the gates (G-CLK) to be inputted to the gate signal line driver circuit 103 in the EL display structured as illustrated in FIGS. 1 to 3.

Figure 5A:
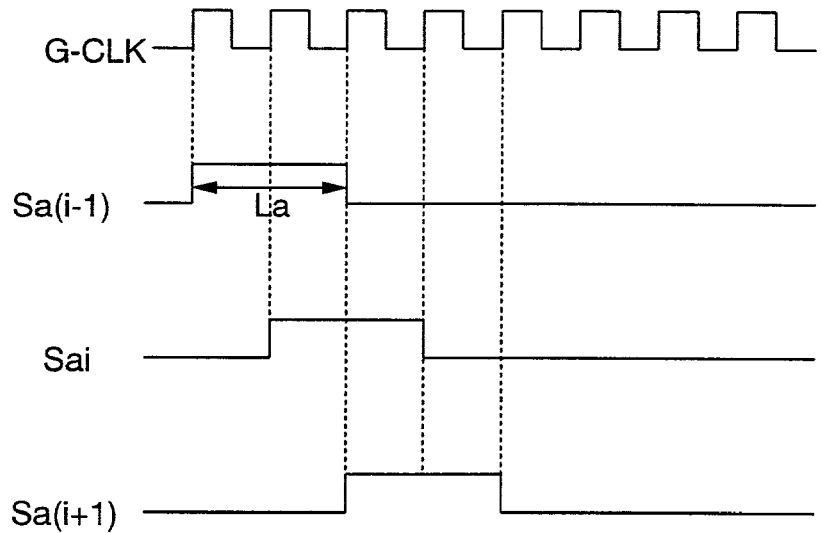
FIGS. 5A and 5B are timing charts of a selection signal in a driving method according to the present invention.
Figure 5B:
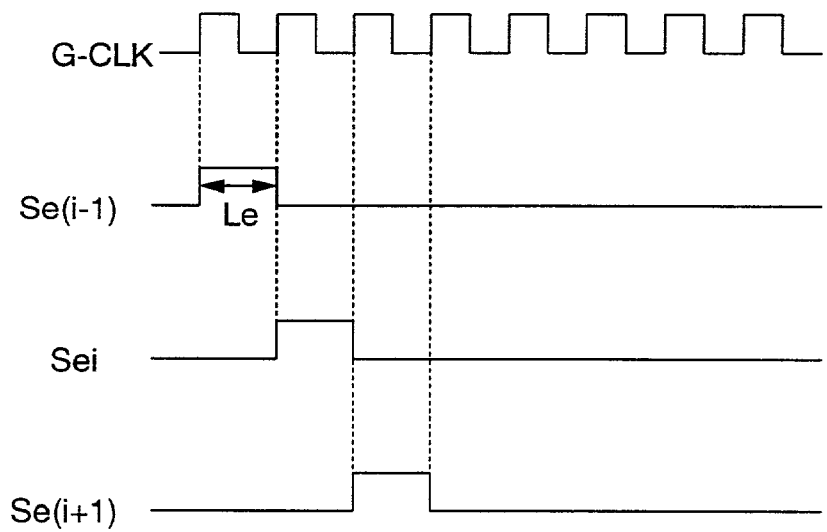

FIG. 5A is a timing chart during a writing period. Sa(i−1) to Sa(i+1) indicate selection signals for writing to be inputted to gate signal lines G(i−1) to G(i+1), respectively. FIG. 5B is a timing chart during an erasing period. Se(i−1) to Se(i+1) indicate selection signals for writing to be inputted to the gate signal lines G(i−1) to G(i+1), respectively.

It is to be noted that the timing charts illustrated in FIG. 5 are with regard to a case where the first TFT 105 for switching, the second TFT 106 for switching, and the TFT 107 for erasing are all n-channel TFTs. In the case where the first TFT 105 for switching, the second TFT 106 for switching, and the TFT 107 for erasing are all p-channel TFTs, the potential of the selection signals for writing and of the selection signals for erasing are inversion of the phase of the potential of the respective signals in the timing charts illustrated in FIG. 5, with the potential of the ground as a reference.

In a writing period, a period during which one gate signal line is selected according to a selection signal for writing is referred to as a writing selection period (La). In the case illustrated in FIG. 5A, the potential of a selection signal for writing during a writing selection period is Hi. In an erasing period, a period during which one gate signal line is selected according to a selection signal for erasing is referred to as an erasing selection period (Le). In the case illustrated in FIG. 5B, the potential of a selection signal for erasing during an erasing selection period is Hi.

The writing selection period (La) is twice as long as the erasing selection period (Le). Half of the writing selection periods (La) of adjacent gate signal lines overlap each other. Further, erasing selection periods (Le) of adjacent gate signal lines do not overlap each other, and when an erasing selection period (Le) with regard to one gate signal line ends, an erasing selection period (Le) with regard to the next gate signal line is started.

It is to be noted that the length of the writing selection period (La) and the length of the erasing selection period (Le) are controlled by the start pulse signal for the gates (G-SP).

It is to be noted that, in the timing charts illustrated in FIG. 5, the length of the writing selection period (La) corresponds to two cycles of the clock signal for the gates (G-CLK), and the length of the erasing selection period (Le) corresponds to one cycle of the clock signal for the gates (G-CLK). However, the present invention is not limited thereto. What is necessary is that the writing selection period (La) is twice as long as the erasing selection period (Le).

In the present invention, it is preferable that the EL display has sixty or more frame periods per second. If the number of images displayed per second is less than sixty, flicker of images may become visually conspicuous.

In addition, in the present invention, it is necessary that the sum of the lengths of all the writing periods is shorter than one frame period. Further, it is necessary that the lengths of the display periods satisfy Tr1:Tr2:

Tr3: ... :Tr(n-1):Trn=$2^0$:$2^1$:$2^2$: ... :$2^{(n-2)}$:$2^{(n-1)}$. By combining these display periods, desired tones among the $2^n$ tones can be displayed.

The sum of the lengths of the display periods during which the EL elements emit light in one frame period determines the tone displayed by the pixel in that frame period. For example, when n=8, if the brightness when the pixel emits light during all the display periods is expressed as 100%, brightness of 1% can be materialized by making the pixel emit light in Tr1 and Tr2, while brightness of 60% can be materialized by making the pixel emit light in Tr3, Tr5, and Tr8.

It is important that the writing period Tam during which the mth bit of the digital video signal is written in a pixel is shorter than the display period Trm. Therefore, it is necessary that the value of the bit number m is selected from 1 to n such that the writing period Tam is shorter than the display period Trm.

The display periods Tr1 to Trn may appear in any order. For example, in one frame period, it is possible that the display periods appear in the order of Tr1, Tr3, Tr5, Tr2, .... However, it is more preferable that the order is such that the display periods Tr1 to Trn do not overlap each other. Further, it is more preferable that the order is such that the erasing periods Te1 to Ten do not overlap each other.

According to the present invention, by the above structure, even if there is a variation to some extent in the $I_{DS}$-$V_{GS}$ characteristics between TFTs, variation in the amount of current outputted when equal gate voltage is applied to the TFTs for EL driving can be suppressed. Therefore, a situation can be avoided that there is considerable difference in the amount of light emitted from the EL elements with regard to adjacent pixels due to the variation in the $I_{DS}$-$V_{GS}$ characteristics even if a signal of equal voltage is inputted thereto.

Further, according to the present invention, as TFTs for EL driving, two TFTs for EL driving may be provided in parallel. This makes it possible to efficiently radiate heat generated by current through the active layer of the TFTs for EL driving, which can suppress deterioration of the TFTs for EL driving. Further, variation in the drain current due to variation in the characteristics of the TFTs for EL driving such as the threshold and the mobility can be suppressed.

Further, according to the present invention, a no-light-emission period during which no display is carried out can be provided. In the case of a conventional analog driving method, if an image where all the pixels display white is displayed on an EL display, the EL elements always emit light, which is a cause of accelerating the deterioration of the EL layer. According to the present invention, since a no-light-emission period can be provided, the deterioration of the EL layer can be suppressed to some extent.

It is to be noted that, according to the present invention, a display period and a writing period overlap each other partially. In other words, a pixel can carry out display even during a writing period. Therefore, the ratio of the sum of the lengths of all the display periods in one frame period (duty cycle) is not determined only by the lengths of the writing periods.

It is to be noted that, though, in the present embodiment, capacitors are structured to be provided for the purpose of retaining voltage applied to the gate electrodes of the TFTs for EL driving, the capacitors may be omitted. When a TFT for EL driving has an LDD region provided so as to overlap a gate electrode through a gate insulating film, a parasitic capacitance which is generally referred to as a gate capacitance is formed in the overlapped region. This gate capacitance may be positively used as a capacitor for retaining voltage applied to the gate electrode of the TFT for EL driving.

Since the value of the gate capacitance varies depending on the area where the gate electrode and the LDD region overlap each other, the value is determined by the length of the LDD region included in the overlapped region.

It is to be noted that application of the structure according to the present invention described in the above is not limited to an EL display, and the structure may also be applied to other apparatuses using electrooptical elements. Further, when liquid crystal which can respond at high speed having the response time of several tens of μsec or shorter is developed, the structure may also be applied to a liquid crystal display.

Embodiments of the present invention are described in the following.

Embodiment 1

Figure 6:
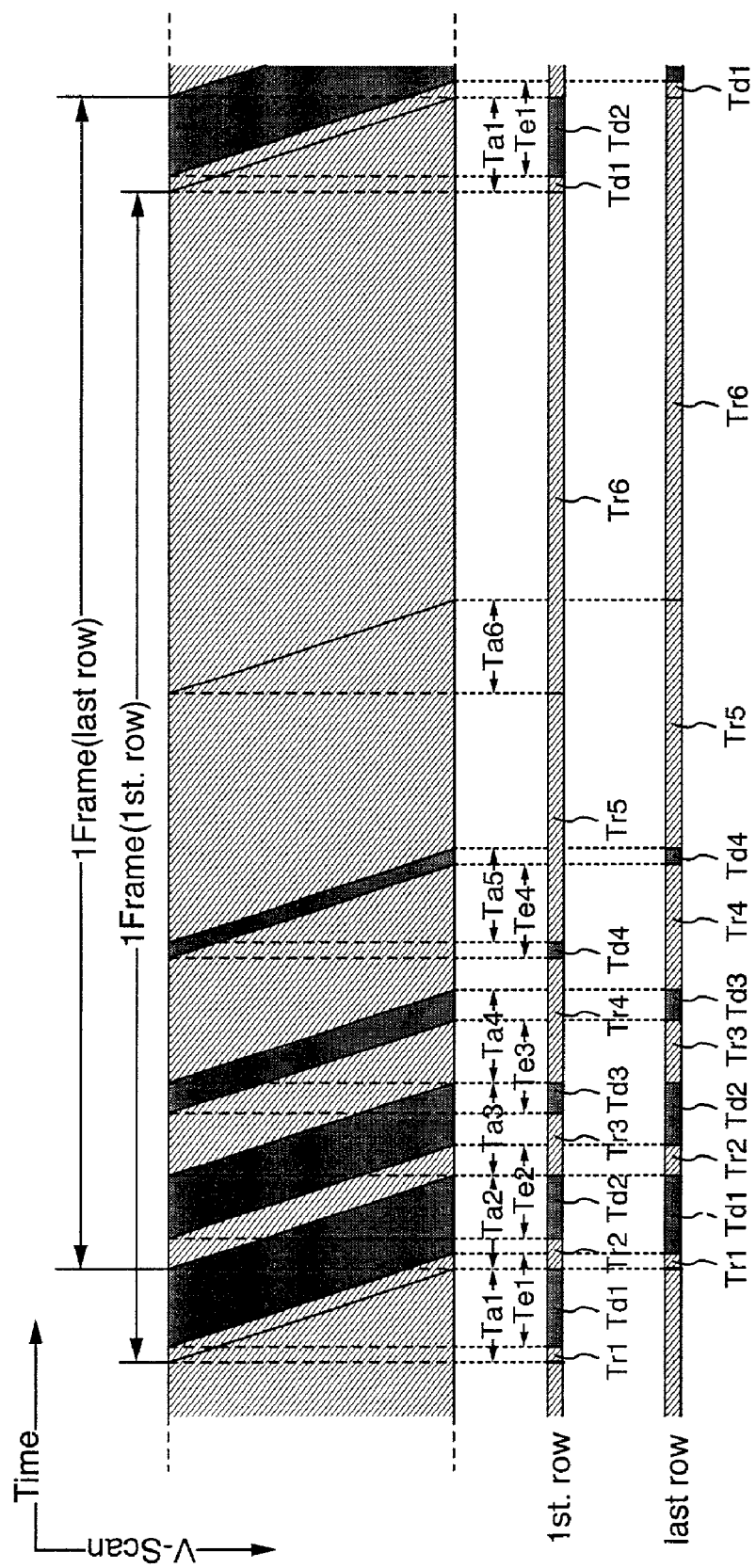
FIG. 6 illustrates a driving method of an EL display according to the present invention.

In the present embodiment, a case where $2^6$ tones are displayed according to a 6-bit digital video signal in an EL display according to the present invention is described with reference to FIG. 6. It is to be noted that the EL display of the present embodiment has the structure illustrated in FIGS. 1 to 3.

First, during a writing period Ta1, the gate signal line G0 is selected according to a selection signal for writing inputted from the gate signal line driver circuit 103 to the gate signal line G0. Then, the TFTs 107 for erasing of the pixels in the first line whose the gate electrodes are connected to the gate signal line G0 are turned on. When the TFT 107 for erasing is turned on, the gate electrode and the source region of the TFT 108 for EL driving are electrically connected to each other. Therefore, the gate voltage (the potential difference between the gate electrode and the source region) of the TFT 108 for EL driving becomes zero, which makes the TFTs 108 for EL driving of the pixels in the first line in the OFF state.

Then, with the gate signal line G0 being in the selected state according to the selection signal for writing, the gate signal line G1 is selected according to the selection signal for writing inputted to the gate signal line G1. Then, the first TFTs 105 for switching of the pixels in the first line whose gate electrodes are connected to the gate signal line G1 and the TFTs 107 for erasing of the pixels in the second line whose gate electrodes are also connected to the gate signal line G1 are turned on.

Then, with the gate signal line G1 being in the selected state according to the selection signal for writing, the gate signal line G0 becomes nonselected, and at the same time, the gate signal line G2 is selected. Then, the second TFTs 106 for switching of the pixels in the first line whose gate electrodes are connected to the gate signal line G2, the first TFTs 105 for switching of the pixels in the second line whose gate electrodes are also connected to the gate signal line G2, and the TFTs 107 for erasing of the pixels in the third line the gate electrodes of which are also connected to the gate signal line G2 are turned on.

Therefore, by simultaneously selecting the gate signal lines G0 and G1 according to the selection signal for writing, the first TFTs 105 for switching and the second TFTs 106 for switching of the pixels in the first line are simultaneously turned on.

When the first TFTs 105 for switching and the second TFTs 106 for switching are simultaneously in the ON state, a first bit of a digital video signal is inputted from the source signal line driver circuit 102 to the source signal lines S1 to Sx. The first bit of the digital video signal is inputted through the first TFTs 105 for switching and the second TFTs 106 for switching to the gate electrodes of the TFTs 108 for EL driving of the pixels in the first line. That a digital video signal is inputted to a gate electrode of a TFT 108 for EL driving is herein referred to as "a digital video signal is inputted to a pixel".

A digital video signal has information which is either "0" or "1". One of the "0" digital video signal and the "1" digital video signal is a signal having voltage of Hi while the other is a signal having voltage of Lo.

In the present example, in case the digital video signal has the information "0", the TFT 108 for EL driving is in the OFF state, and thus, the power source potential is not applied to the pixel electrode of the EL element 110. As a result, the EL element 110 of the pixel to which the "0" digital video signal is inputted does not emit light.

Conversely, in the case where the digital video signal has the information "1", the TFT 108 for EL driving is in the ON state, and thus, the power source potential is applied to the pixel electrode of the EL element 110. As a result, the EL element 110 of the pixel to which the "1" digital video signal is inputted emits light.

In the present example, in case the digital video signal has the information "0", the TFT 108 for EL driving is in the OFF state, and, in case the digital video signal has the information "1", the TFT 108 for EL driving is in the ON state. However, the present invention is not restricted to this example. In the case where the digital video signal has the information "0", the TFT 108 for EL driving can be in the ON state, and, in the case where the digital video signal has the information "1", the TFT 108 for EL driving can be in the OFF state.

In this way, simultaneously with the input of the digital video signal to the pixels in the first line, the EL elements 110 performs light emission or do not perform light emission such that a display period Tr1 is started. The timings when the display periods of the respective lines are started have time differences with one another.

Then, with the gate signal line G2 being in the selected state according to the selection signal for writing, the gate signal line G1 becomes nonselected, and at the same time, the gate signal line G3 is selected. Then, the first TFTs 105 for switching of the pixels in the second line whose gate electrodes are connected to the gate signal line G3, the second TFTs 106 for switching of the pixels in the third line whose gate electrodes are also connected to the gate signal line G3, and the TFTs 107 for erasing of the pixels in the fourth line whose gate electrodes are also connected to the gate signal line G3 are turned on.

Therefore, the first TFTs 105 for switching and the second TFTs 106 for switching of the pixels in the second line are simultaneously turned on. When the first TFTs 105 for switching and the second TFTs 106 for switching are simultaneously in the ON state, a digital video signal of a fist bit is inputted from the source signal line driver circuit 102 to the source signal lines S1 to Sx. The first bit of the digital video signal is inputted through the first TFTs 105 for switching and the second TFTs 106 for switching to the gate electrodes of the TFTs 108 for EL driving of the pixels in the second line.

Then, all the gate signal lines are sequentially selected according to the selection signal for writing to input the first bit of the digital video signal to all the pixels. The period until the first bit of the digital video signal is inputted to all the pixels is the writing period Ta1.

In this way, during a writing period, two gate signals are simultaneously selected according to the selection signal for writing.

On the other hand, before the first bit of the digital video signal is inputted to all the pixels, that is, before the writing period Ta1 ends, in parallel with the input of the first bit of the digital video signal to the pixels, the gate signal line G0 is selected according to a selection signal for erasing inputted from the gate signal line driver circuit 103 to the gate signal line G0.

When the gate signal line G0 is selected according to the selection signal for erasing, the TFTs 107 for erasing of the pixels in the first line whose gate electrodes are connected to the gate signal line G0 are turned ON. Therefore, the power source potential of the power supply lines V1 to Vx is applied through the TFTs 107 for erasing to the gate electrodes of the TFTs 108 for EL driving. By applying the power source potential to the gate electrodes of the TFTs 108 for EL driving, the first bit of the digital video signal retained by the gate electrodes of the TFTs 108 for EL driving since the gate signal lines G1 and G2 are selected according to the selection signal for writing is erased. In this way, the power source potential is not applied to the pixel electrodes of the EL elements 110, all the EL elements 110 of the pixels in the first line no longer emit light, and the pixels in the first line do not carry out display.

A period during which a pixel does not carry out display is referred to as a non-display period Td. With regard to the pixels in the first line, simultaneously with the selection of the gate signal line G0 according to the selection signal for erasing, the display period Tr1 ends and a non-display period Td1 starts. As in the case of the display periods, the timings when the non-display periods of the respective lines are started have time differences with one another.

Then, the gate signal line G0 becomes nonselected by the selection signal for erasing, and the gate signal line G1 is selected. When the gate signal line G1 is selected, the TFTs 107 for erasing in the second line whose gate electrodes are connected to the gate signal line G1 are turned on. In this way, the non-display period Td is started with regard to the pixels in the second line, and the pixels in the second line no longer carry out display.

Then, all the gate signal lines are sequentially selected according to the selection signal for erasing. The period until all the gate signal lines are selected according to the selection signal for erasing to erase the first bit of the digital video signal from all the pixels is an erasing period Te1.

In this way, during an erasing period, always only one gate signal line is selected according to the selection signal for erasing, and two or more gate signal lines are by no means simultaneously selected according to the selection signal for erasing.

On the other hand, before the first bit of the digital video signal retained by all the pixels are erased, that is, before the erasing period Te1 ends, in parallel with the erasing of the first bit of the digital video signal retained by the pixels, the gate signal line G0 is again selected according to the selection signal for writing. Then, a second bit of the digital video signal is inputted to the pixels in the first line. As a result, the pixels in the first line again carry out display, and thus, with regard to the pixels in the first line, the non-display period Td1 ends and a display period Tr2 starts.

Similarly, all the gate signal lines are sequentially selected according to the selection signal for writing to input the second bit of the digital video signal to all the pixels. The period until the second bit of the digital video signal is inputted to all the pixels is referred to as a writing period Ta2.

On the other hand, before the second bit of the digital video signal is inputted to all the pixels, that is, before the writing period Ta2 ends, in parallel with the input of the second bit of the digital video signal to the pixels, the gate signal line G0 is selected according to the selection signal for erasing. In this way, all the EL elements of the pixels in the first line no longer emit light, and the pixels in the first line do not carry out display. Therefore, with regard to the pixels in the first line, the display period Tr2 ends and a non-display period Td2 starts.

Then, all the gate signal lines are serially selected according to the selection signal for erasing to erase the second bit of the digital video signal from all the pixels. The period until the second bit of the digital video signal are erased from all the pixels is an erasing period Te2.

The above operation is repeated until a fifth bit of the digital video signal is inputted to the pixels. During that period, the display period Tr and the non-display period Td repeatedly appear. The display period Tr1 is a period from the time when the writing period Ta1 is started to the time when the erasing period Te1 is started. The non-display period Td1 is a period from the time when the erasing period Te1 is started to the time when the next writing period (Ta2 in this embodiment) is started. Like the display period Tr1 and the non-display period Td1, display periods Tr2, Tr3, and Tr4 and non-display periods Td2, Td3, and Td4 are defined by the writing periods Ta1, Ta2, . . . , Ta5 and the erasing periods Te1, Te2, . . . , Te4, respectively.

Then, a writing period Ta5 starts. A fifth bit of the digital video signal is inputted to the pixels in the first line, a display period Tr5 starts with regard to the pixels in the first line, and the pixels in the first line carry out display. The fifth bit of the digital video signal is retained in the pixels until the next writing period is started.

Then, a writing period Ta6 starts, and the fifth bit of the digital video signal retained in the pixels is erased. Instead, a sixth bit of the digital video signal is inputted to the pixels in the first line, a display period Tr6 starts with regard to the pixels in the first line, and the pixels in the first line carry out display. The sixth bit of the digital video signal is retained in the pixels until the next bit of the digital video signal is inputted.

When the first writing period Ta1 of the next frame period is started, the period Tr6 ends, and at the same time, the prior frame period ends. When all the display periods Tr1 to Tr6 end, one image can be displayed. Then, the above operation is repeated.

A display period Tr5 is a period from the time when the writing period Ta5 is started to the time when the writing period Ta6 is started. A display period Tr6 is a period from the time when the writing period Ta6 is started to the time when the writing period Ta1 of the next frame period is started.

The length of the display period Tr is set to satisfy Tr1:Tr2: . . . : Tr5:Tr6=$2^0:2^1 \ldots :2^4:2^5$. By combining these display periods, desired tones among the $2^6$ tones can be displayed.

The sum of the lengths of the display periods during which the EL elements emit light in one frame period determines the tone displayed by the pixel in that frame period. If the brightness when the pixel emits light during all the display periods is 100%, brightness of 5% can be given by making the pixel emit light in Tr1 and Tr2, while brightness of 32% can be given by making the pixel emit light in Tr3 and Tr5.

In the present example, it is important that the writing period Ta5 during which the fifth bit of the digital video signal is written in a pixel is shorter than the display period Tr5.

Further, the order of appearance of the display periods Tr1 to Tr6 may be changed by changing the order of appearance of the writing periods and the order of appearance of the erasing periods. For example, in one frame period, it is possible that the display periods appear in the order of Tr1, Tr3, Tr5, Tr2, . . . . However, it is more preferable that the order is such that the erasing periods Te1 to Te6 do not overlap each other. Further, it is more preferable that the order is such that the display periods Tr1 to Tr6 do not overlap each other.

According to the present invention, by the above structure, even if there is variation to some extent in the $I_{DS}-V_{GS}$ characteristics between TFTs, variation in the amount of current outputted when equal gate voltage is applied can be suppressed. Therefore, a situation can be avoided that there is considerable difference in the amount of light emitted from the EL elements with regard to adjacent pixels due to the variation in the $I_{DS}-V_{GS}$ characteristics even if a signal of equal voltage is inputted thereto.

Further, according to the present invention, a no-light-emission period during which no display is carried out can be provided. In the case of a conventional analog driving method, if an image where all the pixels display white is displayed on an EL display, the EL elements always emit light, which is a cause of accelerating the deterioration of the EL layer. According to the present invention, since a no-light-emission period can be provided, the deterioration of the EL layer can be suppressed to some extent.

Embodiment 2

In the present example, the order of appearance of the display periods Tr1 to Tr6 is described in a driving method according to the present invention which is adapted for a 6-bit digital video signal.

Figure 7:
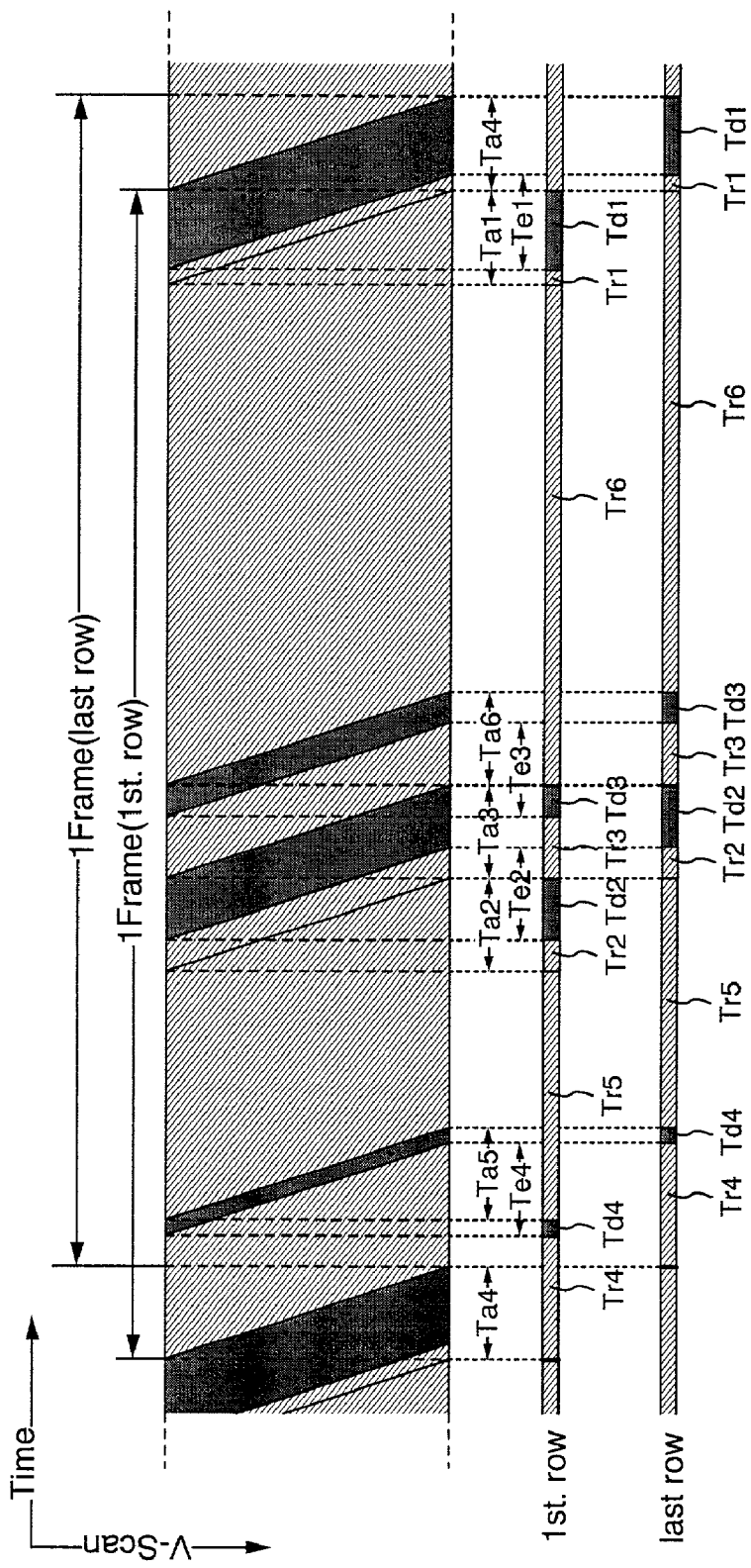
FIG. 7 illustrates a driving method of an EL display according to the present invention.

FIG. 7 illustrates a timing chart of a driving method of the present example. The specific driving method is described in Embodiment 1, and thus, the description thereof is omitted here. In the driving method of the present embodiment, a longest non-display period (Td1 in the present embodiment) in one frame period is provided last in the one frame period. By this structure, human eyes visually perceive that there is a pause between the non-display period Td1 and the first display period of the next frame period (Tr4 in the present embodiment). This makes it possible to make less recognizable to human eyes display unevenness caused due to adjacent display periods of light emission of adjacent frame periods when halftone display is carried out.

It is to be noted that, though, in the present embodiment, the case of the 6-bit digital video signal is described, the present invention is not limited thereto. The present invention can be implemented without being limited by the number of bits of the digital video signal.

Embodiment 3

Figure 8:
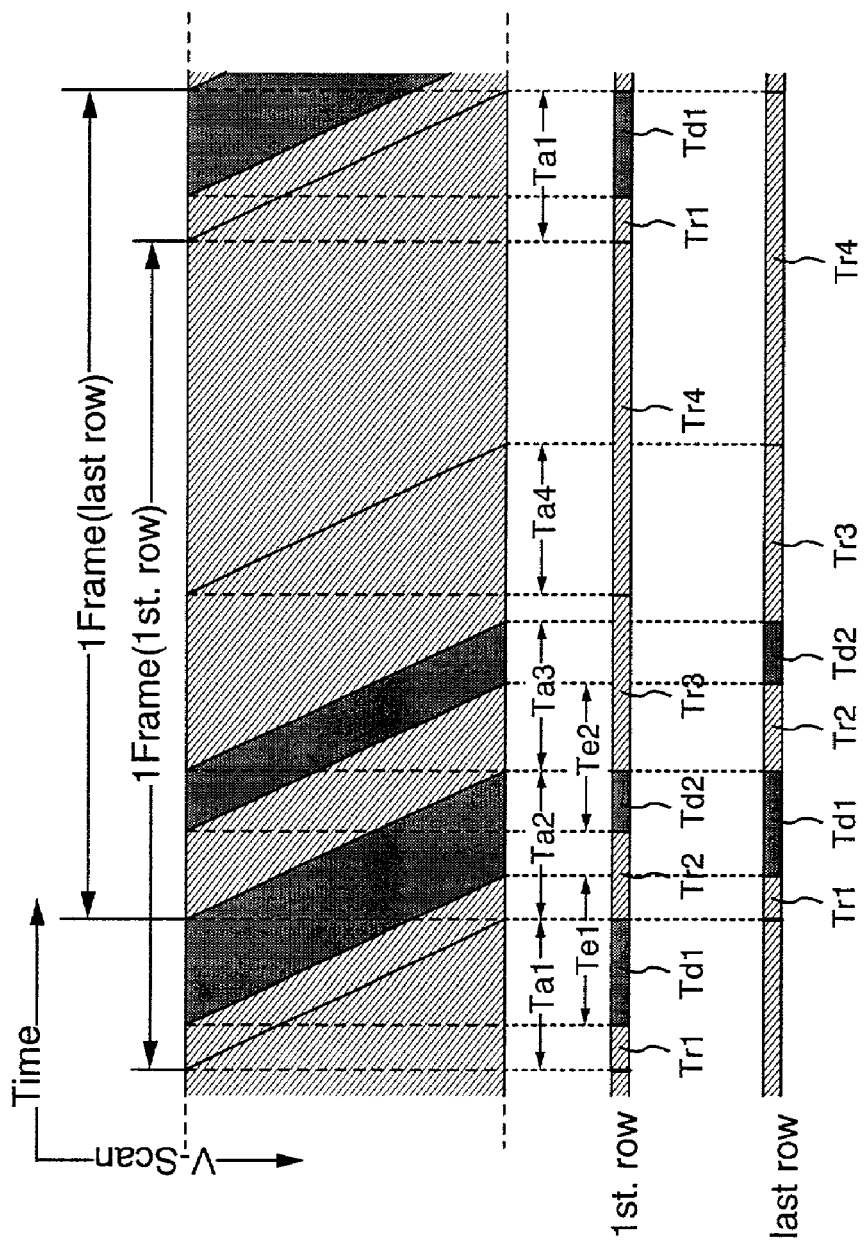
FIG. 8 illustrates a driving method of an EL display according to the present invention.

In the present example, a case where $2^4$ tones are displayed according to a 4-bit digital video signal in an EL display according to the present invention is described with reference to FIG. 8. It is to be noted that the EL display of the present embodiment has the structure illustrated in FIGS. 1 to 3.

First, during a writing period Ta1, the gate signal line G0 is selected according to a selection signal for writing inputted from the gate signal line driver circuit 103 to the gate signal line G0. Then, the TFTs 107 for erasing of the pixels in the first line whose gate electrodes are connected to the gate signal line G0 are turned on. When the TFT 107 for erasing is turned on, the gate electrode and the source region of the TFT 108 for EL driving are electrically connected to each other. Therefore, the gate voltage (the potential difference between the gate electrode and the source region) of the TFT 108 for EL driving becomes zero, which makes the TFTs 108 for EL driving of the pixels in the first line in the OFF state.

Then, with the gate signal line G0 being in the selected state according to the selection signal for writing, the gate signal line G1 is selected according to the selection signal for writing inputted to the gate signal line G1. Then, the first TFTs 105 for switching of the pixels in the first line whose gate electrodes are connected to the gate signal line G1 and the TFTs 107 for erasing of the pixels in the second line whose gate electrodes are also connected to the gate signal line G1 are turned on.

Then, with the gate signal line G1 being in the selected state according to the selection signal for writing, the gate signal line G0 becomes nonselected, and at the same time, the gate signal line G2 is selected. Then, the second TFTs 106 for switching of the pixels in the first line whose gate electrodes are connected to the gate signal line G2, the first TFTs 105 for switching of the pixels in the second line whose gate electrodes are also connected to the gate signal line G2, and the TFTs 107 for erasing of the pixels in the third line whose gate electrodes are also connected to the gate signal line G2 are turned on.

Therefore, by simultaneously selecting the gate signal lines G0 and G1 according to the selection signal for writing, the first TFTs 105 for switching and the second TFTs 106 for switching of the pixels in the first line are simultaneously turned on.

When the first TFTs 105 for switching and the second TFTs 106 for switching are simultaneously in the ON state, a first bit of a digital video signal is inputted from the source signal line driver circuit 102 to the source signal lines S1 to Sx. The first bit of the digital video signal is inputted through the first TFTs 105 for switching and the second TFTs 106 for switching to the gate electrodes of the TFTs 108 for EL driving of the pixels in the first line. That a digital video signal is inputted to a gate electrode of a TFT 108 for EL driving is herein referred to as "a digital video signal is inputted to a pixel".

A digital video signal has information which is either "0" or "1". One of the "0" digital video signal and the "1" digital video signal is a signal having voltage of Hi while the other is a signal having voltage of Lo.

In the present embodiment, in the case where the digital video signal has the information "0", the TFT 108 for EL driving is in the OFF state, and thus, the power source potential is not applied to the pixel electrode of the EL element 110. As a result, the EL element 110 of the pixel to which the "0" digital video signal is inputted does not emit light.

Conversely, in the case where the digital video signal has the information "1", the TFT 108 for EL driving is in the ON state, and thus, the power source potential is applied to the pixel electrode of the EL element 110. As a result, the EL element 110 of the pixel to which the "1" digital video signal is inputted emits light.

In the present embodiment, in the case where the digital video signal has the information "0", the TFT 108 for EL driving is in the OFF state, and, in the case where the digital video signal has the information "1", the TFT 108 for EL driving is in the ON state. However, the present invention is not limited thereto, and it may be that, in the case where the digital video signal has the information "0", the TFT 108 for EL driving is in the ON state, and, in the case where the digital video signal has the information "1", the TFT 108 for EL driving is in the OFF state.

In this way, simultaneously with the input of the digital video signal to the pixels in the first line, the EL elements 110 perform light emission or do not perform light emission such that a display period Tr1 is started. The timings when the display periods of the respective lines are started have time differences with one another.

Then, with the gate signal line G2 being in the selected state according to the selection signal for writing, the gate signal line G1 becomes nonselected, and at the same time, the gate signal line G3 is selected. Then, the second TFTs 106 for switching of the pixels in the second line whose gate electrodes are connected to the gate signal line G3, the first TFTs 105 for switching of the pixels in the third line whose gate electrodes are also connected to the gate signal line G3, and the TFTs 107 for erasing of the pixels in the fourth line whose gate electrodes are also connected to the gate signal line G3 are turned on.

Therefore, the first TFTs 105 for switching and the second TFTs 106 for switching of the pixels in the second line are simultaneously turned on. When the first TFTs 105 for switching and the second TFTs 106 for switching are simultaneously in the ON state, a digital video signal of a first bit is inputted from the source signal line driver circuit 102 to the source signal lines S1 to Sx. The first bit of the digital video signal is inputted through the first TFTs 105 for switching and the second TFTs 106 for switching to the gate electrodes of the TFTs 108 for EL driving of the pixels in the second line.

Then, all the gate signal lines are sequentially selected according to the selection signal for writing to input the first bit of the digital video signal to all the pixels. The period until the first bit of the digital video signal is inputted to all the pixels is the writing period Ta1.

In this way, during a writing period, two gate signal lines are simultaneously selected according to the selection signal for writing.

On the other hand, before the first bit of the digital video signal is inputted to all the pixels, that is, before the writing period Ta1 ends, in parallel with the input of the first bit of the digital video signal to the pixels, the gate signal line G0 is selected according to a selection signal for erasing inputted from the gate signal line driver circuit 103 to the gate signal line G0.

When the gate signal line G0 is selected according to the selection signal for erasing, the TFTs 109 for erasing of the pixels in the first line whose gate electrodes are connected to the gate signal line G0 are turned on. Therefore, the power source potential of the power supply lines V1 to Vx is applied through the TFTs 109 for erasing to the gate electrodes of the TFTs 108 for EL driving. By applying the power source potential to the gate electrodes of the TFTs 108 for EL driving, the first bit of the digital video signal retained by the gate electrodes of the TFTs 108 for EL driving since the gate signal lines G1 and G2 are selected according to the selection signal for writing is erased. In this way, the power source potential is not applied to the pixel electrodes of the EL elements 110, all the EL elements 110 of the pixels in the first line no longer emit light, and the pixels in the first line do not carry out display.

A period during which a pixel does not carry out display is referred to as a non-display period Td. With regard to the pixels in the first line, simultaneously with the selection of the gate signal line G0 according to the selection signal for erasing, the display period Tr1 ends and a non-display period Td1 starts. As in the case of the display periods, the timings when the non-display periods of the respective lines are started have time differences with one another.

Then, the gate signal line G0 becomes nonselected by the selection signal for erasing, and the gate signal line G1 is selected. When the gate signal line G1 is selected, the TFTs 107 for erasing in the second line whose gate electrodes are connected to the gate signal line G1 are turned on. In this way, the non-display period Td is started with regard to the pixels in the second line, and the pixels in the second line no longer carry out display.

Then, all the gate signal lines are sequentially selected according to the selection signal for erasing. The period until all the gate signal lines are selected according to the selection signal for erasing to erase the first bit of the digital video signal from all the pixels is an erasing period Te1.

In this way, during an erasing period, always only one gate signal line is selected according to the selection signal for erasing, and two or more gate signal lines are by no means simultaneously selected according to the selection signal for erasing.

On the other hand, before the first bit of the digital video signal retained by all the pixels are erased, that is, before the erasing period Te1 ends, in parallel with the erasing of the first bit of the digital video signal retained by the pixels, the gate signal line G0 is again selected according to the selection signal for writing. Then, a second bit of the digital video signal is inputted to the pixels in the first line. As a result, the pixels in the first line again carry out display, and thus, with regard to the pixels in the first line, the non-display period Td1 ends and a display period Tr2 starts.

Similarly, all the gate signal lines are sequentially selected according to the selection signal for writing to input the second bit of the digital video signal to all the pixels. The period until the second bit of the digital video signal is inputted to all the pixels is referred to as a writing period Ta2.

On the other hand, before the second bit of the digital video signal is inputted to all the pixels, that is, before the writing period Ta2 ends, in parallel with the input of the second bit of the digital video signal to the pixels, the gate signal line G0 is selected according to the selection signal for erasing. In this way, all the EL elements 110 of the pixels in the first line no longer emit light, and the pixels in the first line do not carry out display. Therefore, with regard to the pixels in the first line, the display period Tr2 ends and a non-display period Td2 starts.

Then, all the gate signal lines are sequentially selected according to the selection signal for erasing to erase the second bit of the digital video signal from all the pixels. The period until the second bit of the digital video signal are erased from all the pixels is an erasing period Te2.

Then, a writing period Ta3 starts. A third bit of the digital video signal is inputted to the pixels in the first line, a display period Tr3 starts with regard to the pixels in the first line, and the pixels in the first line carry out display. The third bit of the digital video signal is retained in the pixels until the next writing period is started.

Then, a writing period Ta4 starts, and the third bit of the digital video signal retained in the pixels is erased. Instead, a fourth bit of the digital video signal is inputted to the pixels in the first line, a display period Tr4 starts with regard to the pixels in the first line, and the pixels in the first line carry out display. The fourth bit of the digital video signal is retained in the pixels until the next bit of the digital video signal is inputted.

When the first writing period Ta1 of the next frame period is started, the period Tr4 ends, and at the same time, the prior frame period ends. When all the display periods Tr1 to Tr4 end, one image can be displayed. Then, the above operation is repeated.

A display period Tr3 is a period from the time when the writing period Ta3 is started to the time when the writing period Ta4 is started. A display period Tr4 is a period from the time when the writing period Ta4 is started to the time when the writing period Ta1 of the next frame period is started.

The length of the display period Tr is set to satisfy $Tr1:Tr2:Tr3:Tr4=2^0:2^1:2^2:2^3$. By combining these display periods, desired tones among the $2^4$ tones can be displayed.

The sum of the lengths of the display periods during which the EL elements emit light in one frame period determines the tone displayed by the pixel in that frame period. If the brightness when the pixel emits light during all the display periods is expressed as 100%, brightness of 20% can be given by making the pixel emit light in Tr1 and Tr2, while brightness of 27% can be given by making the pixel emit light only in Tr3.

In the present embodiment, it is important that the writing period Ta3 during which the third bit of the digital video signal is written in a pixel is shorter than the display period Tr3.

Further, the order of appearance of the display periods Tr1 to Tr4 may be changed. For example, in one frame period, it is possible that the display periods appear in the order of Tr1, Tr3, Tr4, and Tr2. However, it is more preferable that the order is such that the erasing periods Te1 to Te4 do not overlap each other. Further, it is more preferable that the order is such that the display periods Tr1 to Tr4 do not overlap each other.

According to the present invention, by the above structure, even if there is variation to some extent in the $I_{DS}$–$V_{RS}$ characteristics between TFTs, variation in the amount of current outputted when equal gate voltage is applied can be suppressed. Therefore, a situation can be avoided that there is considerable difference in the amount of light emitted from the EL elements with regard to adjacent pixels due to the variation in the $I_{DS}$–$V_{GS}$ characteristics even if a signal of equal voltage is inputted thereto.

Further, according to the present invention, a no-light-emission period during which no display is carried out can be provided. In the case of a conventional analog driving method, if an image where all the pixels display white is displayed on an EL display, the EL elements always emit light, which is a cause of accelerating the deterioration of the EL layer. According to the present invention, since a no-light-emission period can be provided, the deterioration of the EL layer can be suppressed to some extent.

It is to be noted that the present embodiment can be implemented in combination with Embodiment 2.

Embodiment 4

In the present embodiment, a plan view (FIG. 9) of the EL display according to the present invention illustrated in FIG. 3 is described. The same reference numerals denote the same parts in FIGS. 3 and 9.

Figure 9:
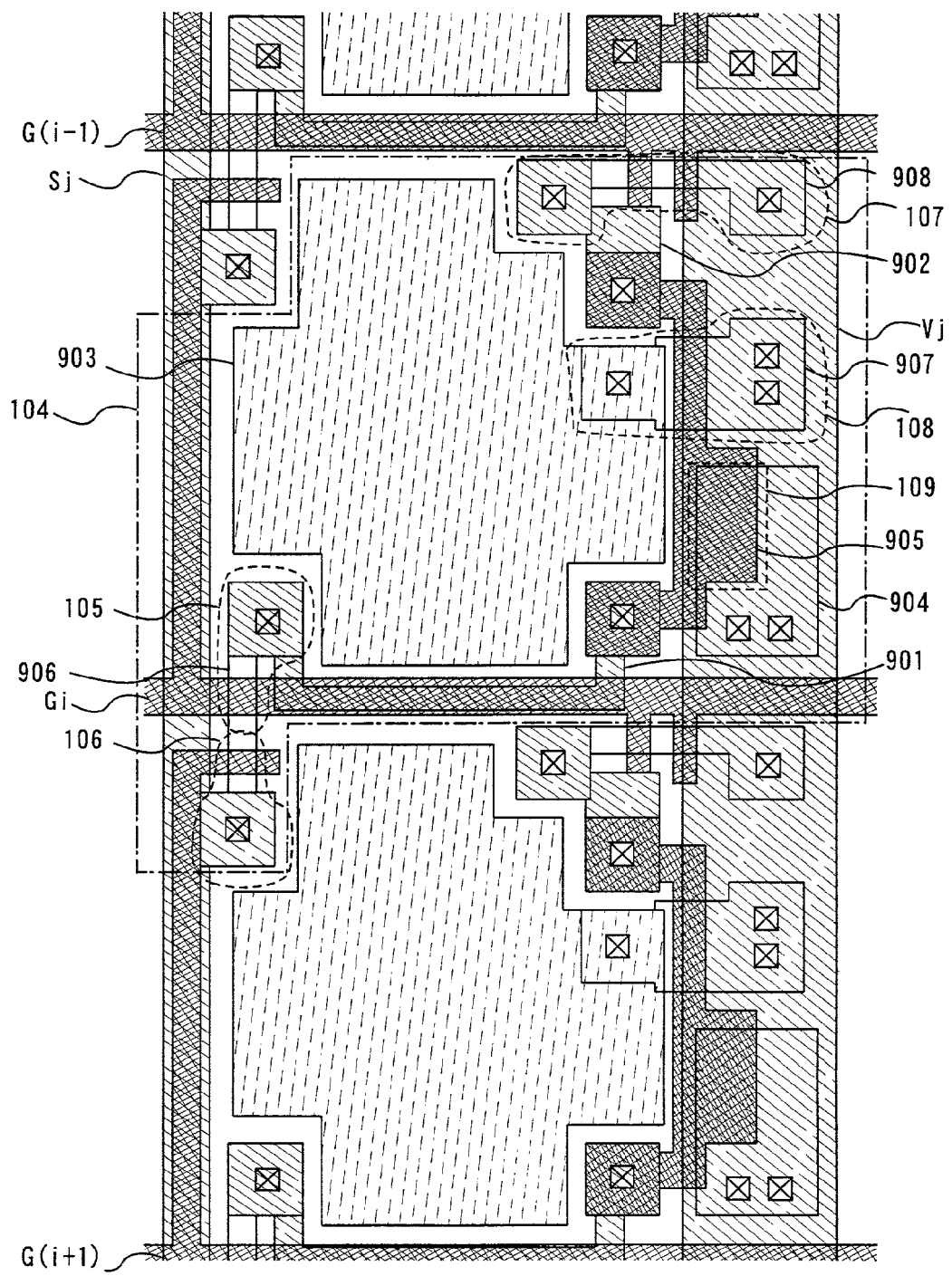
FIG. 9 is a plan view of pixels of an EL display according to the present invention.

In FIG. 9, the pixel 104 is a region where there are one source signal line Sj (j is an arbitrary number from 1 to x), one power supply line Vj (j is the arbitrary number from 1 to x), and one gate signal line Gi (i is an arbitrary number from 1 to y). The pixel 104 has the first TFT 105 for switching, the second TFT 106 for switching, the TFT 107 for erasing, and the TFT 108 for EL driving.

The first and second TFTs 105 and 106 for switching have a common active layer 906. The first TFT 105 for switching uses a part of the gate signal line G1 as its gate electrode, while the second TFT 106 for switching uses a part of the gate signal line G(i+1) as its gate electrode.

One of a source region and a drain region of the second TFT 106 for switching is connected to the source signal line Sj. One of a source region and a drain region of the first TFT 105 for switching is connected to a gate wiring 905 through a connection wiring 901.

The gate wiring 905 is connected through a connection wiring 902 to one of a source region and a drain region of the TFT 107 for erasing. The TFT 107 for erasing has an active layer 908. One of the source region or drain region of the TFT 107 for erasing not connected to the gate wiring 905 is connected to the power supply line Vj.

The TFT 108 for EL driving has an active layer 907. The TFT 108 for EL driving uses a part of the gate wiring 905 as its gate electrode. A source region of the TFT 108 for EL driving is connected to the power supply line Vj, while a drain region of the TFT 108 for EL driving is connected to a pixel electrode 903 of the EL element.

It is to be noted that the connection wiring 901 is referred to as a source wiring or a drain wiring depending on the potential of a signal inputted to the source signal line Sj. The connection wiring 902 is referred to as a source wiring or a drain wiring depending on the power source potential of the power supply line Vj.

A capacity wiring 904 is formed of a semiconductor film. The capacitor 109 is formed among the capacity wiring 904 electrically connected to the power supply line Vj, an insulating film (not shown) which is the same layer as a gate insulating film, and the gate wiring 905. Further, a capacitor formed of the gate wiring 905, a layer (not shown) which is the same as a first interlayer insulating film, and the power supply line Vj can also be used as a capacitor.

It is to be noted that, though not shown in the figure, a bank having an opening formed therein by etching an organic resin film is formed on the pixel electrode 903. Further, though not shown in the figure either, an EL layer and an opposing electrode are laminated in this order on the pixel electrode 903. The pixel electrode 903 and the EL layer are in contact with each other at the opening in the bank. The EL layer emits light only at a portion in contact with and sandwiched between the opposing electrode and the pixel electrode 903.

It is to be noted that the plan view of the pixel portion of the EL display according to the present invention is not limited to the structure illustrated in FIG. 9.

It is to be noted that the present embodiment can be implemented in combination with Embodiments 1 to 3.

Embodiment 5

In the present example, the detailed structure of the driver circuit of the EL display according to the present invention illustrated in FIG. 1 is described with reference to FIG. 10.

The source signal line driver circuit 102 basically has a shift register 102a, a latch (A) (a first latch) 102b, and a latch (B) (a second latch) 102c.

In the source signal line driver circuit 102, the clock signal for the source (S-CLK) and the start pulse for the source (S-SP) are inputted to the shift register 102a. Based on the clock signal for the source (S-CLK) and the start pulse for the source (S-SP), the shift register 102a serially generates timing signals, and inputs them to the latch (A) 102b.

Figure 10:
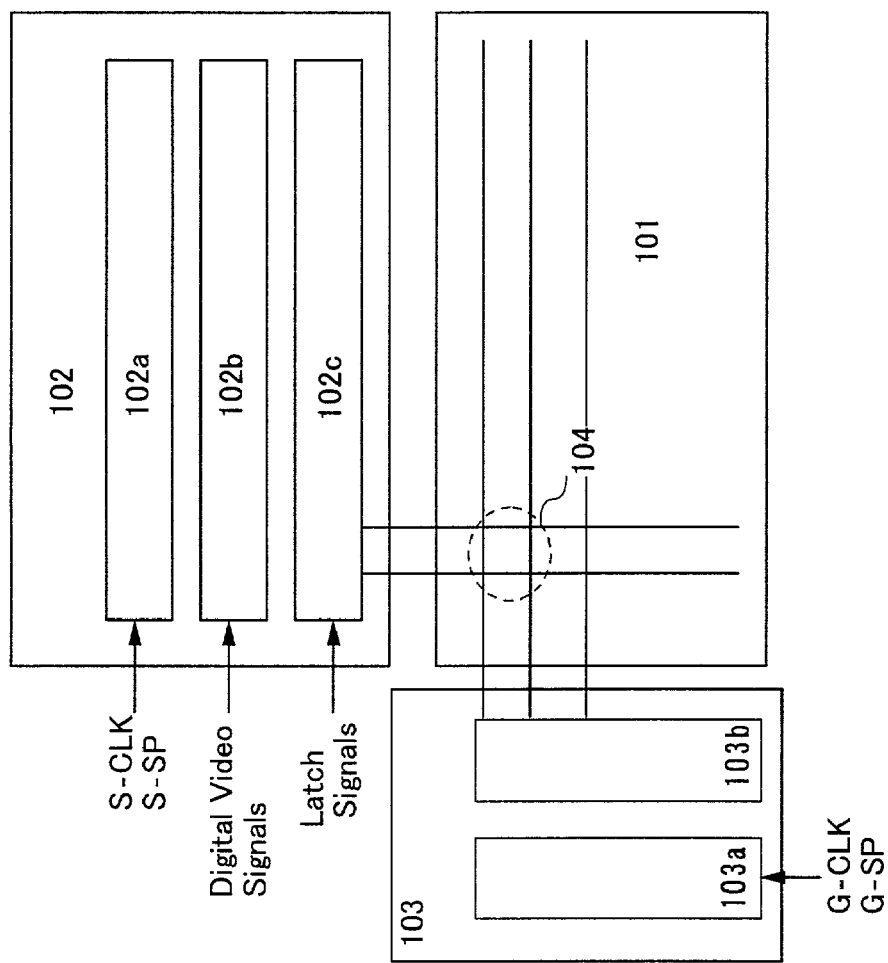
FIG. 10 is a block diagram illustrating the structure of a driver circuit of the EL display according to the present invention.

It is to be noted that, though not shown in FIG. 10, the timing signals outputted from the shift register 102a may be inputted to the latch (A) 102b as a circuit at a subsequent stage after the timing signals are buffered by a buffer or the like (not shown). Since many circuits or elements are connected to wirings to which the timing signals are supplied, these wirings have a large load capacity (parasitic capacitance). The buffer or the like is provided for the purpose of preventing "blunt" leading and trailing edges of the timing signals caused by this large load capacity.

The latch (A) 102b has a plurality of stages for processing an n-bit digital video signal. When a timing signal is inputted to the latch (A) 102b, the latch (A) 102b serially takes in and retains the n bits of the digital video signal inputted from the external of the source signal line driver circuit 102.

It is to be noted that, when the latch (A) 102b takes in a digital video signal, the bits of the digital video signal may be serially inputted to the plurality of stages of latches of the latch (A) 102b. However, the present invention is not limited to the structure. The plurality of stages of latches of the latch (A) 102b may be divided into several groups to which the digital video signal is simultaneously inputted, which is so-called division driving. It is to be noted that the number of the groups here is referred to as a division number. For example, when the plurality of stages of latches are divided into four groups, the division driving is performed in tetra-partition.

A period during which the digital video signal is written in all the stages of latches of the latch (A) 102b is referred to as a line period. In other words, a period from the time when writing of the digital video signal in a latch at the leftmost stage is started to the time when writing of the digital video signal in a latch at the rightmost stage is ended is a line period. Actually, there is a case where the period from the time when writing of the digital video signal in a latch at the leftmost stage is started to the time when writing of the digital video signal in a latch at the rightmost stage is ended plus a horizontal retrace line period is a line period.

When one line period ends, a latch signal is supplied to the latch (B) 102c. At this time, all the bits of the digital video signal written in and retained by the latch (A) 102b are simultaneously sent to the latch (B) 102c, and are written in and retained by all the stages of latches of the latch (B) 102c.

After the latch (A) 102b sends the digital video signal to the latch (B) 102c, based on a timing signal from the shift register 102a, the digital video signal inputted from the external of the source signal line driver circuit 102 are serially written in the latch (A) 102b.

During this second cycle of a line period, the digital video signal written in and retained by the latch (B) 102c are inputted to the source signal line.

On the other hand, the gate signal line driver circuit 103 has a shift register 103*a* and a buffer 103*b*. Depending on the situation, the gate signal line driver circuit 103 may have a level shift in addition to the shift register 103*a* and the buffer 103*b*.

In the gate signal line driver circuit 103, a timing signal from the shift register 103*a* is supplied to the buffer 103*b*, and is supplied to a corresponding gate signal line. For example, the gate signal line G1 (i is an arbitrary number from 1 to y) is connected to gate electrodes of the second TFTs 106 for switching of pixels in the (i−1)th line, gate electrodes of the first TFTs 105 for switching of pixels in the ith line, and gate electrodes of the TFTs 107 for erasing of pixels in the (i+1)th line. Therefore, all the TFTs connected to one gate signal line are required to be simultaneously turned on. Accordingly, as the buffer, one through which high current can pass is used.

It is to be noted that the present embodiment can be implemented in combination with Embodiments 1 to 4.

Embodiment 6

In Embodiment 6, a method of manufacturing TFTs provided in a pixel portion of the EL display of the present invention will be described.

Figure 11A:
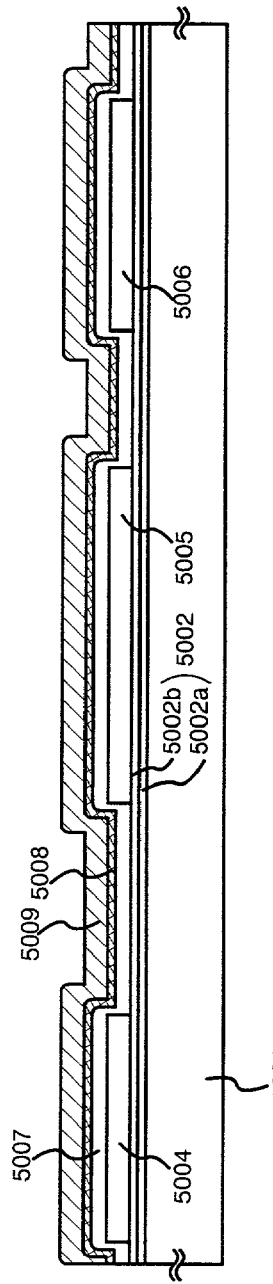
FIGS. 11A–11C illustrate a manufacturing process of the EL display according to the present invention.

First, as shown in FIG. 11A, a base film 5002 made of an insulating film such as a silicon oxide film, a silicon nitride film, or a silicon oxynitride film is formed on a substrate 5001 made from glass, such as barium borosilicate glass or aluminum borosilicate glass, typically Corning Corp. #7059 glass or #1737 glass. For example, a silicon oxynitride film 5002*a* manufactured from $SiH_4$, $NH_3$, and $N_2O$ by plasma CVD is formed with a thickness of 10 to 200 nm (preferably from 50 to 100 nm), and a hydrogenized silicon oxynitride film 5002*b* with a thickness of 50 to 200 nm (preferably between 100 and 150 nm), manufactured from $SiH_4$ and $N_2O$, is similarly formed and laminated. The base film 5002 with the two layer structure is shown in Embodiment 6, but the base film 5002 may also be formed as a single layer of one of the above insulating films, and it may be formed having a lamination structure in which two or more layers are laminated.

Island shape semiconductor layers 5004 to 5006 are formed of crystalline semiconductor film manufactured by using a laser crystalline method or a known thermal crystallization method with a semiconductor film having an amorphous structure. The thickness of the island shape semiconductor layers 5004 to 5006 is set from 25 to 80 nm (preferably between 30 and 60 nm). There are no limitations on the crystalline semiconductor film material, but it is preferable to form the film from a semiconductor material such as silicon or a silicon germanium (SiGe) alloy.

A laser such as a pulse oscillation type or continuous emission type excimer laser, a YAG laser, or a $YVO_4$ laser can be used as a laser light source in manufacturing the crystalline semiconductor film with the laser crystallization method. A method of condensing laser light emitted from a laser oscillator into a linear shape by an optical system and then irradiating the light to the semiconductor film may be employed when these types of lasers are used. The crystallization conditions may be suitably selected by the operator. However, the pulse oscillation frequency is set to 300 Hz, and the laser energy density is set form 100 to 400 $mJ/cm^2$ (typically between 200 and 300 $mJ/cm^2$) when using the excimer laser. Further, the second harmonic is utilized when using the YAG laser, the pulse oscillation frequency is set from 30 to 300 KHz, and the laser energy density may be set from 300 to 600 $mJ/cm^2$ (typically between 350 and 500 $mJ/cm^2$). The laser light which has been condensed into a linear shape with a width of 100 to 1000 μm, for example 400 μm, is then irradiated onto the entire surface of the substrate. This is performed with an overlap ratio of 50 to 90% for the linear laser light.

A gate insulating film 5007 is formed covering the island shape semiconductor layers 5004 to 5006. The gate insulating film 5007 is formed of an insulating film containing silicon to a thickness of 40 to 150 nm by plasma CVD or sputtering. A 120 nm thick silicon oxynitride film is formed in Embodiment 6. The gate insulating film is not limited to this type of silicon oxynitride film, of course, and other insulating films containing silicon may also be used, in a single layer or in a lamination structure. For example, when using a silicon oxide film, it can be formed by plasma CVD with a mixture of TEOS (tetraethyl orthosilicate) and $O_2$, at a reaction pressure of 40 Pa, with the substrate temperature set from 300 to 400° C., and by discharging at a high frequency (13.56 MHz) electric power density of 0.5 to 0.8 $W/cm^2$. Good characteristics as a gate insulating film can be obtained by subsequently performing thermal annealing, at between 400 and 500° C., of the silicon oxide film thus formed.

A first conductive film 5008 and a second conductive film 5009 are then formed on the gate insulating film 5007 in order to form gate electrodes. The first conductive film 5008 is formed from Ta with a thickness of 50 to 100 nm, and the second conductive film 5009 is formed by W with a thickness of 100 to 300 nm, in Embodiment 6.

The Ta film is formed by sputtering, and sputtering with a Ta target is performed by using Ar. If appropriate amounts of Xe and Kr are added to the Ar during sputtering, the internal stress of the Ta film will be relaxed, and film peeling can be prevented. The resistivity of an α phase Ta film is on the order of 20 μΩcm, and it can be used in the gate electrode, but the resistivity of a β phase Ta film is on the order of 180 μΩcm and it is unsuitable for the gate electrode. The α phase Ta film can easily be obtained if a tantalum nitride film, which possesses a crystal structure similar to that of α phase Ta, is formed with a thickness of 10 to 50 nm as a base for Ta in order to form the α phase Ta film.

A W film is formed by sputtering with a W target. The W film can also be formed by thermal CVD using tungsten hexafluoride ($WF_6$). Whichever is used, it is necessary to make the film become low resistance in order to use it as the gate electrode, and it is preferable that the resistivity of the W film be made equal to or less than 20 μΩcm. The resistivity can be lowered by enlarging the crystals of the W film, but for cases in which there are many impurity elements such as oxygen within the W film, crystallization is inhibited, and the film becomes high resistance. A W target having a purity of 99.9999% is thus used in sputtering. In addition, the W film is formed while sufficient care is taken in order that no impurities from within the gas phase are introduced at the time of film formation. Thus, a resistivity of 9 to 20 μΩm can be achieved.

Note that, although the first conductive film 5008 is Ta and the second conductive film 5009 is W in Embodiment 6, the conductive films are not limited to these. Both the first conductive film 5008 and the second conductive film 5009 may also be formed from an element selected from the group consisting of Ta, W, Ti, Mo, Al, and Cu, from an alloy material having one of these elements as its main component, or from a chemical compound of these elements. Further, a semiconductor film, typically a polysilicon film, into which an impurity element such as phosphorous is doped may also be used. Examples of preferable combinations other than that used in Embodiment 6 include: a combination of the first conductive film 5008 formed from tantalum nitride (TaN) and the second conductive film 5009 formed from W; a combination of the first conductive film 5008 formed from tantalum nitride (TaN) and the second conductive film 5009 formed from Al; and a combination of the first conductive film 5008 formed from tantalum nitride (TaN) and the second conductive film 5009 formed from Cu. (See FIG. 11A.)

A mask 5010 is formed next from resist, and a first etching process is performed in order to form electrodes and wirings. An ICP (inductively coupled plasma) etching method is used in Embodiment 6. A gas mixture of $CF_4$ and $Cl_2$ is used as an etching gas, and a plasma is generated by applying a 500 W RF electric power (13.56 MHz) to a coil shape electrode at 1 Pa. A 100 W RF electric power (13.56 MHz) is also applied to the substrate side (test piece stage), effectively applying a negative self-bias. The W film and the Ta film are both etched on the same order when $CF_4$ and $Cl_2$ are combined.

Edge portions of the first conductive layer and the second conductive layer are made into a tapered shape in accordance with the effect of the bias voltage applied to the substrate side with the above etching conditions by using a suitable resist mask shape. The angle of the tapered portions is from 15 to 45°. The etching time may be increased by approximately 10 to 20% in order to perform etching without any residue remaining on the gate insulating film. The selectivity of a silicon oxynitride film with respect to a W film is from 2 to 4 (typically 3), and therefore approximately 20 to 50 nm of the exposed surface of the silicon oxynitride film is etched by this over-etching process. First shape conductive layers 5012 to 5016 (first conductive layers 5012a to 5016a and second conductive layers 5012b to 5016b) composed of the first conductive layer and the second conductive layer are thus formed by the first etching process. Portions of the gate insulating film 5007 not covered by the first shape conductive layers 5012 to 5016 are etched on the order of 20 to 50 nm, forming thinner regions.

Figure 11B:
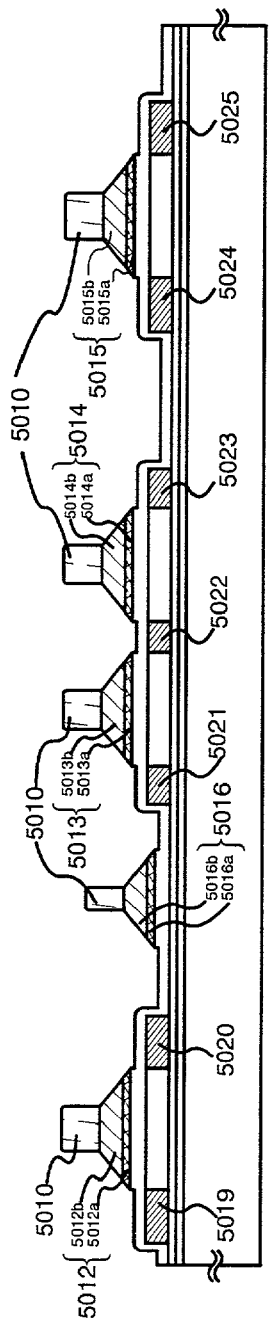

A first doping process is then performed, and an impurity element which imparts n-type conductivity is added. Ion doping or ion injection may be performed as the doping method. Ion doping is performed at conditions in which the dosage is set to $1 \times 10^{13}$ to $5 \times 10^{14}$ atoms/cm², and an acceleration voltage is set between 60 and 100 keV. An element residing in group 15 of the periodic table, typically phosphorous (P) or arsenic (As), is used as the n-type conductivity imparting impurity element. Phosphorous (P) is used here. The conductive layers 5012 to 5015 become masks with respect to the n-type conductivity imparting impurity element, and first impurity regions 5019 to 5025 are formed in a self-aligning manner. The impurity element which imparts n-type conductivity is added to the first impurity regions 5019 to 5025 at a concentration within a range of $1 \times 10^{20}$ and $1 \times 10^{21}$ atoms/cm³. (See FIG. 11B.)

Figure 11C:
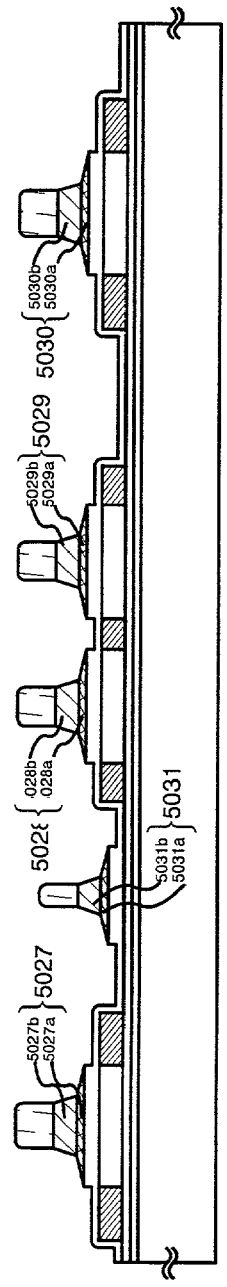

As shown in FIG. 11(C), a second etching process is performed without removing resist mask. The W film is selectively etched by using a mixture of $CF_4$, $Cl_2$, and $O_2$ as the etching gas. Second shape conductive layers 5027 to 5031 (first conductive layers 5027a to 5031a and second conductive layers 5027b to 5031b) are thus formed by the second etching process. Portions of the gate insulating film 5007 not covered by the second shape conductive layers 5027 to 5031 are etched on the order of 20 to 50 nm, forming thinner regions.

The etching reaction of the W film or the Ta film in accordance with the mixed gas of $CF_4$ and $Cl_2$ can be estimated from the generated radicals, or from the ion species and vapor pressures of the reaction products. Comparing the vapor pressures of W and Ta fluorides and chlorides, the W fluoride compound $WF_6$ is extremely high, and the vapor pressures of $WCl_5$, $TaF_5$, and $TaCl_5$ are of similar order. Therefore the W film and the Ta film are both etched by the $CF_4$ and $Cl_2$ gas mixture. However, if a suitable quantity of $O_2$ is added to this gas mixture, $CF_4$ and $O_2$ react, forming CO and F, and a large amount of F radicals or F ions are generated. As a result, the etching speed of the W film having a high fluoride vapor pressure becomes high. On the other hand, even if F increases, the etching speed of Ta does not relatively increase. Further, Ta is easily oxidized compared to W, and therefore the surface of Ta is oxidized by the addition of $O_2$. The etching speed of the Ta film is further reduced because Ta oxides do not react with fluorine and chlorine. It therefore becomes possible to have a difference in etching speeds of the W film and the Ta film, and it becomes possible to make the etching speed of the W film larger than that of the Ta film.

A second doping process is then performed as shown in FIG. 12A. In this case, an impurity element which imparts n-type conductivity is doped under conditions of a lower dosage than that in the first doping process, and at a higher acceleration voltage than that in the first doping process. For example, doping may be performed at an acceleration voltage of 70 to 120 keV and with a dosage of $1 \times 10^{13}$ atoms/cm², forming new impurity regions inside the first impurity regions formed in the island shape semiconductor layers of FIG. 11B. Doping is performed with the second shape conductive layers 5027 to 5030 as masks with respect to the impurity element, and doping is done such that the impurity element is also added to regions below the first conductive layers 5027a to 5030a. Third impurity regions 5033 to 5036 are thus formed. A concentration of phosphorus (P) added to the third impurity regions 5033 to 5036 is provided with a gradual concentration gradient in accordance with a film thickness of the taper portion of the first conductive layers 5027a to 5030a. Further, in the semiconductor layer overlapping the taper portion of the first conductive layers 5027a to 5030a, from an end portion of the taper portion of the first conductive layers 5027a to 5030a toward an inner side, the impurity concentration is more or less reduced, however, the concentration stays to be substantially the same degree.

As shown in FIG. 12(B), a third etching process is carried out by using a reactive ion etching process (RIE process) with an etching gas of $CHF_6$. The tapered portions of the first conductive layers 5027a to 5031a are partially etched, and the region in which the first conductive layers overlap with the semiconductor layer is reduced by the third etching process. Third shape conductive layers 5038 to 5042 (first conductive layers 5038a to 5042a and second conductive layers 5038b to 5042b) are formed. At this point, regions of the gate insulating film 5007, which are not covered with the third shape conductive layers 5038 to 5042 are made thinner by about 20 to 50 nm by etching.

By the third etching process, in the third impurity regions 5033 to 5036, third impurity regions 5033a to 5036a which overlap with the first conductive layers 5038a to 5041a, and second impurity regions 5033b to 5036b between the first impurity regions and the third impurity regions are formed.

Then, as shown in FIG. 12C, fourth impurity regions 5049 to 5054 having a conductivity type opposite to the first conductivity type are formed in an island-like semiconductor layer 5006 forming p-channel TFTs. The third shape conductive layer 5041b is used as masks to an impurity element, and the impurity regions are formed in a self-aligning manner. At this time, the whole surfaces of the island-like semiconductor layers 5004 and 5005, and the wiring portion 5042, which form n-channel TFTs are covered with a resist mask 5200. Phosphorus is added to the impurity regions 5049 to 5054 at different concentrations, respectively. The regions are formed by an ion doping method using diborane ($B_2H_6$) and the impurity concentration is made $2\times10^{20}$ to $2\times10^{21}$ atoms/cm$^3$ in any of the regions.

By the steps up to this, the impurity regions are formed in the respective island-like semiconductor layers. The third shape conductive layers 5038 to 5041 overlapping with the island-like semiconductor layers function as gate electrodes. The conductive layer 5042 functions as an island-like source signal line.

After the resist mask 5200 is removed, a step of activating the impurity elements added in the respective island-like semiconductor layers for the purpose of controlling the conductivity type. This step is carried out by a thermal annealing method using a furnace annealing oven. In addition, a laser annealing method or a rapid thermal annealing method (RTA method) can be applied. The thermal annealing method is performed in a nitrogen atmosphere having an oxygen concentration of 1 ppm or less, preferably 0.1 ppm or less and at 400 to 700° C., typically 500 to 600° C. In Embodiment 6, a heat treatment is conducted at 500° C. for 4 hours. However, in the case where a wiring material used for the third shape conductive layers 5038 to 5042 is weak to heat, it is preferable that the activation is performed after an interlayer insulating film (containing silicon as its main ingredient) is formed to protect the wiring line or the like.

Further, a heat treatment at 300 to 450° C. for 1 to 12 hours is conducted in an atmosphere containing hydrogen of 3 to 100%, and a step of hydrogenating the island-like semiconductor layers is conducted. This step is performed to terminate dangling bonds in the semiconductor layer by thermally excited hydrogen. As another means for hydrogenation, plasma hydrogenation (using hydrogen excited by plasma) may be carried out.

Next, as shown in FIG. 13A, a first interlayer insulating film 5055 having a thickness of 100 to 200 nm is formed of a silicon nitride oxide film. A second interlayer insulating film 5056 made of an organic insulator material is formed thereon. Contact holes are then formed with respect to the first interlayer insulating film 5055, the second interlayer insulating film 5056, and the gate insulating film 5007, respective wirings (including connection wirings and signal lines) 5059 to 5062, and 5064 are formed by patterning, and then, a pixel electrode 5063 that contacts with the connection wiring 5062 is formed by patterning.

Next, the film made from organic resin is used for the second interlayer insulating film 5056. As the organic resin, polyimide, polyamide, acryl, BCB (benzocyclobutene) or the like can be used. Especially, since the second interlayer insulating film 5056 has rather the meaning of flattening, acryl excellent in flatness is desirable. In Embodiment 6, an acryl film is formed to such a thickness that stepped portions formed by the TFTs can be adequately flattened. The thickness is preferably made 1 to 5 μm (more preferably 2 to 4 μm).

In the formation of the contact holes, dry etching or wet etching is used, and contact holes reaching the n-type impurity regions 5019, 5020, 5021 and 5023, a contact hole reaching the wiring 5042, a contact hole reaching the power source supply line (not shown), and contact holes reaching the gate electrodes (not shown) are formed, respectively.

Further, a lamination film of a three layer structure, in which a 100 nm thick Ti film, a 300 nm thick aluminum film containing Ti, and a 150 nm thick Ti film are formed in succession by sputtering, is patterned into a desirable shape, and the resultant lamination film is used as the wirings (including connection wirings and signal lines) 5059 to 5062, and 5064. Of course, other conductive films may be used.

Furthermore, in Embodiment 6, an ITO film is formed with a thickness of 110 nm, and patterning is performed to form the pixel electrode 5063. The pixel electrode 5063 is arranged so as to contact and overlap the connection wiring 5062 so that contact is obtained. Further, a transparent conductive film in which zinc oxide (ZnO) of 2 to 20% is mixed with indium oxide maybe used. This pixel electrode 5063 corresponds to an anode of an EL element. (FIG. 13A)

Nest, as shown in FIG. 13B, an insulating film containing silicon (a silicon oxide film in Embodiment 6) is formed with a thickness of 500 nm, an opening portion is formed at the position corresponding to the pixel electrode 5063, and then, a third interlayer insulating film 5065 that functions as a bank is formed. In forming the opening portion, side walls having a tapered shape may be easily formed by using wet etching. The deterioration of the EL layer due to stepped portion becomes a remarkable problem if the side walls of the opening portion are sufficiently flat.

An EL layer 5066 and a cathode (MgAg electrode) 5067 are formed next in succession, without exposure to the atmosphere, using a vacuum evaporation method. Note that the film thickness of the EL layer 5066 may be set from 80 to 200 nm (typically between 100 and 120 nm), and the thickness of the cathode 5067 may be set from 180 to 300 nm (typically 200 to 250 nm).

The EL layer and the cathode are formed one after another with respect to pixels corresponding to the color red, pixels corresponding to the color green, and pixels corresponding to the color blue. However, the EL layer is weak with respect to a solution, and therefore the EL layer and the cathode must be formed with respect to each of the colors without using a photolithography technique. It is preferable to cover areas outside of the desired pixels using a metal mask, and selectively form the EL layer and the cathode only in the necessary locations.

In other words, a mask is first set so as to cover all pixels except for those corresponding to the color red, and the EL layer for emitting red color light is selectively formed using the mask. Next, a mask is set so as to cover all pixels except for those corresponding to the color green, and the EL layer for emitting green color light is selectively formed using the mask. Similarly, a mask is set so as to cover all pixels except for those corresponding to the color blue, and the EL layer for emitting blue color light is selectively formed using the mask. Note that the use of all different masks is stated here, but the same mask may also be reused.

The method of forming three kinds of EL elements corresponding to the colors RGB is used here, but a method of combining a white color light emitting EL element and a color filter, a method of combining a blue or blue-green color light emitting EL element and a fluorescing body (fluorescing color conversion layer: CCM), a method of using a transparent electrode as a cathode (opposing electrode) and overlapping it with EL elements each corresponding to one of the colors RGB and the like may be used.

A known material can be used as the EL layer 5066. Considering the driver voltage, it is preferable to use an organic material as the known material. For example, a four layer structure constituted of a hole injecting layer, a hole transporting layer, a light emitting layer and an electron injecting layer may be adopted as an EL layer.

Next, the cathode 5067 is formed using a metal mask on the pixels having the switching TFTs of which the gate electrodes are connected to the same gate signal line (pixels on the same line). Note that, in Embodiment 6, although MgAg is used as the cathode 5067, the present invention is not limited to this. Other known materials may be used for the cathode 5067.

Finally, a passivation film 5068 made of a silicon nitride film is formed with a thickness of 300 nm. The formation of the passivation film 5068 enables the EL layer 5066 to be protected against moisture and the like, and the reliability of the EL element can further be enhanced.

Consequently, the EL display with the structure as shown in FIG. 13B is completed. Note that, in the manufacturing process of the EL display in Embodiment 6, the source signal lines are formed from Ta and W, which are materials for forming gate electrodes, and the gate signal lines are formed from Al, which is a material for forming wirings, but different materials may be used.

An n-channel type TFT 5101 is a TFT for erasing, 5102 is a first switching TFT, and 5103 is a second switching TFT. Also, p-channel type TFT 5104 is a TFT for EL driving. An n-type impurity region 5023 formed in the second switching TFT 5103 is connected to the gate electrode 5041 of a TFT 5104 for EL driving through a connection wiring 5061.

Incidentally, the EL display in Embodiment 6 exhibits the very high reliability and has the improved operational characteristic by providing TFTs having the most suitable structure in not only the pixel portion but also the driver circuit portion. Further, it is also possible to add a metallic catalyst such as Ni in the crystallization process, thereby increasing crystallinity. It therefore becomes possible to set the driving frequency of the source signal line driver circuit to 10 MHz or higher.

First, a TFT having a structure in which hot carrier injection is reduced without decreasing the operating speed as much as possible is used as an n-channel TFT of a CMOS circuit forming the driver circuit portion. Note that the driver circuit referred to here includes circuits such as a shift register, a buffer, a level shifter, a latch in line-sequential drive, and a transmission gate in dot-sequential drive.

In Embodiment 6, the active layer of the n-channel TFT contains the source region, the drain region, the LDD region overlapping with the gate electrode with the gate insulating film sandwiched therebetween (Lov region), the LDD region not overlapping with the gate electrode with the gate insulating film sandwiched therebetween (Loff region), and the channel forming region.

Further, there is not much need to worry about degradation due to the hot carrier injection with the p-channel TFT, and therefore LDD regions may not be formed in particular. It is of course possible to form LDD regions similar to those of the n-channel TFT, as a measure against hot carriers.

Note that, in practice, it is preferable to perform packaging (sealing), without exposure to the atmosphere, using a protecting film (such as a laminated film or an ultraviolet cured resin film) having good airtight properties and little outgassing, or a transparent sealing material, after completing through the state of FIG. 13B. At this time, the reliability of the EL element is increased by making an inert atmosphere on the inside of the sealing material and by arranging a drying agent (barium oxide, for example) inside the sealing material.

Further, after the airtight properties have been increased by the packaging process, a connector (flexible printed circuit: FPC) is attached in order to connect terminals led from the elements or circuits formed on the substrate with external signal terminals. Then, a finished product is completed. This state at which the product is ready for shipment is referred to as an EL module throughout this specification.

Furthermore, in accordance with the process shown in Embodiment 6, the number of photo masks required for manufacture of an EL module can be suppressed. As a result, the process can be shortened, and the reduction of the manufacturing cost and the improvement of the yield can be attained.

Note that it is possible to implement Embodiment 6 in combination with Embodiments 1 to 5.

Embodiment 7

Figure 14:
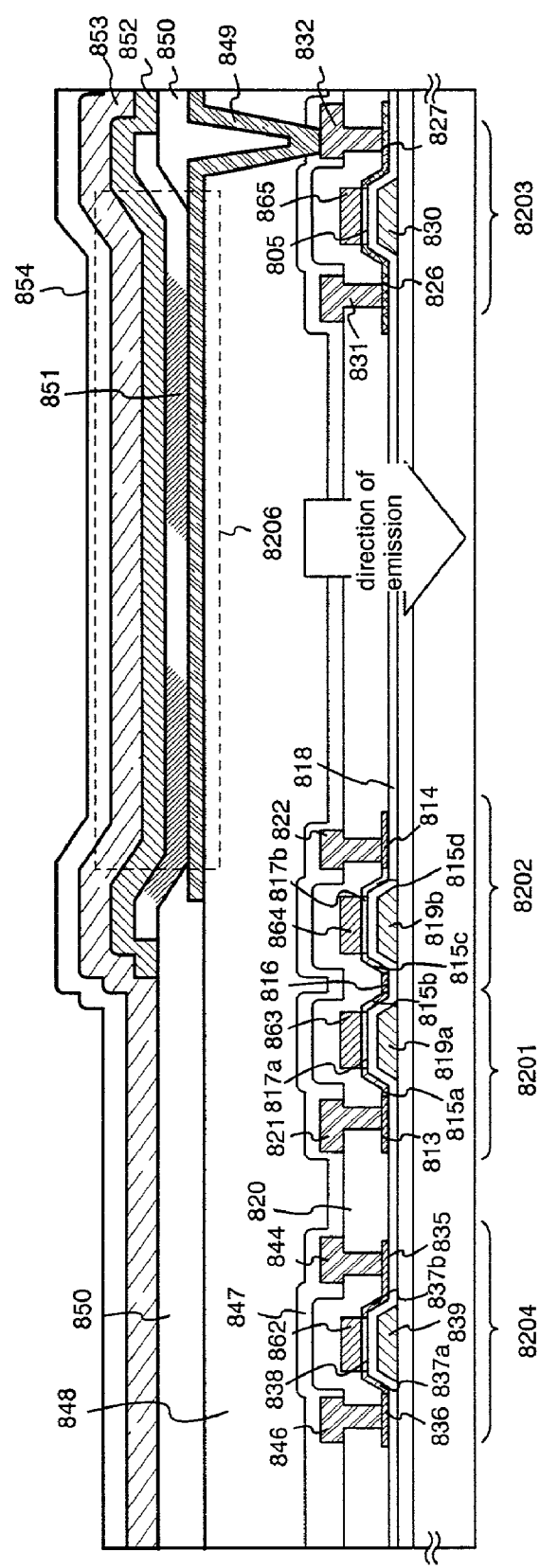
FIG. 14 is a detailed sectional view of an EL display according to the present invention.

An outline of a cross sectional structure of an EL display of the present invention is explained in Embodiment 7 using an example shown in FIG. 14 different from that of FIG. 13. An example is shown in FIG. 13 in which the first and the second switching TFTs, the TFT for erasing, and the TFT for EL driving are top gate TFTs, but an example of using bottom gate thin film transistors for the TFTs is explained in Embodiment 7.

In FIG. 13, reference numeral 811 denotes a substrate, and reference numeral 812 denotes an insulating film which becomes a base (hereafter referred to as a base film). A light transmitting substrate, typically a glass substrate, a quartz substrate, a glass ceramic substrate, or a crystalline glass substrate can be used as the substrate 811. However, the substrate used must be one able to withstand the highest process temperature during the manufacturing processes.

Further, the base film 812 is particularly effective when using a substrate containing mobile ions or a substrate which has conductivity, but the base film 812 need not be formed on a quartz substrate. An insulating film containing silicon may be used as the base film 812. Note that the term "insulating film containing silicon" in this specification specifically indicates an insulating film such as a silicon oxide film, a silicon nitride film, and a silicon oxynitride film (denoted as SiOxNy, where x and y are arbitrary integers) containing oxygen or nitrogen at predetermined ratios with respect to silicon.

Reference numeral 8201 denotes a first switching TFT, reference numeral 8202 denotes a second switching TFT, 8203 denotes a TFT for EL driving, 8204 denotes a TFT for erasing, and respective TFTs are formed by both n-channel TFTs and p-channel TFTs.

When the light emitting direction of an EL element 8206 is toward the substrate 811 lower side (surface where TFTs and the EL layer are not formed), it is preferable that the switching TFT and the TFT for EL driving have the above structure. However, the present invention is not limited to this structure. The first and second switching TFTs 8201 and 8202, the TFT 8203 for EL driving, and the TFT 8204 for erasing may be either n-channel TFTs or p-channel TFTs.

The first switching TFT 8201 has impurity regions 813 and 816, LDD regions 815a and 815b, a channel forming region 817a, a gate electrode 819a, a gate insulating film 818, and a first interlayer insulating film 820. The impurity region 813 is connected to a source signal line (not shown in the figure) through a connection wiring 821.

The second switching TFT 8202 has impurity regions 816 and 814, LDD regions 815c and 815d, a channel forming region 817b, a gate electrode 819b, a gate insulating film 818, and a first interlayer insulating film 820. The first switching TFT 8201 and the second switching TFT 8202 hold the impurity region 816 in common. Further, the impurity region 814 is connected to a gate electrode 830 of a TFT 8203 for EL driving through a connection wiring 822.

Note that the gate insulating film 818 or the first interlayer insulating film 820 may be common among all TFTs on the substrate, or may differ depending upon the circuit or the element.

Furthermore, the first and second switching TFTs 8201 and 8202 shown in FIG. 13 have a common active layer, however, the present invention is not limited thereto. The first and second switching TFTs 8201 and 8202 have active layers which are separated from each other, respectively.

In addition, the LDD regions 815a to 815d are formed so as not to overlap the gate electrodes 819a and 819b through the gate insulating film 818. This type of structure is extremely effective in reducing the off current. Furthermore, the length (width) of the LDD regions 815a to 815d may be set from 0.5 to 3.5 μm, typically between 2.0 and 2.5 μm.

Next, the TFT 8203 for EL driving is formed having an active layer containing a source region 826, a drain region 827, and a channel forming region 805; the gate insulating film 818; a gate electrode 830, the first interlayer insulating film 820; a source wiring 831; and a drain wiring 832. The source region 826 is connected to a power source line (not shown in the figure) through the source wiring 831. Further, the drain region 827 is connected to a pixel electrode 849 through the drain wiring 832.

The TFT 8203 for EL driving is an element for controlling the amount of electric current injected to the EL element 8206, and a relatively large amount of current flows. It is therefore preferable to design the channel width W of the TFT 8203 for EL driving to be larger than the channel width of the first and second switching TFTs 8201 and 8202. Further, it is preferable to design the channel length L to be larger such that an excess of electric current does not flow in the TFT 8203 for EL driving. It is preferable to have from 0.5 to 2 μA (more preferably between 1 and 1.5 μA) per pixel.

In addition, by making the film thickness of the active layers (particularly the channel forming region) of the TFTs 8203 for EL driving thicker (preferably from 50 to 100 nm, more preferably between 60 and 80 nm), degradation of the TFT due to a large amount of current may be suppressed. Conversely, it is also effective to make the film thickness of the active layer (particularly the channel forming region) thinner (preferably from 20 to 50 nm, more preferably between 25 and 40 nm), from the standpoint of making the off current smaller, for the case of the switching TFT 8201.

The TFT for erasing 8204 is formed having an active layer containing impurity regions 835 and 836, LDD regions 837a and 837b, a channel forming region 838; a gate insulating film 818; a gate electrode 839; a first interlayer insulating film 820; and connection wirings 846 and 844. The LDD regions 837a and 837b overlap the gate electrode 839 through the gate insulating film 818.

One of the impurity regions 835 and 836 is connected to the power source supply line (not shown in figure) through the connection wiring 846 or 844. The other is connected to the gate electrode 830 of the TFT 8203 for EL driving through the connection wiring 846 or 844.

Note that reference numerals 862 to 865 are masks for forming channel forming regions 817a, 817b, 805 and 838.

Note that it is preferable to form an offset region (a region made of a semiconductor layer having the same component as that of the channel forming region and gate voltage is not applied thereto) between a channel forming region and an LDD region, giving the advantage of reducing an off current. In Embodiment 7, a case where a single gate structure is used, is shown, and the present invention may also have a multi-gate structure. The multi-gate structure is very effective in reducing OFF current. If the OFF current of the first and second switching TFTs 8201 and 8202, and the TFT 8204 for erasing is lowered enough, the minimum capacitance necessary for the capacitor connected to a gate electrode of the TFT 8203 for EL driving can be reduced that much. In other words, the area occupied by the capacitor can be diminished. Therefore giving the multi-gate structure to the switching TFT is also effective in increasing the effective light emission area of the EL element.

Note that the first and second switching TFTs 8201 and 8202, and the TFT 8204 for erasing and the TFT 8203 for EL driving may be a p-channel type or an n-channel type. It is necessary that the first and second switching TFTs 8201 and 8202, and the TFT 8204 for erasing have the same polarity.

Next, reference numeral 847, denotes a first passivation film, and its film thickness may be set from 10 nm to 1 μm (preferably between 200 and 500 nm). An insulating film containing silicon (in particular, it is preferable to use an oxidized silicon nitride film or a silicon nitride film) can be used as the passivation film material. The passivation film 847 possesses a role of protecting the TFTs from alkaline metals and moisture. Alkaline metals such as sodium are contained in an EL layer formed last over the TFT (in particular, the TFT for EL driving). In other words, the first passivation film 847 works as a protecting layer so that these alkaline metals (mobile ions) do not penetrate into the TFT.

Further, reference numeral 848 denotes a second interlayer insulating film, which has a function as a leveling film for performing leveling of a step due to the TFTs. An organic resin film is preferable as the second interlayer insulating film 848, and one such as polyimide, polyamide, acrylic, or BCB (benzocyclobutene) may be used. These organic resin films have the advantages of easily forming a good, level surface, having a low specific dielectric constant. The EL layer is extremely sensitive to unevenness, and therefore it is preferable to mostly absorb the TFT step by the second interlayer insulating film 848. In addition, it is preferable to form the low specific dielectric constant material thickly in order to reduce the parasitic capacitance formed between the gate signal line or source signal line and the cathode of the EL element. The thickness, therefore, is preferably from 0.5 to 5 μm (more preferably between 1.5 and 2.5 μm).

Further, reference numeral 849 denotes a pixel electrode (anode of an EL element) made from a transparent conductive film. After forming a contact hole (opening) in the second interlayer insulating film 848 and in the first passivation film 847, the pixel electrode 849 is formed so as to be connected to the drain wiring 832 of the TFT 8203 for EL driving.

A third interlayer insulating film 850 is formed on the pixel electrode 849 from a silicon oxide film, a silicon oxynitride film, or an organic resin film, with a thickness of from 0.3 to 1 μm. The third interlayer insulating film 850 functions as a bank. An open portion is formed in the third interlayer insulating film 850 over the pixel electrode 849 by etching, and the edge of the open portion is etched so as to become a tapered shape. The taper angle may be set from 10 to 60°, (preferably between 30 and 50°). In particular, light emitting irregularities of the EL layer 851 due to a step in the pixel electrode 849 which develops in a contact hole portion can be prevented by forming the third interlayer insulating film 850 on portions in which the pixel electrode 849 and the drain wiring 832 of the TFT 8203 for EL driving are connected to each other.

An EL layer 851 is formed on the third interlayer insulating film 850. A single layer structure or a lamination structure can be used for the EL layer 851, but the lamination structure has a better light emitting efficiency. In general, a hole injecting layer, a hole transporting layer, a light emitting layer, and an electron transporting layer are formed in order on the pixel electrode, but a structure having a hole transporting layer, a light emitting layer, and an electron transporting layer, or a structure having a hole injecting layer, a hole transporting layer, a light emitting layer, an electron transporting layer, and an electron injecting layer may also be used. Any known structure may be used by the present invention, and doping of such as a fluorescing pigment into the EL layer may also be performed.

The structure of FIG. 14 is an example of a case of forming three types of EL elements corresponding to R, G, and B. Note that although only one pixel is shown in FIG. 14, pixels having an identical structure are formed corresponding to red, green and blue colors, respectively, and that color display can thus be performed. It is possible to implement the present invention without concern as to the light emitting method.

A cathode 852 of the EL element is formed on the EL layer 851. A material containing a low work coefficient material such as magnesium (Mg), lithium (Li), or calcium (Ca), is used as the cathode 852. Preferably, an electrode made from MgAg (a material made from Mg and Ag at a mixture of Mg:Ag=10:1) is used. In addition, a MgAgAl electrode, an LiAl electrode, and an LiFAl electrode can be given as other examples.

It is preferable to form the cathode 852 in succession, without exposure to the atmosphere, after forming the EL layer 851. This is because the interface state between the cathode 852 and the EL layer 851 greatly influences the light emitting efficiency of the EL element. Note that, throughout this specification, a light emitting element formed by a pixel electrode (anode), an EL layer, and a cathode is referred to as an EL element 8206.

The lamination body composed of the EL layer 851 and the cathode 852 must be formed separately for each pixel, but the EL layer 851 is extremely weak with respect to moisture, and consequently a normal photolithography technique cannot be used. It is therefore preferable to use a physical mask material such as a metal mask, and to selectively form the layers by a gas phase method such as vacuum evaporation, sputtering, or plasma CVD.

Note that it is also possible to use a method such as ink jet printing, screen printing or spin coating as the method of selectively forming the EL layer. However, the cathode cannot be formed in succession with these methods at present, and therefore it is preferable to use the other methods stated above.

Further, reference numeral 853 denotes a protective electrode, which protects the cathode 852 from external moisture, and at the same time is an electrode for connecting the cathodes 852 of each pixel. It is preferable to use a low resistance material containing aluminum (Al), copper (Cu), or silver (Ag) as the protective electrode 853. The protective electrode 853 can also be expected to have a heat radiating effect which relieves the amount of heat generated by the EL layer 851. Further, it is effective to form the protective electrode 853 in succession, without exposure to the atmosphere, after forming the EL layer 851 and the cathode 852.

Reference numeral 854 denotes a second passivation film, which may be formed with a film thickness of 10 nm to 1 μm (preferably between 200 and 500 nm). The aim of forming the second passivation film 854 is mainly for protecting the EL layer 851 from moisture, but it is also effective to give the second passivation film 854 a heat radiating effect. Note that the EL layer 851 is weak with respect to heat, as stated above, and therefore it is preferable to perform film formation at as low a temperature as possible (preferably within a temperature range from room temperature to 120° C.). Plasma CVD, sputtering, vacuum evaporation, ion plating, and solution coating (spin coating) can therefore be considered as preferable film formation methods.

Note that it goes without saying that the present invention is not limited to the structure of the EL display shown in FIG. 14, and the structure shown in FIG. 14 is merely one preferred embodiment for implementing the present invention.

Note that it is possible to implement Embodiment 7 in combination with Embodiments 1 to 5.

Embodiment 8

An example of manufacturing an EL display using the present invention will be described. Note that FIG. 15A is a top surface diagram of an EL display of the present invention, and FIG. 15B is a cross sectional diagram.

Figure 15A:
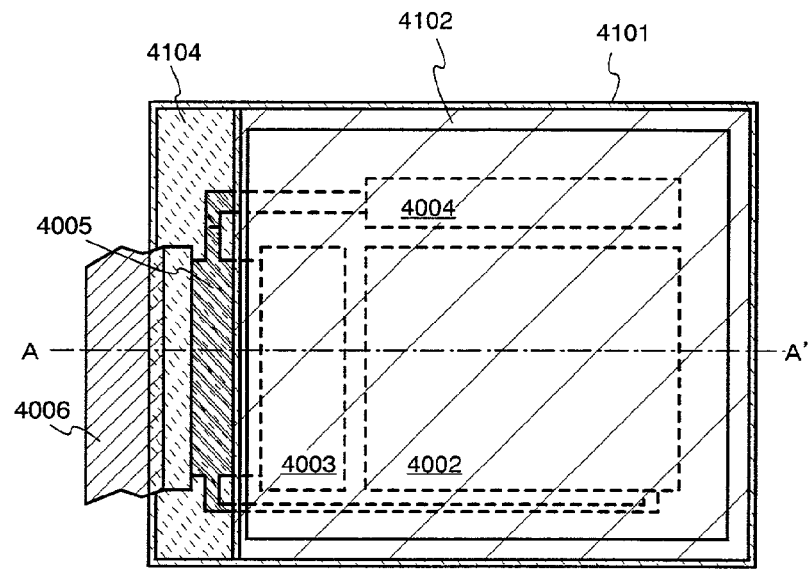
FIGS. 15A and 15B are a plan view and a sectional view, respectively, of an EL display according to the present invention.
Figure 15B:
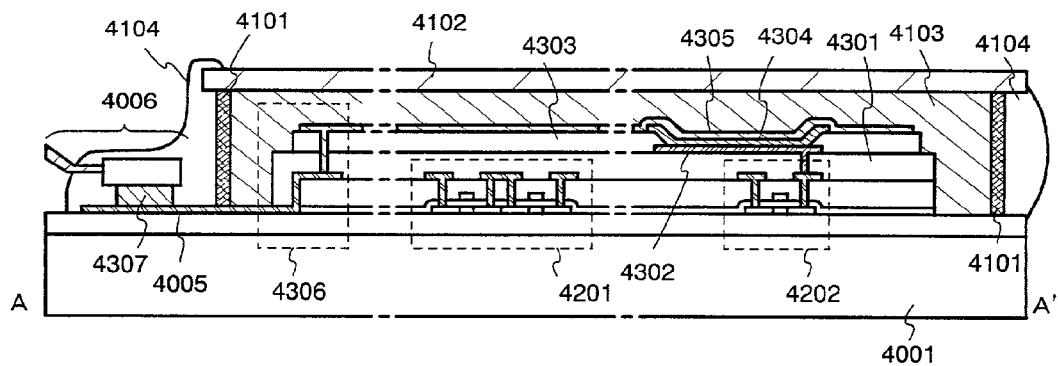

In FIGS. 15A and 15B, reference numeral 4001 denotes a substrate, reference numeral 4002 denotes a pixel portion, reference numeral 4003 denotes a source signal line driver circuit, 4004 denotes a gate signal line driver circuit. Each of the driver circuits is connected to an external equipment via a wiring 4005 leading to an FPC (flexible printed circuit) 4006.

A first sealing material 4101, a cover material 4102, a filler material 4103, and a second sealing material 4104 are formed at this point so as to surround the pixel portion 4002, the source signal line driver circuit 4003, and the gate signal line driver circuit 4004.

FIG. 15B is a cross sectional diagram corresponding to FIG. 15A cut along the line A–A'. A driver TFT 4201 (note that an n-channel TFT and a p-channel TFT are shown here) contained in the source signal line driver circuit 4003 on the substrate 4001, and a TFT 4202 for EL driving (a TFT for controlling the electric current flowing in an EL element) contained in the pixel portion 4002 are formed.

A p-channel TFT or an n-channel TFT manufactured by a known method is used in the driver TFT 4201 in Embodiment 8, and a p-channel TFT manufactured by a known method is used in the TFT 4202 for EL driving. Further, a capacitor connected to a gate of the TFT 4202 for EL driving is formed in the pixel portion 4002.

An interlayer insulating film (leveling film) 4301 is formed on the driver TFT 4201 and the TFT 4202 for EL driving from a resin material, and a pixel electrode (anode) 4302 which is electrically connected to a drain region of the TFT 4202 for EL driving is formed on the interlayer insulating film. A transparent conductive film having a large work coefficient is used as the pixel electrode 4302. A chemical compound of indium oxide and tin oxide, a chemical compound of indium oxide and zinc oxide, zinc oxide, tin oxide, and indium oxide can be used as the transparent conductive film. Further, galliume may also be doped into the above transparent conductive films.

An insulating film 4303 is then formed on the pixel electrode 4302, and an open portion is formed in the insulating film 4303 over the pixel electrode 4302. An EL (electroluminescence) layer 4304 is formed on the pixel electrode 4302 in the open portion. Known organic EL materials and known inorganic materials can be used for the EL layer 4304. Further, low molecular weight (monomer) materials and high molecular weight (polymer) materials exist as organic EL materials, and both may be used.

A known evaporation technique or a known application technique may be used as a method of forming the EL layer 4304. Further, the structure of the EL layer may be a lamination structure, or a single layer structure, in which hole injecting layers, hole transporting layers, light emitting layers, electron transporting layers, and electron injecting layers are freely combined.

A cathode 4305 composed of a conducting film having light shielding properties (typically a conductive film having aluminum, copper, or silver as its main constituent, or a lamination film of these and another conducting film) is formed on the EL layer 4304. Furthermore, it is preferable to remove, as much as possible, moisture and oxygen existing in the interface between the cathode 4305 and the EL element 4304. It is therefore necessary to employ a scheme such as forming both films in succession within a vacuum, or one in which the EL layer 4304 is formed in a nitrogen or inert gas environment, and then the cathode 4305 is formed without exposure to oxygen or moisture. It is possible to perform the above stated film formation in Embodiment 8 by using a multi-chamber method (cluster tool method) film formation apparatus.

The cathode 4305 is then electrically connected to the wiring 4005 in a region shown by reference numeral 4306. The wiring 4005 is a wiring for imparting a predetermined voltage to the cathode 4305, and the wiring 4005 is electrically connected to the FPC 4006 through an anisotropic conductive film 4307.

An EL element composed of the pixel electrode (anode) 4302, the EL layer 4304, and the cathode 4305 is thus formed. The EL element is surrounded by the first sealing material 4101, and by the cover material 4102 which is joined to the substrate 4001 by the first sealing material 4101, and is enclosed by the filler material 4103. Further, a glass material, a metallic material (typically a stainless steel material), a ceramic material, and a plastic material (including plastic films) can be used as the cover material 4102. An FRP (fiberglass reinforced plastics) plate, a PVF (polyvinyl fluoride) film, a mylar film, a polyester film, and an acrylic resin film can be used as the plastic material. Further, a sheet having a structure in which aluminum foil is sandwiched by a PVF film or a mylar film can also be used.

Note that, it is necessary for the cover material to be transparent for cases in which the irradiating direction of light from the EL elements is toward the cover material side. A transparent material such as a glass plate, a plastic plate, a polyester film, or an acrylic film, is used in this case.

Further, an ultraviolet hardening resin or a thermally hardening resin can be used as the filler material 4103. PVC (polyvinyl chloride), acrylic, polyimide, epoxy resin, silicon resin, PVB (polyvinyl butyral) and EVA (ethylene vinyl acetate) can be used. Deterioration of the EL elements can be suppressed if a drying agent (preferably barium oxide) or an oxidation preventing agent having an oxygen capturing effect is formed on the inside of the filler material 4103.

Furthermore, spacers may also be included within the filler material 4103. It is possible to give the spacers themselves moisture absorbency by forming the spacers from barium oxide. Further, when forming spacers, it is also effective to form a resin film on the cathode 4305 as a buffer layer for relieving pressure from the spacers.

The wiring 4005 is electrically connected to the FPC 4006 through the anisotropic conductive film 4307. The wiring 4005 transmits signals sent from the pixel portion 4002, the source signal line driver circuit 4003, and the gate signal line driver circuit 4004 to the FPC 4006, and the wiring is electrically connected to external equipment by the FPC 4006.

Further, the second sealing material 4104 is formed so as to cover exposed portions of the first sealing material 4101 and a portion of the FPC 4006, resulting in a structure in which the EL elements are completely cutoff from the atmosphere. This becomes the EL display having the cross sectional structure of FIG. 15B. Note that it is possible to implement Embodiment 8 in combination with Embodiments 1 to 7.

Embodiment 9

In Embodiment 9, a detailed structure of the source signal line driver circuit 102 shown in FIG. 10 will be described.

Figure 16:
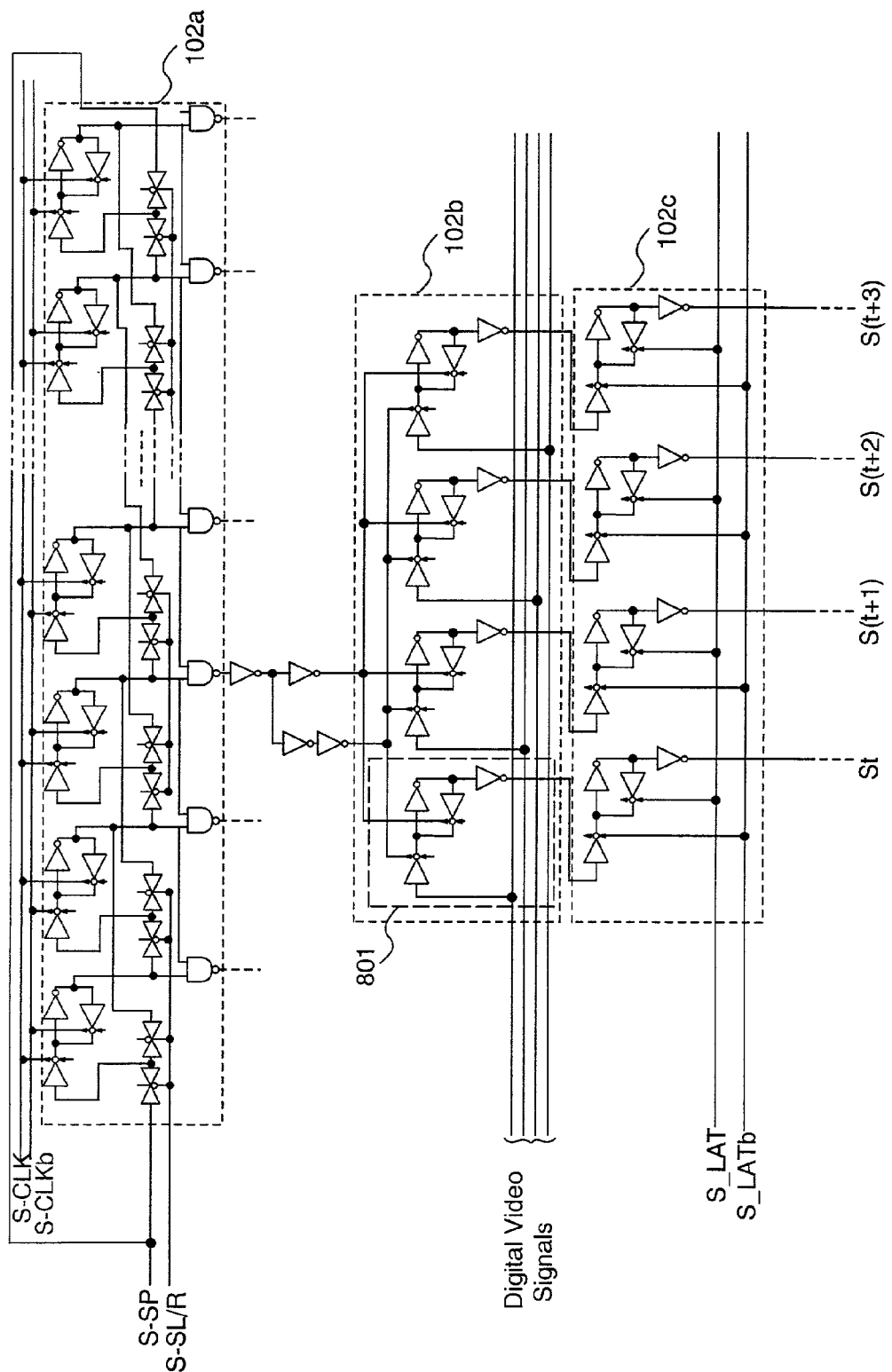
FIG. 16 is a circuit diagram of a source signal line driver circuit of the EL display according to the present invention.

A shift register 102a, a latch (A) 102b and latch (B) 102c are placed as shown in FIG. 16. In Embodiment 9, a series of latch (A) 102b and a series of latch (B) 102c correspond to four source signal lines St through S(t+3). Although not provided in this embodiment, the designers may appropriately provide a level shift for varying a width of amplification of a voltage of a signal. A clock signal for sources (S-CLK), a clock signal for inverted sources (S-CLKb) having an inverted polarity of the (S-CLK), a start pulse signal for sources (S-SP), and a driving direction switching signal for sources (S-SL/R) are respectively input to the shift register 102a through wirings shown in the figure. A digital video signal inputted externally is inputted to the latch (A) 102b through a wiring shown in the figure. A latch signal S_LAT and a signal S_LATb having an inverted polarity of the latch signal S_LAT are respectively input to the latch (B) 102c through wirings shown in the figure. For a detailed structure of the latch (A) 102b, a part 801 of the latch (A) 102b corresponding to the source signal line St (where t is an arbitrary number from 1 to (x−3)) is described by way of example. The part 801 of the latch (A) 102b includes two clocked inverters and two inverters.

Figure 17:
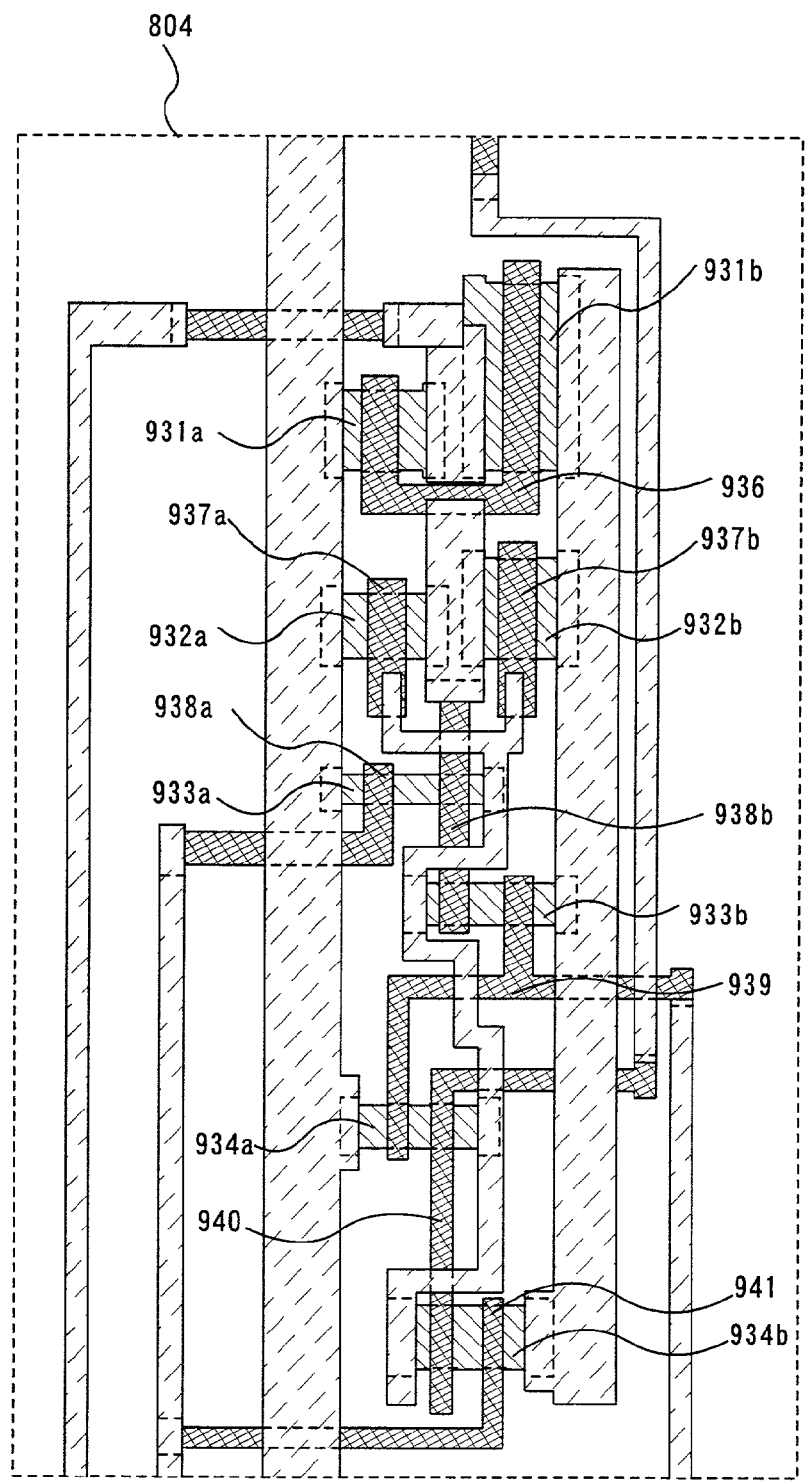
FIG. 17 is a plan view of a latch of the source signal line driver circuit of the EL display according to the present invention.

FIG. 17 shows a top view of the part 801 of the latch (A) 102b. Reference numerals 931a and 931b are active layers of TFTs forming one of the inverters included in the part 801 of the latch (A) 102b, respectively. 936 is a gate electrode common to the TFTs forming one of the inverters. Reference numerals 932a and 932b are active layers of TFTs forming the other one of the inverters included in the part 801 of the latch (A) 102b, respectively. 937a and 937b are gate electrodes respectively provided on the active layers 932a and 932b. Further, the gate electrodes 937a and 937b are electrically connected with each other.

Reference numerals 933a and 933b are respectively active layers of TFTs forming one of the clocked inverters included in the part 801 of the latch (A) 102b. Gate electrodes 938a and 938b are provided on the active layer 933a to provide a double-gate structure. In the same manner, gate electrodes 938b and 939 are provided on the active layer 933b to provide a double-gate structure.

Reference numerals 934a and 934b are respectively active layers of TFTs forming the other one of the clocked inverters included in the part 801 of the latch (A) 102b. Gate electrodes 939 and 940 are provided on the active layer 934a to provide a double-gate structure. In the same manner, gate electrodes 940 and 941 are provided on the active layer 934b to provide a double-gate structure.

Note that it is possible to implement Embodiment 9 in combination with Embodiments 1 to 8.

Embodiment 10

In the present embodiment, the detailed structure of the gate signal line driver circuit 103 illustrated in FIG. 10 is described.

Figure 18:
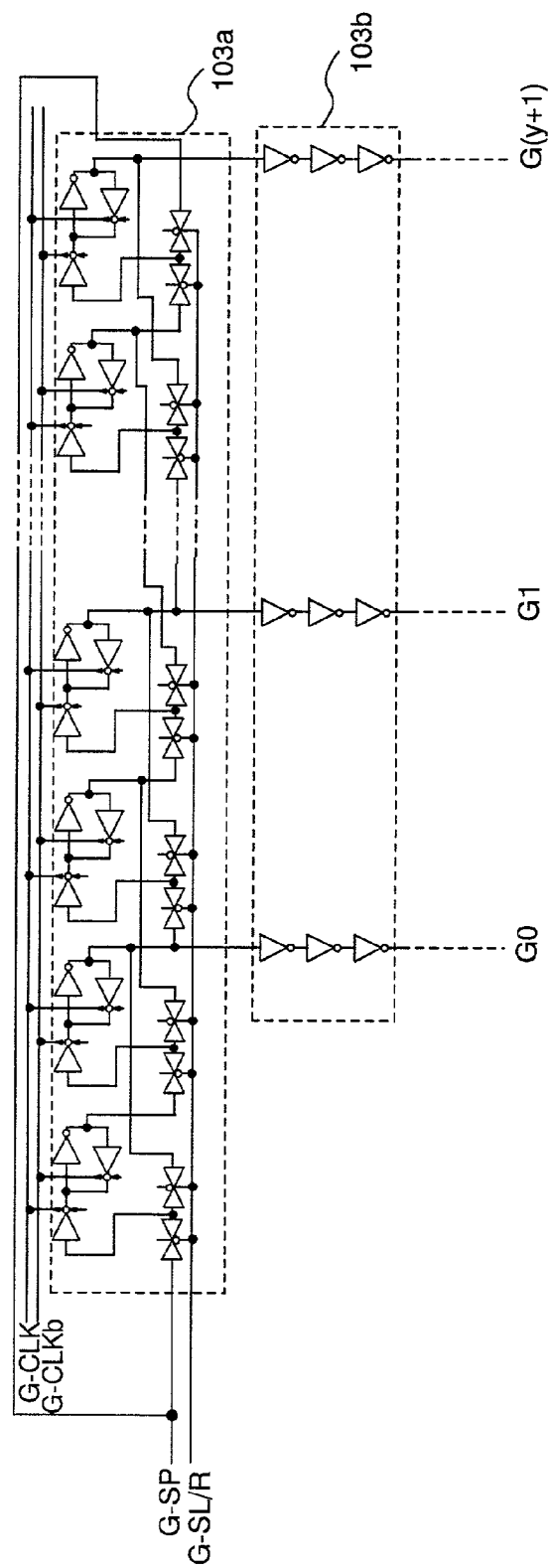
FIG. 18 is a circuit diagram of a gate signal line driver circuit of the EL display according to the present invention.

The shift register 103a and the buffers 103b are arranged as illustrated in FIG. 18. It is to be noted that, in the present embodiment, a buffer 103b is structured to have three inverters for one gate signal line. However, the number of the inverters is not limited thereto. Further, though no level shift for changing the amplitude of voltage of a signal is not provided in the present embodiment, a designer of the circuit may appropriately provide such a level shift.

The clock signal for the gates G-CLK, a clock signal for inverting gates G-CLKb where the polarity of G-CLK is inverted, the start pulse signal for the gates G-SP, and a drive direction switch signal for the gates G-SL/R are inputted to the shift register 103a through corresponding wirings illustrated in the figure, respectively.

The structure of the present embodiment can be implemented in combination with Embodiments 1 to 9.

Embodiment 11

In the EL display according to the present invention, the material used as the EL layer of the EL elements is not limited to an organic EL material, and an inorganic EL material may also be used. However, since presently available inorganic EL materials have a very high driving voltage, TFTs with a resistance property which can withstand such driving voltage have to be used.

Or, when an inorganic EL material having a lower driving voltage is developed in the future, it can be applied to the present invention.

The structure of the present embodiment can be implemented in combination with Embodiments 1 to 10.

Embodiment 12

In the present invention, an organic material used as an EL layer may be either a low molecular weight organic material or a polymer (high molecular) organic material. As the low molecular weight organic material, materials are known centering on $Alq_3$ (tris-8-quinolylite-aluminum), TPD (triphenylamine derivative) or the like. As polymer type organic material, π-cooperative polymer materials can be given. Typically, PPV (polyphenylenevynilene), PVK (polyvynilcarbazole), polycarbonate or the like can be given.

The polymer (high molecular) organic material can be formed with a simple thin film formation method such as the spin coating method (which is referred to also as solution application method), the dipping method, the dispense method, the printing method, the ink jet method or the like. The polymer organic material has a high heat resistance compared with the low molecular weight organic material.

Furthermore, in the case where the EL layer incorporated in the EL element of the EL display according to the present invention has an electron transport layer and a positive hole transport layer, the electron transport layer and the positive hole transport layer may be formed of an inorganic material such as, for example, an amorphous semiconductor formed of amorphous Si or amorphous $Si_{1-x}C_x$ or the like.

In the amorphous semiconductor, a large quantity of trap level is present, and at the same time, the amorphous semiconductor forms a large quantity of interface levels at an interface at which the amorphous semiconductor contacts other layers. As a consequence, the EL element can emit light at a low voltage, and at the same time, an attempt can be made to provide a high luminance.

Besides, a dopant (impurity) is added to the organic EL layer, and the color of light emission of the organic EL layer may be changed. These dopant includes DCM1, nile red, rubren, coumarin 6, TPB and quinaquelidon.

The structure of the present embodiment can be implemented in combination with Embodiments 1 to 11.

Embodiment 13

In the present embodiment, preferable voltage-current characteristics of a region where the TFT for EL driving is driven when the driving method of an EL display according to the present invention is used is described with reference to FIGS. 19 to 20.

In an EL element, if voltage applied to the EL element varies even slightly, current passing through the EL element exponentially changes accordingly. From a different point of view, it can be said that, even the current flowing through the EL element varies, the voltage applied to the EL element does not change so much. By the way, the brightness of the EL element is increased almost in proportion to the current flowing through the EL element. Therefore, compared with a method where the brightness of the EL element is controlled through control of the voltage applied to the EL element, a method where the brightness of the EL element is controlled through control of the current through the EL element is less liable to be influenced by the characteristics of the TFT, and therefore the brightness of the EL element can be controlled more easily with such a method.

Figure 19A:
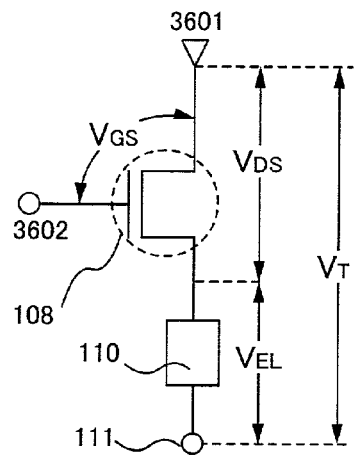
FIG. 19A illustrates a structure of a connection between an EL element and a TFT for EL driving.

Reference is made to FIG. 19. FIG. 19A illustrates only the components of the TFT 108 for EL driving and of the EL element 110 in the pixel of the EL display of this invention shown in FIG. 3.

Figure 19B:
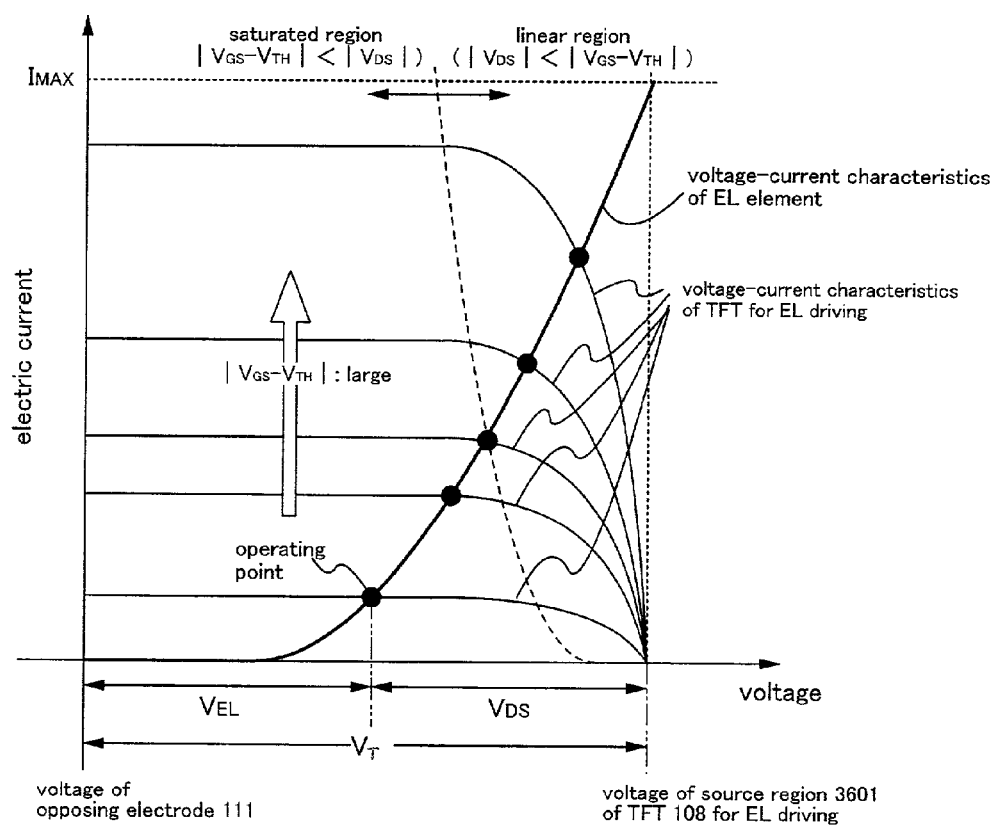
FIG. 19B illustrates the voltage-current characteristics of the EL element and of the TFT for EL driving.

FIG. 19B illustrates voltage-current characteristics of the TFT 108 for EL driving and of the EL element 110 illustrated in FIG. 19A. It is to be noted that the graph of the voltage-current characteristics of the TFT 108 for EL driving illustrated in FIG. 19B shows voltage $V_{DS}$ between the source region and the drain region versus current flowing through the drain region of the TFT 108 for EL driving. FIG. 19B shows a plurality of graphs having different values of voltage $V_{GS}$ between the source region and the gate electrode of the TFT 108 for EL driving.

As illustrated in FIG. 19A, the voltage between the pixel electrode of the EL element 110 and an opposing electrode 111 is denoted as $V_{EL}$, and the voltage between a terminal 3601 connected to a power supply line and the opposing electrode 111 of the EL element 110 is denoted as $V_T$. It is to be noted that the value of $V_T$ is determined by the potential of the power supply line. Further, the voltage between the source region and the drain region of the TFT 108 for EL driving is denoted as $V_{DS}$, and the voltage between a wiring 3602 connected to the gate electrode of the TFT 108 for EL driving and the source region of the gate electrode of the TFT 108 for EL driving, that is, the voltage between the gate electrode and the source region of the TFT 108 for EL driving, is denoted as $V_{GS}$.

The TFT 108 for EL driving may be an n-channel TFT or a p-channel TFT.

Further, the TFT 108 for EL driving and the EL element 110 are connected in series. Therefore, the amount of current flowing through the TFT 108 for EL driving and the amount of current flowing through the EL element 110 are the same. Accordingly, the TFT 108 for EL driving and the EL element 110 illustrated in FIG. 19A are driven at an intersection (an operation point) of the graph illustrating the voltage-current characteristics of the TFT 108 for EL driving and the graph illustrating the voltage-current characteristics of the EL element 110. In FIG. 19B, $V_{EL}$ is the voltage between the potential of the opposing electrode 111 and the potential at the operation point. $V_{DS}$ is voltage between the potential at the terminal 3601 of the TFT 108 for EL driving and the potential at the operation point. Therefore, $V_T$ is equal to the sum of $V_{EL}$ and $V_{DS}$.

Here, a case where $V_{GS}$ is changed is examined. As can be seen from FIG. 19B, as $|V_{GS}-V_{TH}|$ of the TFT 108 for EL driving becomes larger, in other words as $|V_{GS}|$ becomes larger, the amount of current flowing through the TFT 108 for EL driving becomes larger. It is to be noted that $V_{TH}$ is a threshold voltage of the TFT 108 for EL driving. Therefore, as can be seen from FIG. 19B, as $|V_{GS}|$ becomes larger, the amount of current through the EL element 110 at the operation point becomes larger as a matter of course. The brightness of the EL element 110 becomes higher in proportion to the amount of current flowing through the EL element 110.

When the amount of current flowing through the EL element 110 becomes larger as $|V_{GS}|$ becomes larger, the value of $V_{EL}$ also becomes larger according to the amount of current. Since $V_T$ is determined by the potential of the power supply line, when $V_{EL}$ becomes larger, $V_{DS}$ becomes smaller accordingly.

Further, as illustrated in FIG. 19B, the voltage-current characteristics of the TFT 108 for EL driving can be divided into two regions by the values of $V_{GS}$ and $V_{DS}$. A region where $|V_{GS}-V_{TH}|<|V_{DS}|$ is a saturated region, while a region where $|V_{GS}-V_{TH}|>|V_{DS}|$ is a linear region.

In the saturated region, $$I_{DS}=\beta(V_{GS}-V_{TH})^2/2 \quad (1)$$

wherein $I_{DS}$ is the amount of current flowing through a channel forming region of the TFT 108 for EL driving, $\beta=\mu C_0 W/L$, $\mu$ is the mobility of the TFT 108 for EL driving, $C_0$ is the gate capacitance per unit area, and W/L is the ratio of the channel width W to the channel length L of the channel forming region.

In the linear region, $$I_{DS}=\beta\{(V_{GS}-V_{TH})V_{DS}-V_{DS}^2/2\} \quad (2)$$

As can be seen from Eq. (1), in the saturated region, the amount of current almost does not change depending on $V_{DS}$, and is determined only by $V_{GS}$.

On the other hand, as can be seen from Eq. (2), in the linear region, the amount of current is determined by $V_{DS}$ and $V_{GS}$. As $|V_{GS}|$ becomes larger, the TFT 108 for EL driving starts to operate in the linear region. In addition, $V_{EL}$ gradually becomes larger accordingly, and thus $V_{DS}$ becomes smaller accordingly. In the linear region, as $V_{DS}$ becomes smaller, the amount of current becomes smaller accordingly. Therefore, even if $|V_{GS}|$ becomes larger, it is difficult to increase the amount of current. When $|V_{GS}|=\infty$, the amount of current becomes $I_{MAX}$. In other words, no matter how large $|V_{GS}|$ becomes, current which passes can not exceed $I_{MAX}$. Here, $I_{MAX}$ is the amount of current through the EL element 110 when $V_{EL}=V_T$.

In this way, by controlling $|V_{GS}|$, the operation point can be moved into the saturated region or into the linear region.

By the way, it is desirable that all the TFTs 108 for EL driving of all the pixels ideally have the same characteristics. However, actually, it is often the case that the threshold $V_{TH}$ and the mobility $\mu$ differ among the respective TFTs 108 for EL driving. When the threshold $V_{TH}$ and the mobility $\mu$ differ among the respective TFTs 108 for EL driving, as can be seen from Eqs. (1) and (2), even if $V_{GS}$ is the same, the amount of current flowing through the channel forming region differs among the TFTs 108 for EL driving.

Figure 20:
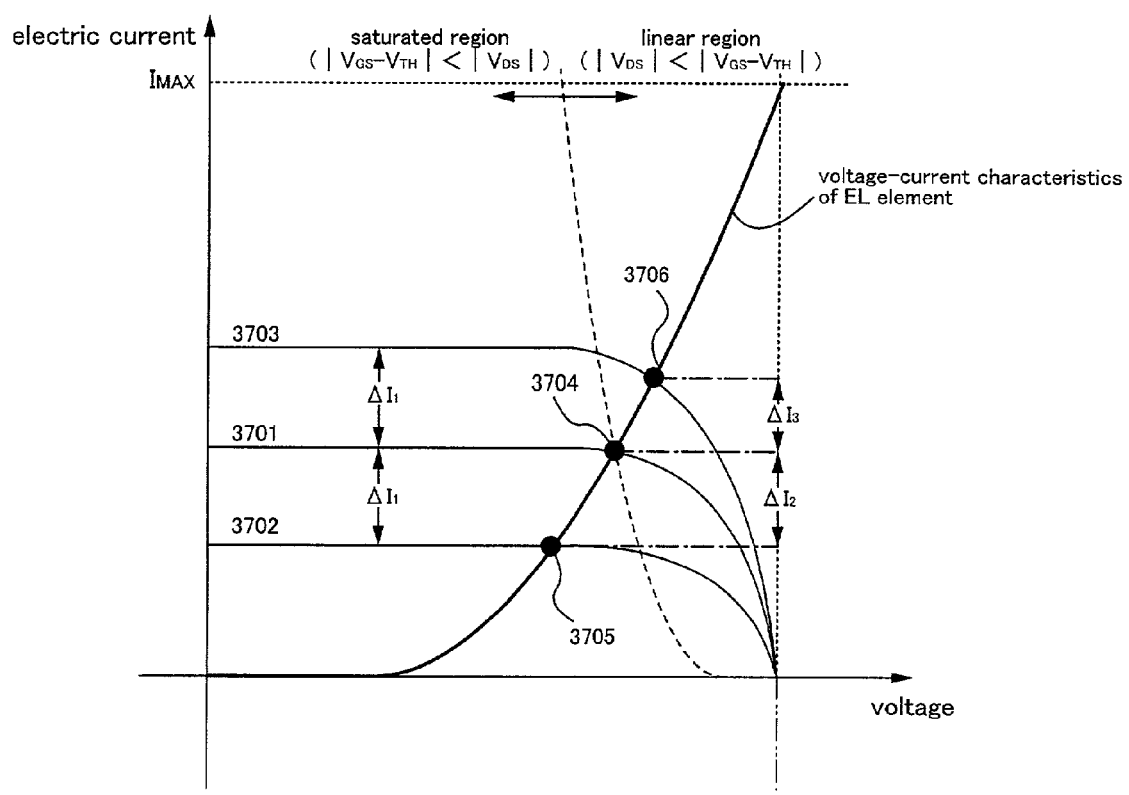
FIG. 20 illustrates voltage-current characteristics of an EL element and of a TFT for EL driving.

FIG. 20 illustrates current-voltage characteristics of the TFT 108 for EL driving where there is a shift in the threshold $V_{TH}$ and the mobility $\mu$. A solid line 3701 illustrates ideal current-voltage characteristics, and solid lines 3702 and 3703 illustrate current-voltage characteristics of the TFT for EL driving where the threshold $V_{TH}$ and the mobility $\mu$ differ from the ideal values. Suppose that, in the saturated region, each of the graphs 3702 and 3703 of the current-voltage characteristics shifts from the ideal graph 3701 of the current-voltage characteristics by the same amount of current $\Delta I_1$, and an operation point 3705 of the graph 3702 of the current-voltage characteristics is in the saturated region while an operation point 3706 of the graph 3703 of the current-voltage characteristics is in the linear region. In this case, when shifts in the amount of current at the operation points 3705 and 3706 from the operation point 3704 of the graph 3701 of the ideal current-voltage characteristics are expressed as $\Delta I_2$ and $\Delta I_3$, respectively, $\Delta I_3$ is smaller than $\Delta I_2$.

Accordingly, in the case where a digital driving method according to the present invention is used, by driving the TFTs for EL driving and the EL elements such that the operation points exist in the linear region, gradation display can be carried out suppressing unevenness in the brightness of the EL elements caused due to shifts in the characteristics of the TFTs for EL driving.

With regard to a case of a conventional analog driving, it is preferable to drive the TFTs for EL driving and the EL elements such that the operation points exist in the saturated region where the amount of current can be controlled by only $|V_{GS}|$.

Figure 21:
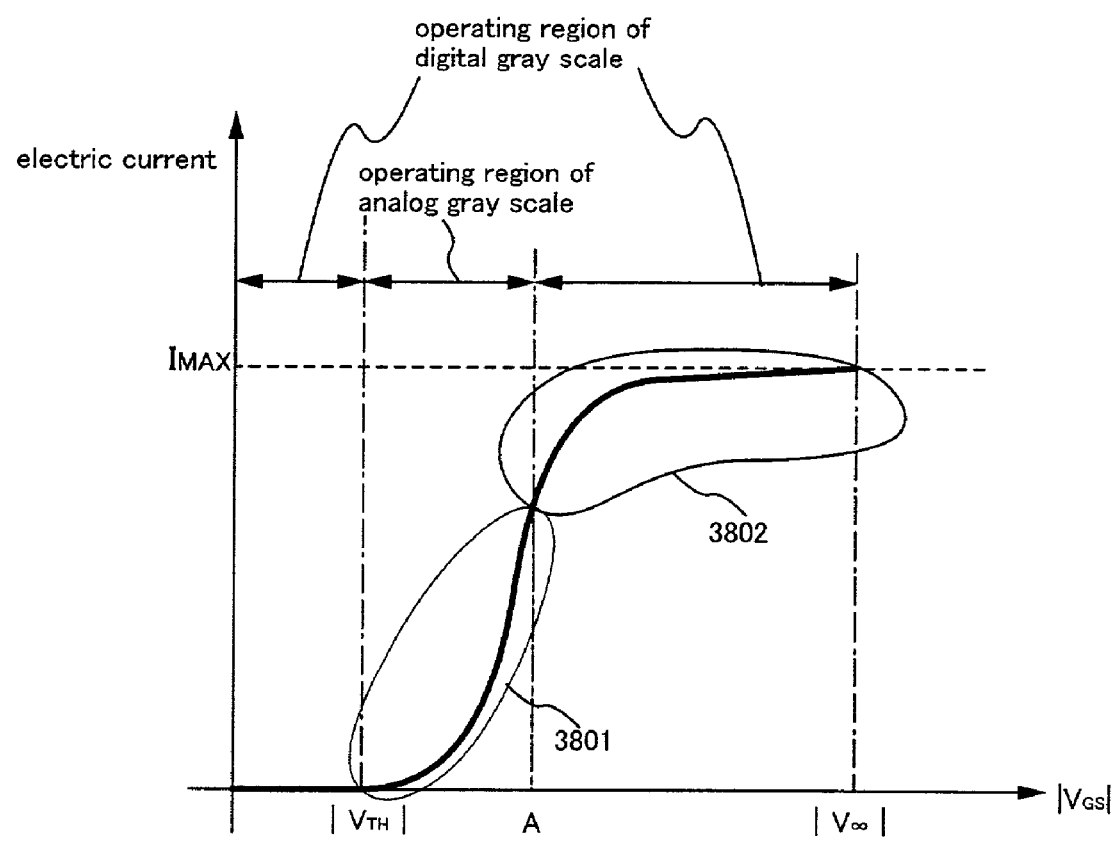
FIG. 21 illustrates relationship between gate voltage and drain current of a TFT for EL driving.

As a summary of the above analysis of the operation, FIG. 21 illustrates a graph of the gate voltage $|V_{GS}|$ of the TFT for EL driving versus the amount of current. When $|V_{GS}|$ becomes larger and at last becomes larger than the absolute value $|V_{TH}|$ of the threshold voltage of the TFT for EL driving, the TFT for EL driving becomes a conductive state to pass current therethrough. $|V_{GS}|$ at that time is herein referred to as "lighting start voltage". When $|V_{GS}|$ becomes still larger, $|V_{GS}|$ reaches a value where $|V_{GS}-V_{TH}|=|V_{DS}|$ (let A denote the value), and the graph goes from a saturated region 3801 into a linear region 3802. When $|V_{GS}|$ becomes still larger and the amount of current becomes larger accordingly, the amount of current is at last saturated, where $|V_{GS}|=\infty$.

As can be seen from FIG. 21, in a region where $|V_{GS}| \leq |V_{TH}|$, almost no current passes. A region where $|V_{TH} \leq |VGS}| \leq A$ is a saturated region, where the amount of current changes according to $|V_{GS}|$. A region where $A \leq |V_{GS}|$ is a linear region, where the amount of current flowing through the EL element changes according to $|V_{GS}|$ and $|V_{DS}|$.

In the digital driving according to the present invention, it is preferable to use the region where $|V_{GS}| \leq V_{TH}|$ and the linear region where $A \leq |V_{GS}|$.

It is to be noted that the present embodiment can be implemented in combination with Embodiments 1–12.

Embodiment 14

In this invention, an external light emitting quantum efficiency can be remarkably improved by using an EL material by which phosphorescence from a triplet exciton can be employed for emitting alight. As a result, the power consumption of the EL element can be reduced, the lifetime of the EL element can be elongated and the weight of the EL element can be lightened.

The following is a report where the external light emitting quantum efficiency is improved by using the triplet exciton (T. Tsutsui, C. Adachi, S. Saito, Photochemical processes in Organized Molecular Systems, ed. K. Honda, (Elsevier Sci. Pub., Tokyo, 1991) p. 437).

The molecular formula of an EL material (coumarin pigment) reported by the above article is represented as follows.

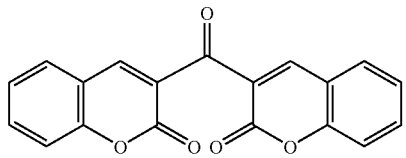

(M. A. Baldo, D. F. O'Brien, Y. You, A. Shoustikov, S. Sibley, M. E. Thompson, S. R. Forrest, Nature 395 (1998) p. 151)

The molecular formula of an EL material (Pt complex) reported by the above article is represented as follows.

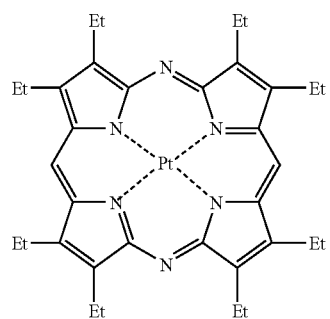

(M. A. Baldo, S. Lamansky, P. E. Burrows, M. E. Thompson, S. R. Forrest, Appl. Phys. Lett., 75 (1999) p. 4.) (T. Tsutsui, M. -J. Yang, M. Yahiro, K. Nakamura, T. Watanabe, T. tsuji, Y. Fukuda, T. Wakimoto, S. Mayaguchi, Jpn, Appl. Phys., 38 (12B) (1999) L1502.)

The molecular formula of an EL material (Ir complex) reported by the above article is represented as follows.

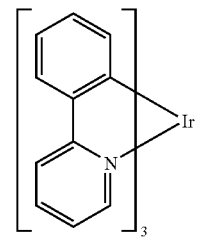

As described above, if phosphorescence from a triplet exciton can be put to practical use, it can realize the external light emitting quantum efficiency three to four times as high as that in the case of using fluorescence from a singlet exciton in principle.

The structure according to this embodiment can be freely implemented in combination of any structures of Embodiments 1 to 13.

Embodiment 15

In the present embodiment, a case where a connector such as an FPC or a TAB is connected to the display panel according to the present invention to actually finish a shippable product is described.

Figure 22:
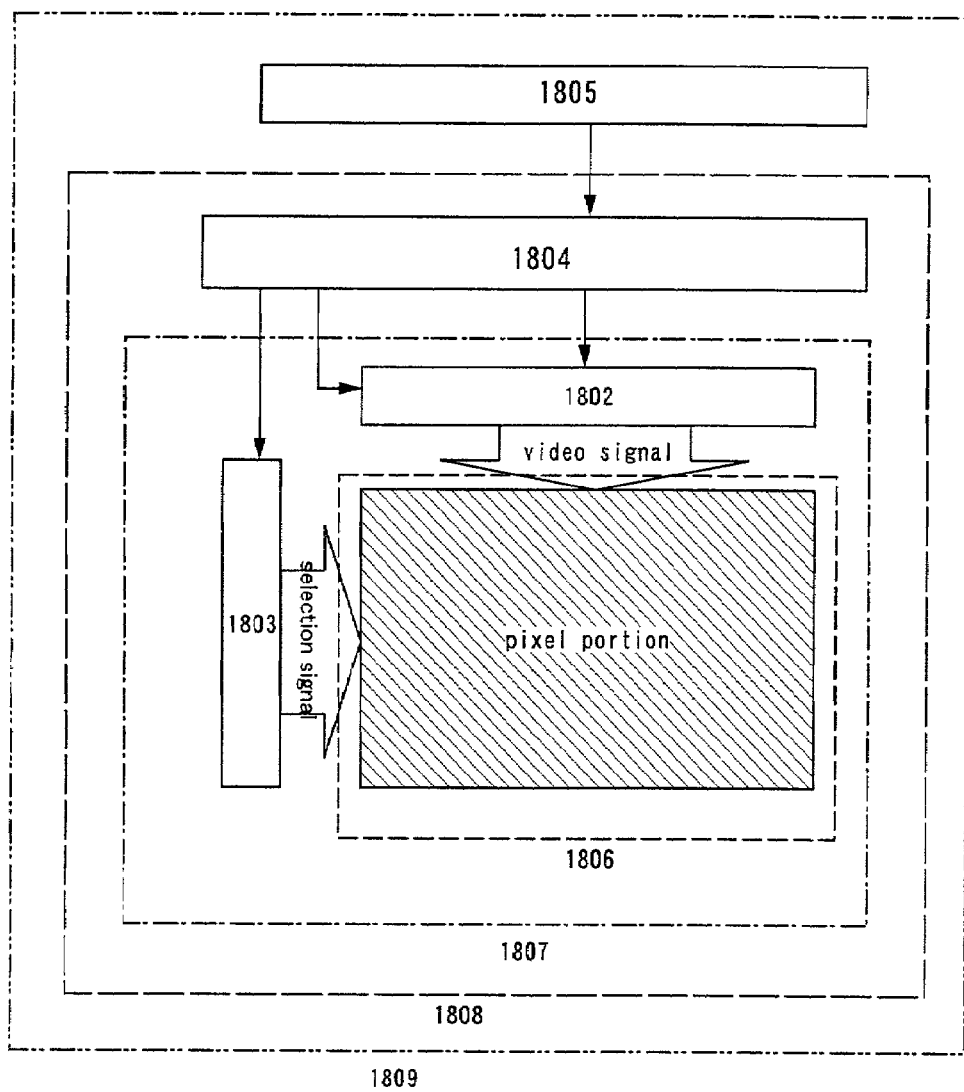
FIG. 22 is a block diagram of a display according to the present invention.

In FIG. 22, a plurality of pixels are provided in a pixel portion 1801. A module having the pixel portion 1801 and a connector for connecting wirings of the pixel portion 1801 to the external is herein referred to as a display panel 1806.

Reference numerals 1802 and 1803 denote a source signal line driver circuit and a gate signal line driver circuit, respectively. The number of the source signal line driver circuit(s) 1802 and the number of the gate signal line driver circuit(s) 1803 may be arbitrary.

A module having a driver circuit formed of the source signal line driver circuit 1802 and the gate signal line driver circuit 1803, the pixel portion 1801, and the connector for connecting the wiring of the pixel portion 1801 and wirings of the driver circuit to the external is herein referred to as a display panel 1807 with the driver circuit. The display panel 1807 with the driver circuit is the display panel 1806 provided with the driver circuit.

With regard to the display panel 1807 with the driver circuit, there are two cases: a case where the driver circuit and the pixel portion 1801 are provided on different substrates and are connected to each other through a connector such as an FPC or a TAB; and a case where the driver circuit and the pixel portion 1801 are provided on one substrate. The former is herein referred to as a display panel with an external type driver circuit, while the latter is herein referred to as a display panel with an integral type driver circuit.

Figure 23A:
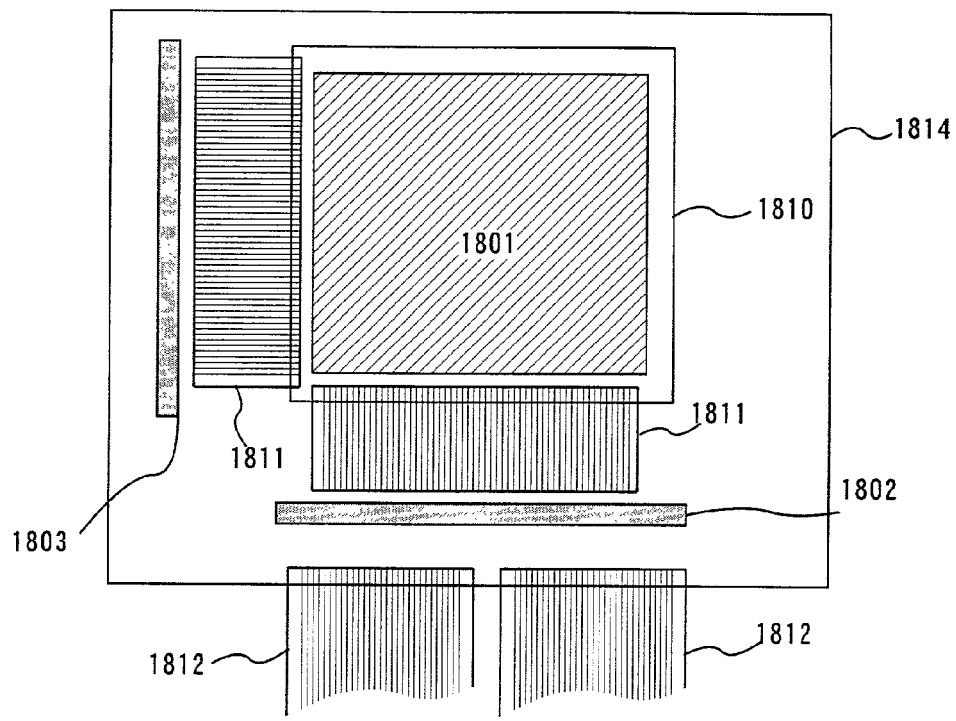
FIGS. 23A and 23B are plan views of a display with a driver circuit as a display according to the present invention.

FIG. 23A is a plan view of the display panel with the external type driver circuit. The pixel portion 1801 is provided on a substrate 1810. The wirings of the pixel portion 1801 are connected through an FPC 1811 to the source signal line driver circuit 1802 and to the gate signal line driver circuit 1803, both of which are provided on a substrate 1814 for external provision. The source signal driver circuit 1802, the gate signal line driver circuit 1803, and the wirings of the pixel portion 1801 are connected to the external through the FPC 1811 for connection to the external.

It is to be noted that, though in FIG. 23A, a case where the substrate 1810 having the pixel portion 1801 provided thereon is provided on the substrate 1814 for external provision is described, the present embodiment is not limited thereto. It is not necessary that the substrate 1801 is provided on the substrate 1814 for external provision.

Figure 23B:
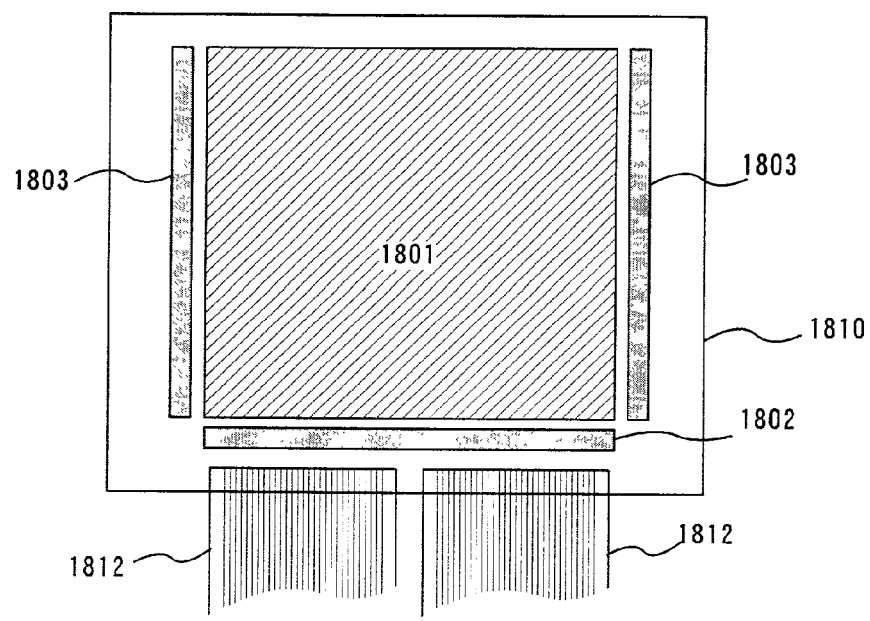

FIG. 23B is a plan view of the display panel with the integral type driver circuit. The pixel portion 1801, the source signal line driver circuit 1802, and the gate signal line driver circuits 1803 are provided on the substrate 1810. The wirings of the pixel portion 1801, of the source signal line driver circuit 1802, and of the gate signal line driver circuits 1803 are connected to the external through an FPC 1812 for connection to the external.

It is to be noted that, in FIG. 23, the number of the source signal line driver circuit 1802 and the number of the gate signal line driver circuits 1803 are not limited thereto, and the numbers can be appropriately selected by the designer.

In FIG. 22, a controller 1804 has a function to drive the driver circuit and to make the pixel portion 1801 display an image. For example, it has a function to input to the source signal line driver circuit 1802 a signal with image information inputted from the external, a function to generate a signal for driving the driver circuit (for example, a clock signal (CLK), or a start pulse signal (SP)), and a function as a power source for supplying voltage or current to the driver circuit and the pixel portion 1801.

A module having the driver circuit (the source signal line driver circuit 1802 and the gate signal line driver circuit 1803), the pixel portion 1801, the controller 1804, and the connector for connecting the wiring of the pixel portion 1801, wirings of the driver circuit, and wiring of the controller 1804 to the external is herein referred to as a display panel 1808 with the controller and the driver circuit. The display panel 1808 with the controller and the driver circuit is the display panel 1806 provided with the driver circuit and the controller 1804.

A microcomputer 1805 controls driving of the controller 1804. A module having the microcomputer 1805, the driver circuit, the pixel portion 1801, the controller 1804, and the connector for connecting the wiring of the pixel portion 1801, wirings of the driver circuit, and the wiring of the controller 1804 to the external is herein referred to as a display panel 1809 with the microcomputer, the controller, and the driver circuit. The display panel 1809 with the microcomputer, the controller, and the driver circuit is the display panel 1806 provided with the driver circuit and the controller 1804, and the microcomputer 1805.

It is to be noted that, actually, a product is shipped in the form of the display panel 1806, the display panel 1807 with the driver circuit, the display panel 1808 with the controller and the driver circuit, or the display panel 1809 with the microcomputer, the controller, and the driver circuit. Any one of the display panel 1806, the display panel 1807 with the driver circuit, the display panel 1808 with the controller and the driver circuit, or the display panel 1809 with the microcomputer, the controller, and the driver circuit is herein referred to as a module (a display). The EL display according to the present invention is one of such displays.

Embodiment 16

An EL display which is an application of the display of the present invention has superior visibility in bright locations because it is of a self-luminous type, and moreover viewing angle is wide. Accordingly, it can be used as a display portion for various electronic apparatuses. For example, it is appropriate to use the display of the present invention as a display portion of an EL display having a diagonal equal to 30 inches or greater (typically equal to 40 inches or greater) for appreciation of TV broadcasts by a large screen.

Note that all displays exhibiting (displaying) information such as a personal computer display, a TV broadcast reception display, or an advertisement display are included as the EL display. Further, the display of the present invention can be used as a display portion of the other various electronic apparatuses.

The following can be given as examples of such electronic apparatuses: a video camera; a digital camera; a goggle type display (head mounted display); a car navigation system; an audio reproducing device (such as a car audio system, an audio compo system); a notebook personal computer; a game equipment; a portable information terminal (such as a mobile computer, a mobile telephone, a mobile game equipment or an electronic book); and an image playback device provided with a recording medium (specifically, a device which performs playback of a recording medium and is provided with a display which can display those images, such as a digital video disk (DVD)). In particular, because portable information terminals are often viewed from a diagonal direction, the wideness of the field of vision is regarded as very important. Thus, it is preferable that the OLED display device is employed. Examples of these electronic apparatuses are shown in FIGS. 24 and 25.

Figure 24A:
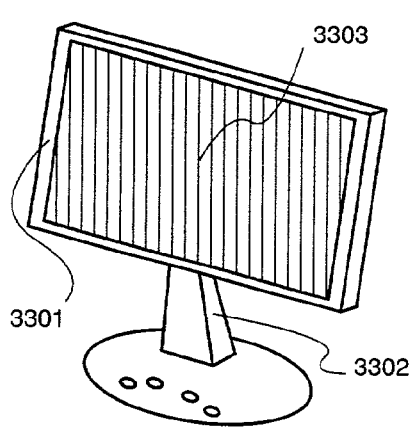
FIGS. 24A–24F illustrate electronic apparatus using the EL display according to the present invention.

FIG. 24A illustrates an EL monitor which includes a frame 3301, a support table 3302, a display portion 3303, or the like. The present invention can be used as the display portion 3303. The display in accordance with the present invention can be used as the display portion 3303.

Figure 24B:
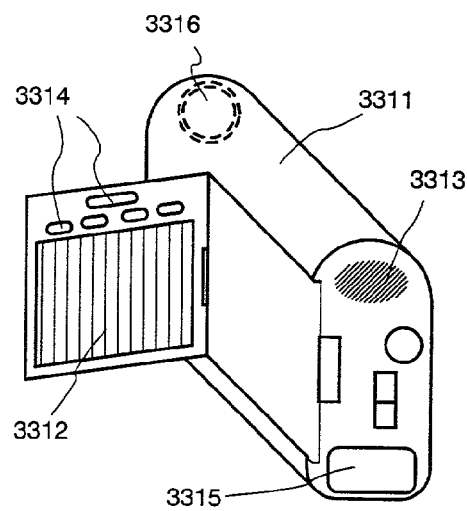

FIG. 24B illustrates a video camera which includes a main body 3311, a display portion 3312, an audio input portion 3313, operation switches 3314, a battery 3315, an image receiving portion 3316, or the like. The display in accordance with the present invention can be used as the display portion 3312.

Figure 24C:
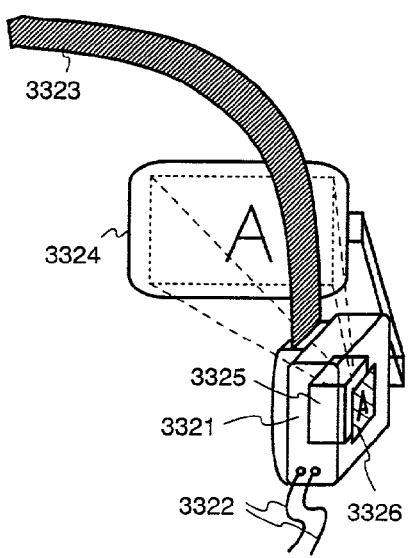

FIG. 24C illustrates a portion (the right-half piece) of a head-mounted EL display which includes a main body 3321, signal cables 3322, a head mount band 3323, a screen portion 3324, an optical system 3325, a display 3326, or the like. The display in accordance with the present invention can be used as the display portion 3326.

Figure 24D:
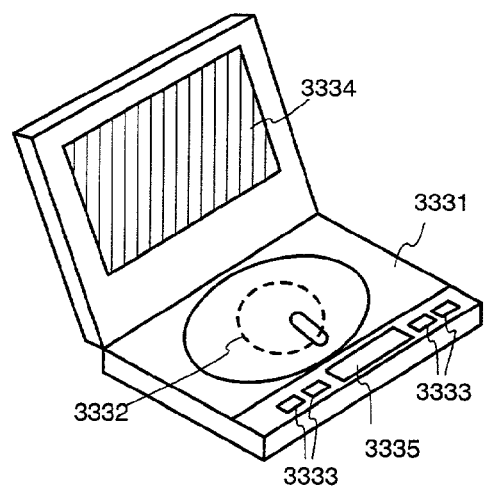

FIG. 24D illustrates an image reproduction apparatus which includes a recording medium (more specifically, a DVD reproduction apparatus), which includes a main body 3331, a recording medium (a DVD or the like) 3332, operation switches 3333, a display portion (a) 3334, another display portion (b) 3335, or the like. The display portion (a) 3334 is used mainly for displaying image information, while the display portion (b) 3335 is used mainly for displaying character information. The display in accordance with the present invention can be used as these display portions (a) 3334 and (b) 3335. The image reproduction apparatus including a recording medium further includes a domestic game equipment or the like.

Figure 24E:
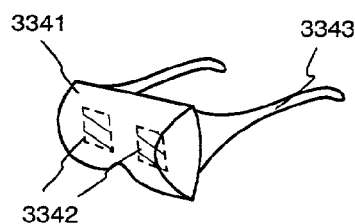

FIG. 24E illustrates a goggle type display (head-mounted display) which includes a main body 3341, a display portion 3342, an arm portion 3343. The display in accordance with the present invention can be used as the display portion 3342.

Figure 24F:
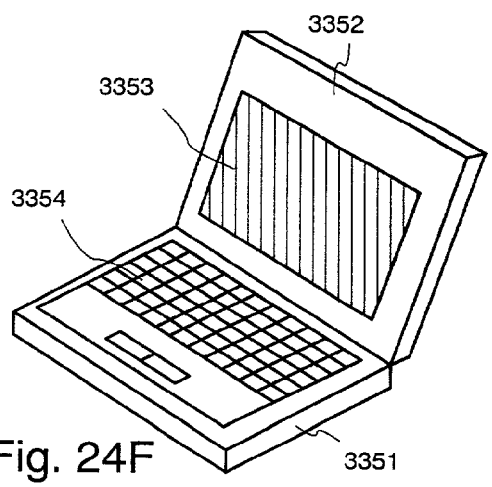

FIG. 24F illustrates a personal computer which includes a main body 3351, a frame 3352, a display portion 3353, a key board 3354, or the like. The display of the present invention can be used as the display portion 3353.

Note that if emission luminance of an EL material becomes higher in the future, it will be applicable to a front-type or rear-type projector in which light including output image information is enlarged by means of lenses or the like to be projected.

The above mentioned electronic apparatuses are more likely to be used for display information distributed through a telecommunication path such as Internet, a CATV (cable television system), and in particular likely to display moving picture information. The EL display is suitable for displaying moving pictures since the EL material can exhibit high response speed.

Further, since a light emitting portion of the EL display consumes power, it is desirable to display information in such a manner that the light emitting portion therein becomes as small as possible. Accordingly, when the EL display is applied to a display portion which mainly displays character information, e.g., a display portion of a portable information terminal, and more particular, a portable telephone or an audio reproducing device, it is desirable to drive the EL display so that the character information is formed by a light-emitting portion while a non-emission portion corresponds to the background.

Figure 25A:
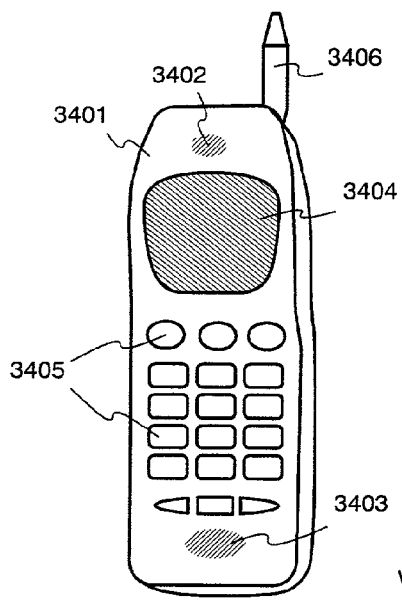
FIGS. 25A–25C illustrate electronic apparatus using the EL display according to the present invention.

FIG. 25A illustrates a portable telephone which includes a main body 3401, an audio output portion 3402, an audio input portion 3403, a display portion 3404, operation switches 3405, and an antenna 3406. The display in accordance with the present invention can be used as the display portion 3404. Note that the display portion 3404 can reduce power consumption of the portable telephone by displaying white-colored characters on a black-colored background.

Figure 25B:
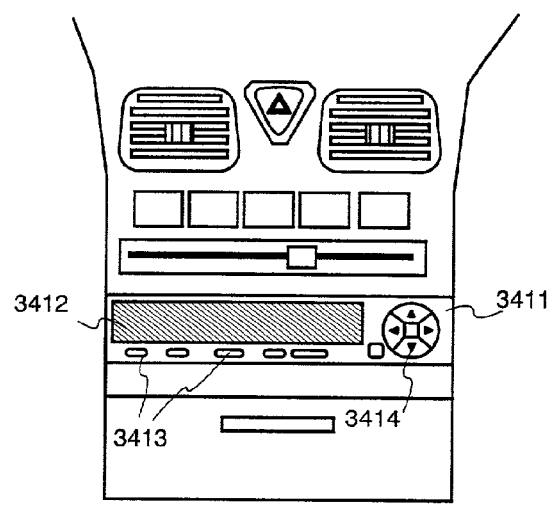

Further, FIG. 25B illustrates a sound reproduction device, specifically, a car audio equipment, which includes a main body 3411, a display portion 3412, and operation switches 3413 and 3414. The display in accordance with the present invention can be used as the display portion 3412. Although the car audio equipment of the mount type is shown in the present embodiment, the present invention is also applicable to a portable type or domestic sound reproducing device. The display portion 3414 can reduce power consumption by displaying white-colored characters on a black-colored background, which is particularly advantageous for the portable type sound reproduction device.

Figure 25C:
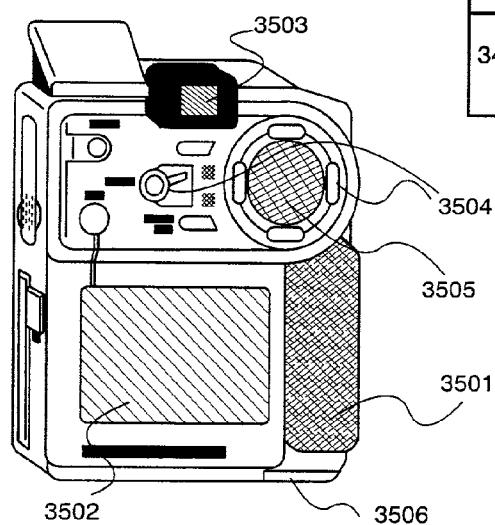
Figure 26:
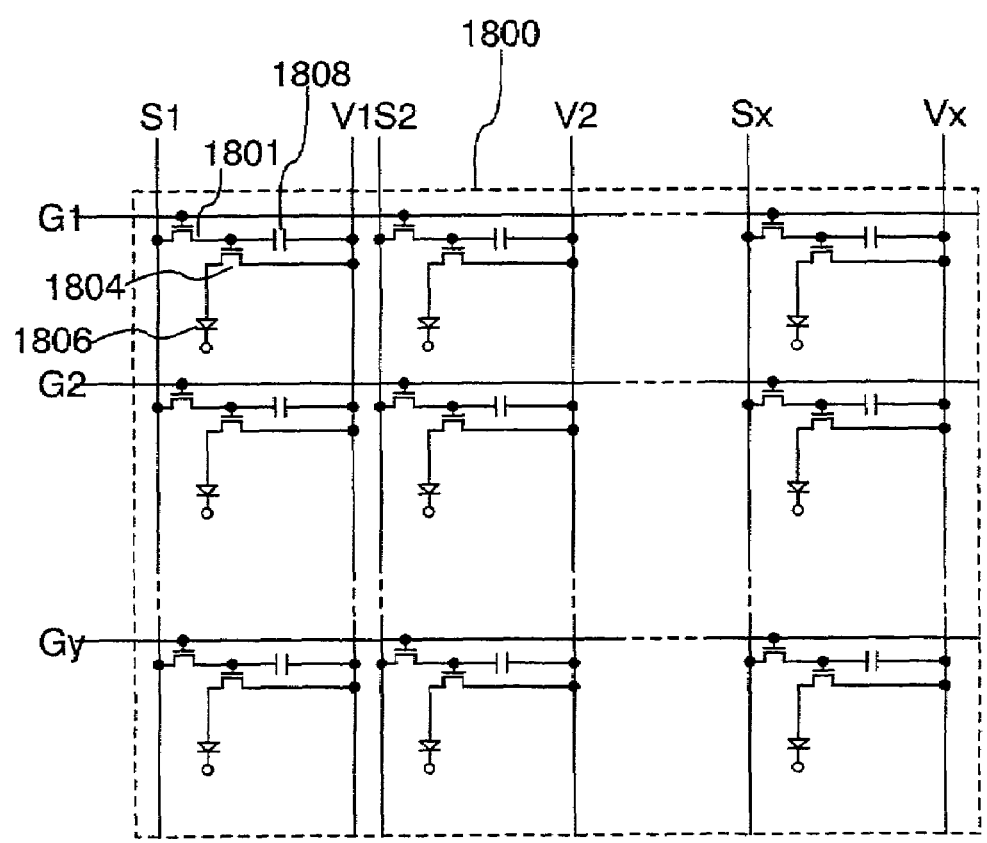
FIG. 26 is a circuit diagram of a pixel portion of a conventional EL display.
Figure 27:
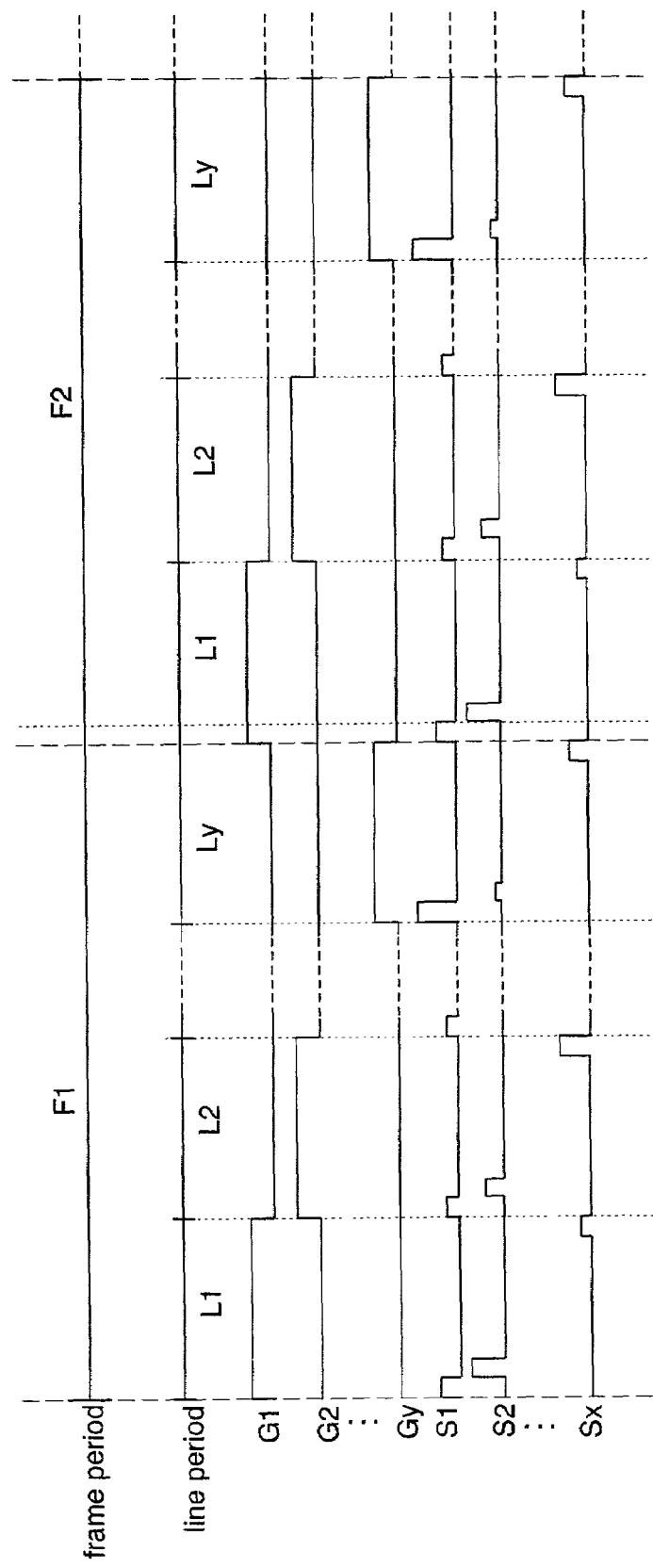
FIG. 27 is a timing chart illustrating a driving method of the conventional EL display.
Figure 28A:
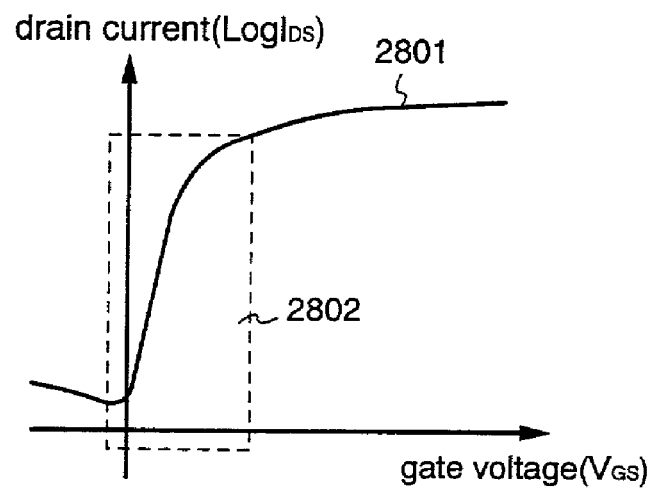
FIGS. 28A and 28B illustrate $I_{DS}$–$V_{GS}$ characteristics of a TFT.
Figure 28B:
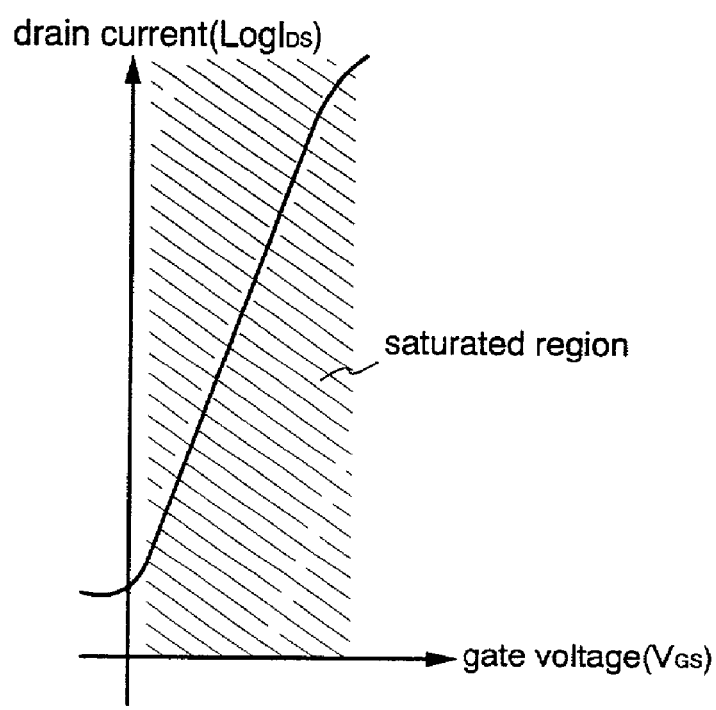

FIG. 25C illustrates a digital camera which includes a main body 3501, a display portion (A) 3502, a view finder portion 3503, operation switches 3504, a display portion (B) 3505, and a battery 3506. The display panel of the present invention can be used for the display portions (A) 3502 and (B) 3505. Further, in a case where the display portion (B) 3505 is used for an operation panel, the power consumption can be reduced by displaying white-colored characters on a black-colored background.

In the case of the portable type electronic apparatuses shown in this embodiment, the sensor portion is provided to perceive the external light and the function to lower the brightness of display when it is used in the dark area as a method to lower the power consumption.

As set forth above, the present invention can be applied variously to a wide range of electronic apparatuses in all fields. The electronic apparatuses in the present embodiment may use any one of configurations shown in Embodiments 1 to 15.

According to the present invention by the above structure, even if there is a variation to some extent in the $I_{DS}$-$V_{GS}$ characteristics between TFTs, variation in the amount of current outputted when equal gate voltage is applied can be suppressed. Therefore, a situation can be avoided that there is considerable difference in the amount of light emitted from the EL elements with regard to adjacent pixels due to the variation in the $I_{DS}$-$V_{GS}$ characteristics even if a signal of the same voltage is inputted thereto.

Further, according to the present invention, a no-light-emission period during which no display is carried out can be provided. In the case of a conventional analog driving method, if an image where all the pixels display white is displayed on an EL display, the EL elements always emit light, which is a cause of accelerating the deterioration of the EL layer. According to the present invention, since a no-light-emission period can be provided, the deterioration of the EL layer can be suppressed to some extent.

What is claimed is:

1. A display device comprising:
    a first TFT comprising a gate electrode electrically connected to a (k+2)th gate signal line, a source region, and a drain region, with one of the source and drain regions electrically connected to a source signal line;
    a second TFT comprising a gate electrode electrically connected to a (k+1)th gate signal line, a source region, and a drain region, with one of the source and drain regions electrically connected to another one of the source and drain regions of the first TFT;
    a third TFT comprising a gate electrode electrically connected to a kth gate signal line, a source region, and a drain region, with one of the source and drain regions electrically connected to another one of the source and drain regions of the second TFT;
    a fourth TFT comprising a gate electrode electrically connected to the another one of the source and drain regions of the second TFT and to the one of the source and drain regions of the third TFT; and
    an electroluminescence element electrically connected to one of source and drain regions of the fourth TFT.

2. A display device comprising:
    a plurality of source signal lines;
    a plurality of gate signal lines crossing said plurality of source signal lines;
    a plurality of power supply lines along said plurality of gate signal lines or said plurality of source signal lines; and
    a plurality of pixels disposed in matrix-form, wherein:
    each of said plurality of pixels comprises a first TFT for switching, a second TFT for switching, a TFT for erasing, a TFT for electroluminescence driving, and an electroluminescence element;
    a gate electrode of said TFT for erasing is connected to a kth gate signal line of said plurality of gate signal lines, wherein k is a natural number;
    a gate electrode of said first TFT for switching is connected to a (k+1)th gate signal line of said plurality of gate signal lines;
    a gate electrode of said second TFT for switching is connected to a (k+2)th gate signal line of said plurality of gate signal lines;
    one of a source region and a drain region of said second TFT for switching is connected to one of said plurality of source signal lines and the other is connected to a source region or a drain region of said first TFT for switching;

said source region or drain region of said first TFT for switching not connected to said source region or drain region of said second TFT for switching is connected to a gate electrode of said TFT for electroluminescence driving;

one of a source region and a drain region of said TFT for erasing is connected to one of said plurality of power supply lines and the other is connected to said gate electrode of said TFT for electroluminescence driving; and a source region of said TFT for electroluminescence driving is connected to one of said plurality of power supply lines and a drain region of said TFT for electroluminescence driving is connected to said electroluminescence element.

3. A display device comprising:

a plurality of source signal lines;

a plurality of gate signal lines crossing said plurality of source signal lines;

a plurality of power supply lines along said plurality of gate signal lines or said plurality of source signal lines; and a plurality of pixels disposed in matrix-form, wherein:

each of said plurality of pixels comprises a first TFT for switching, a second TFT for switching, a TFT for erasing, a TFT for electroluminescence driving, and an electroluminescence element;

a gate electrode of said TFT for erasing is connected to a kth gate signal line of said plurality of gate signal lines, (wherein k is a natural number);

a gate electrode of said first TFT for switching is connected to a (k+2)th gate signal line of said plurality of gate signal lines;

a gate electrode of said second TFT for switching is connected to a (k+1)th gate signal line of said plurality of gate signal lines;

one of a source region and a drain region of said second TFT for switching is connected to one of said plurality of source signal lines and the other is connected to a source region or a drain region of said first TFT for switching;

said source region or drain region of said first TFT for switching not connected to said source region or drain region of said second TFT for switching is connected to a gate electrode of said TFT for electroluminescence driving;

one of a source region and a drain region of said TFT for erasing is connected to one of said plurality of power supply lines and the other is connected to said gate electrode of said TFT for electroluminescence driving; and a source region of said TFT for electroluminescence driving is connected to one of said plurality of power supply lines and a drain region of said TFT for electroluminescence driving is connected to said electroluminescence element.

4. A display device comprising:

a plurality of source signal lines;

a plurality of gate signal lines crossing said plurality of gate signal lines;

a plurality of power supply lines along said plurality of gate signal lines of said plurality of source signal lines; and a plurality of pixels disposed in matrix-form, wherein:

each of said plurality of pixels comprises a first TFT for switching, a second TFT for switching, a TFT for erasing, a TFT for electroluminescence driving, and an electroluminescence element;

said electroluminescence element comprises an anode, a cathode, and an electroluminescence layer provided between said anode and said cathode;

a gate electrode of said TFT for erasing is connected to a kth gate signal line of said plurality of gate signal lines (where k is a natural number);

a gate electrode of said first TFT for switching is connected to a (k+1)th gate signal line of said plurality of gate signal lines;

a gate electrode of said second TFT for switching is connected to a (k+2)th gate signal line of said plurality of gate signal lines;

one of a source region and a drain region of said second TFT for switching is connected to one of said plurality of source signal lines and the other is connected to a source region or a drain region of said first TFT for switching;

said source region or drain region of said first TFT for switching not connected to said source region or drain region of said second TFT for switching is connected to a gate electrode of said TFT for electroluminescence driving;

one of a source region and a drain region of said TFT for erasing is connected to one of said plurality of power supply lines and the other is connected to said gate electrode of said TFT for electroluminescence driving;

a source region of said TFT for electroluminescence driving is connected to one of said plurality of power supply lines and said drain region of said TFT for electroluminescence driving is connected to said anode; and said TFT for electroluminescence driving is a p-channel TFT.

5. A display device comprising:

a plurality of source signal lines;

a plurality of gate signal lines crossing said plurality of gate signal lines;

a plurality of power supply lines along said plurality of gate signal lines of said plurality of source signal lines; and a plurality of pixels disposed in matrix-form, wherein:

each of said plurality of pixels comprises a first TFT for switching, a second TFT for switching, a TFT for erasing, a TFT for electroluminescence driving, and an electroluminescence element;

said electroluminescence element comprises an anode, a cathode, and an electroluminescence layer provided between said anode and said cathode;

a gate electrode of said TFT for erasing is connected to a kth gate signal line of said plurality of gate signal lines (where k is a natural number);

a gate electrode of said first TFT for switching is connected to a (k+1)th gate signal line of said plurality of gate signal lines;

a gate electrode of said second TFT for switching is connected to a (k+2)th gate signal line of said plurality of gate signal lines;

one of a source region and a drain region of said second TFT for switching is connected to one of said plurality of source signal lines and the other is connected to a source region or a drain region of said first TFT for switching;

said source region or drain region of said first TFT for switching not connected to said source region or drain region of said second TFT for switching is connected to a gate electrode of said TFT for electroluminescence driving;

one of a source region and a drain region of said TFT for erasing is connected to one of said plurality of power supply lines and the other is connected to said gate electrode of said TFT for electroluminescence driving;

a source region of said TFT for electroluminescence driving is connected to one of said plurality of power supply lines and said drain region of said TFT for electroluminescence driving is connected to said cathode; and said TFT for electroluminescence driving is an n-channel TFT.

6. A display device according to claim 4, wherein said electroluminescence layer is formed of a small molecular organic substance or a polymer organic material.

7. A display device according to claim 5, wherein said electroluminescence layer is formed of a small molecular organic substance or a polymer organic material.

8. A display device according to claim 6, wherein said small molecular organic material is formed of $Alq_3$ or a TPD.

9. A display device according to claim 7, wherein said small molecular organic material is formed of $Alq_3$ or a TPD.

10. A display device according to claim 6, wherein said polymer organic material is formed of PPV, PVK, or polycarbonate.

11. A display device according to claim 7, wherein said polymer organic material is formed of PPV, PVK, or polycarbonate.

12. A display device according to claim 4, wherein:
said anode or cathode is connected directly or through at least one wiring to said drain region of said TFT for electroluminescence driving; and
a bank is formed over a region where said anode or cathode is connected to said drain region of said TFT for electroluminescence driving or to said at least one wiring.

13. A display device according to claim 5, wherein:
said anode or cathode is connected directly or through at least one wiring to said drain region of said TFT for electroluminescence driving; and
a bank is formed over a region where said anode or cathode is connected to said drain region of said TFT for electroluminescence driving or to said at least one wiring.

14. A display device according to claim 9, wherein said bank has a light blocking property.

15. A display device comprising:
a plurality of source signal lines;
a plurality of gate signal lines crossing said plurality of gate signal lines;
a plurality of power supply lines along said plurality of gate signal lines of said plurality of source signal lines; and
a plurality of pixels disposed in matrix-form, wherein:
each of said plurality of pixels comprises a first TFT for switching, a second TFT for switching, a TFT for erasing, a TFT for electroluminescence driving, and an electroluminescence element;

a gate electrode of said TFT for erasing is connected to a kth gate signal line of said plurality of gate signal lines (where k is a natural number);

a gate electrode of said first TFT for switching is connected to a (k+1)th gate signal line of said plurality of gate signal lines;

a gate electrode of said second TFT for switching is connected to a (k+2)th gate signal line of said plurality of gate signal lines;

one of a source region and a drain region of said second TFT for switching is connected to one of said plurality of source signal lines and the other is connected to a source region or a drain region of said first TFT for switching;

said source region or drain region of said first TFT for switching not connected to said source region or drain region of said second TFT for switching is connected to a gate electrode of said TFT for electroluminescence driving;

one of a source region and a drain region of said TFT for erasing is connected to one of said plurality of power supply lines and the other is connected to said gate electrode of said TFT for electroluminescence driving;

a source region of said TFT for electroluminescence driving is connected to one of said plurality of power supply lines and a drain region of said TFT for electroluminescence driving is connected to said electroluminescence element;

a plurality of writing periods Ta and a plurality of erasing periods Te are provided in one frame period;

said plurality of gate signal lines are sequentially selected according to a first selection signal sequentially inputted to said plurality of gate signal lines during said plurality of writing periods Ta;

said plurality of gate signal lines are serially selected according to a second selection signal serially inputted to said plurality of gate signal lines during said plurality of erasing periods Te;

a period where a gate signal line is selected from said plurality of gate signal lines according to said first selection signal and a period where an adjacent gate signal line is selected overlap each other;

a period where a gate signal line is selected from said plurality of gate signal lines according to said second selection signal and a period where an adjacent gate signal line is selected do not overlap each other; and a period where an arbitrary gate signal line is selected from said plurality of gate signal lines according to said first selection signal is twice as long as a period where said gate signal line is selected according to said second selection signal.

16. A display device comprising:
a plurality of source signal lines;
a plurality of gate signal lines crossing said plurality of gate signal lines;
a plurality of power supply lines along said plurality of gate signal lines of said plurality of source signal lines; and
a plurality of pixels disposed in matrix-form, wherein:
each of said plurality of pixels comprises a first TFT for switching, a second TFT for switching, a TFT for erasing, a TFT for electroluminescence driving, and an electroluminescence element;

a gate electrode of said TFT for erasing is connected to a kth gate signal line of said plurality of gate signal lines (where k is a natural number);

a gate electrode of said first TFT for switching is connected to a (k+1)th gate signal line of said plurality of gate signal lines;
a gate electrode of said second TFT for switching is connected to a (k+2)th gate signal line of said plurality of gate signal lines;
one of a source region and a drain region of said second TFT for switching is connected to one of said plurality of source signal lines and the other is connected to a source region or a drain region of said first TFT for switching;
said source region or drain region of said first TFT for switching not connected to said source region or drain region of said second TFT for switching is connected to a gate electrode of said TFT for electroluminescence driving;
one of a source region and a drain region of said TFT for erasing is connected to one of said plurality of power supply lines and the other is connected to said gate electrode of said TFT for electroluminescence driving;
a source region of said TFT for electroluminescence driving is connected to one of said plurality of power supply lines and a drain region of said TFT for electroluminescence driving is connected to said electroluminescence element;
a plurality of writing periods Ta and a plurality of erasing periods Te are provided in one frame period;
said plurality of gate signal lines are serially selected according to a first selection signal serially inputted to said plurality of gate signal lines during said plurality of writing periods Ta;
said plurality of gate signal lines are serially selected according to a second selection signal serially inputted to said plurality of gate signal lines during said plurality of erasing periods Te;
a period where a gate signal line is selected from said plurality of gate signal lines according to said first selection signal and a period where an adjacent gate signal line is selected overlap each other;
a period where a gate signal line is selected from said plurality of gate signal lines according to said second selection signal and a period where an adjacent gate signal line is selected do not overlap each other;
a digital video signal is inputted to said plurality of source signal lines during a period where said plurality of gate signal lines are selected according to said first selection signal; and
a period where an arbitrary gate signal line is selected from said plurality of gate signal lines according to said first selection signal is twice as long as a period where said gate signal line is selected according to said second selection signal.

17. A display device comprising:
a plurality of source signal lines;
a plurality of gate signal lines crossing said plurality of gate signal lines;
a plurality of power supply lines along said plurality of gate signal lines of said plurality of source signal lines; and
a plurality of pixels disposed in matrix-form, wherein:
each of said plurality of pixels comprises a first TFT for switching, a second TFT for switching, a TFT for erasing, a TFT for electroluminescence driving, and an electroluminescence element;
a gate electrode of said TFT for erasing is connected to a kth gate signal line of said plurality of gate signal lines (where k is a natural number);
a gate electrode of said first TFT for switching is connected to a (k+1)th gate signal line of said plurality of gate signal lines;
a gate electrode of said second TFT for switching is connected to a (k+2)th gate signal line of said plurality of gate signal lines;
one of a source region and a drain region of said second TFT for switching is connected to one of said plurality of source signal lines and the other is connected to a source region or a drain region of said first TFT for switching;
said source region or drain region of said first TFT for switching not connected to said source region or drain region of said second TFT for switching is connected to a gate electrode of said TFT for electroluminescence driving;
one of a source region and a drain region of said TFT for erasing is connected to one of said plurality of power supply lines and the other is connected to said gate electrode of said TFT for electroluminescence driving;
a source region of said TFT for electroluminescence driving is connected to one of said plurality of power supply lines and a drain region of said TFT for electroluminescence driving is connected to said electroluminescence element;
n writing periods Ta1, Ta2, . . . , and Tan and (m−1) erasing periods Te1, Te2, . . . , and Te(m−1) are provided in one frame period (where in is an arbitrary number from 2 to n);
a digital video signal is inputted to said gate electrodes of said TFTs for electroluminescence driving during said writing periods Ta1, Ta2, . . . , and Tan;
said digital video signal inputted to said gate electrodes of said TFTs for electroluminescence driving is erased during said erasing periods Te1, Te2, . . . , and Te(m−1);
periods from the start of said writing periods Ta1, Ta2, . . . , and Tan to the start of writing periods or erasing periods appearing subsequently to said writing periods Ta1, Ta2, . . . , and Tan are display periods Tr1, Tr2, . . . , and Tr(m−1), respectively;
periods from the start of said erasing periods Te1, Te2, . . . , and Te(m−1) to the start of writing periods appearing subsequently to said erasing periods Te1, Te2, . . . , and Te(m−1) are non-display periods Td1, Td2, . . . , and Tdn, respectively;
whether said electroluminescence elements emit light or not during said display periods Tr1, Tr2, . . . , and Trn is selected according to said digital video signal; and
ratio of lengths of said display periods Tr1, Tr2, . . . , and Trn is represented as $2^0:2^1: \ldots :2^{(n-1)}$.

18. A display device comprising:
a plurality of source signal lines;
a plurality of gate signal lines crossing said plurality of gate signal lines;
a plurality of power supply lines along said plurality of gate signal lines of said plurality of source signal lines; and
a plurality of pixels disposed in matrix-form, wherein:
each of said plurality of pixels comprises a first TFT for switching, a second TFT for switching, a TFT for erasing, a TFT for electroluminescence driving, and an electroluminescence element;
a gate electrode of said TFT for erasing is connected to a kth gate signal line of said plurality of gate signal lines (where k is a natural number);

a gate electrode of said first TFT for switching is connected to a (k+1)th gate signal line of said plurality of gate signal lines;

a gate electrode of said second TFT for switching is connected to a (k+2)th gate signal line of said plurality of gate signal lines;

one of a source region and a drain region of said second TFT for switching is connected to one of said plurality of source signal lines and the other is connected to a source region or a drain region of said first TFT for switching;

said source region or drain region of said first TFT for switching not connected to said source region or drain region of said second TFT for switching is connected to a gate electrode of said TFT for electroluminescence driving;

one of a source region and a drain region of said TFT for erasing is connected to one of said plurality of power supply lines and the other is connected to said gate electrode of said TFT for electroluminescence driving;

a source region of said TFT for electroluminescence driving is connected to one of said plurality of power supply lines and a drain region of said TFT for electroluminescence driving is connected to said electroluminescence element;

n writing periods Ta1, Ta2, ..., and Tan and (m−1) erasing periods Te1, Te2, ..., and Te(m−1) are provided in one frame period (where m is an arbitrary number from 2 to n);

a digital video signal is inputted to said gate electrodes of said TFTs for electroluminescence driving during said writing periods Ta1, Ta2, ..., and Tan;

said digital video signal inputted to said gate electrodes of said TFTs for electroluminescence driving is erased during said erasing periods Te1, Te2, ..., and Te(m−1);

periods from the start of said writing periods Ta1, Ta2, ..., and Tan to the start of writing periods or erasing periods appearing subsequently to said writing periods Ta1, Ta2, ..., and Tan are display periods Tr1, Tr2, ..., and Tr(m−1), respectively;

periods from the start of said erasing periods Te1, Te2, ..., and Te(m−1) to the start of writing periods appearing subsequently to said erasing periods Te1, Te2, ..., and Te(m−1) are non-display periods Td1, Td2, ..., and Tdn, respectively;

whether said electroluminescence elements emit light or not during said display periods Tr1, Tr2, ..., and Trn is selected according to said digital video signal;

ratio of lengths of said display periods Tr1, Tr2, ..., and Trn is represented as $2^0:2^1: \ldots :2^{(n-1)}$;

said plurality of gate signal lines are serially selected according to a first selection signal serially inputted to said plurality of gate signal lines during said writing periods Ta1, Ta2, ..., and Tan;

said plurality of gate signal lines are serially selected according to a second selection signal serially inputted to said plurality of gate signal lines during said erasing periods Te1, Te2, ..., and Te(m−1);

a period where a gate signal line is selected from said plurality of gate signal lines according to said first selection signal and a period where an adjacent gate signal line is selected overlap each other;

a period where a gate signal line is selected from said plurality of gate signal lines according to said second selection signal and a period where an adjacent gate signal line is selected do not overlap each other; and a period where an arbitrary gate signal line is selected from said plurality of gate signal lines according to said first selection signal is twice as long as a period where said gate signal line is selected according to said second selection signal.

19. A display device according to claim 17, wherein said display periods Tr1, Tr2, ..., and Trn appear in random order.

20. A display device according to claim 18, wherein said display periods Tr1, Tr2, ..., and Trn appear in random order.

21. A display device according to claim 17, wherein a longest non-display period among said non-display periods Td1, Td2, ..., and Tdn appears last in one frame period.

22. A display device according to claim 18, wherein a longest non-display period among said non-display periods Td1, Td2, ..., and Tdn appears last in one frame period.

23. A display device according to claim 15, wherein said plurality of writing periods Ta do not overlap each other.

24. A display device according to claim 16, wherein said plurality of writing periods Ta do not overlap each other.

25. A display device according to claim 17, wherein said writing periods Ta1, Ta2, ..., and Tan do not overlap each other.

26. A display device according to claim 18, wherein said writing periods Ta1, Ta2, ..., and Tan do not overlap each other.

27. A display device according to claim 15, wherein said plurality of erasing periods Te do not overlap each other.

28. A display device according to claim 16, wherein said plurality of erasing periods Te do not overlap each other.

29. A display device according to claim 17, wherein said erasing periods Te1, Te2, ..., and Te(m−1) do not overlap each other.

30. A display device according to claim 18, wherein said erasing periods Te1, Te2, ..., and Te(m−1) do not overlap each other.

31. A display device according to claim 2, further comprising:
gate wiring connected to said gate electrode of said TFT for electroluminescence driving; and
capacity wiring connected to one of said plurality of power supply lines,
wherein a gate insulating film of said first TFT for switching, said second TFT for switching, said TFT for erasing, and said TFT for electroluminescence driving is provided between said gate wiring and said capacity wiring.

32. A display device according to claim 3, further comprising:
gate wiring connected to said gate electrode of said TFT for electroluminescence driving; and
capacity wiring connected to one of said plurality of power supply lines,
wherein a gate insulating film of said first TFT for switching, said second TFT for switching, said TFT for erasing, and said TFT for electroluminescence driving is provided between said gate wiring and said capacity wiring.

33. A display device according to claim 4, further comprising:
gate wiring connected to said gate electrode of said TFT for electroluminescence driving; and
capacity wiring connected to one of said plurality of power supply lines,
wherein a gate insulating film of said first TFT for switching, said second TFT for switching, said TFT for erasing, and said TFT for electroluminescence driving is provided between said gate wiring and said capacity wiring.

34. A display device according to claim 5, further comprising:
gate wiring connected to said gate electrode of said TFT for electroluminescence driving; and
capacity wiring connected to one of said plurality of power supply lines,
wherein a gate insulating film of said first TFT for switching, said second TFT for switching, said TFT for erasing, and said TFT for electroluminescence driving is provided between said gate wiring and said capacity wiring.

35. A display device according to claim 15, further comprising:
gate wiring connected to said gate electrode of said TFT for electroluminescence driving; and
capacity wiring connected to one of said plurality of power supply lines,
wherein a gate insulating film of said first TFT for switching, said second TFT for switching, said TFT for erasing, and said TFT for electroluminescence driving is provided between said gate wiring and said capacity wiring.

36. A display device according to claim 16, further comprising:
gate wiring connected to said gate electrode of said TFT for electroluminescence driving; and
capacity wiring connected to one of said plurality of power supply lines,
wherein a gate insulating film of said first TFT for switching, said second TFT for switching, said TFT for erasing, and said TFT for electroluminescence driving is provided between said gate wiring and said capacity wiring.

37. A display device according to claim 17, further comprising:
gate wiring connected to said gate electrode of said TFT for electroluminescence driving; and
capacity wiring connected to one of said plurality of power supply lines,
wherein a gate insulating film of said first TFT for switching, said second TFT for switching, said TFT for erasing, and said TFT for electroluminescence driving is provided between said gate wiring and said capacity wiring.

38. A display device according to claim 18, further comprising:
gate wiring connected to said gate electrode of said TFT for electroluminescence driving; and
capacity wiring connected to one of said plurality of power supply lines,
wherein a gate insulating film of said first TFT for switching, said second TFT for switching, said TFT for erasing, and said TFT for electroluminescence driving is provided between said gate wiring and said capacity wiring.

39. A display device according to claim 2, wherein:
two of said plurality of pixels disposed along a direction of provision of said plurality of gate signal lines are adjacent to each other with sandwiching any one of said plurality of power supply lines therebetween and said respective source regions of said TFTs for electroluminescence driving of said two pixels are connected to said one of said plurality of power supply lines.

40. A display device according to claim 3, wherein:
two of said plurality of pixels disposed along a direction of provision of said plurality of gate signal lines are adjacent to each other with sandwiching any one of said plurality of power supply lines therebetween and said respective source regions of said TFTs for electroluminescence driving of said two pixels are connected to said one of said plurality of power supply lines.

41. A display device according to claim 4, wherein:
two of said plurality of pixels disposed along a direction of provision of said plurality of gate signal lines are adjacent to each other with sandwiching any one of said plurality of power supply lines therebetween and said respective source regions of said TFTs for electroluminescence driving of said two pixels are connected to said one of said plurality of power supply lines.

42. A display device according to claim 5, wherein:
two of said plurality of pixels disposed along a direction of provision of said plurality of gate signal lines are adjacent to each other with sandwiching any one of said plurality of power supply lines therebetween and said respective source regions of said TFTs for electroluminescence driving of said two pixels are connected to said one of said plurality of power supply lines.

43. A display device according to claim 15, wherein:
two of said plurality of pixels disposed along a direction of provision of said plurality of gate signal lines are adjacent to each other with sandwiching any one of said plurality of power supply lines therebetween and said respective source regions of said TFTs for electroluminescence driving of said two pixels are connected to said one of said plurality of power supply lines.

44. A display device according to claim 16, wherein:
two of said plurality of pixels disposed along a direction of provision of said plurality of gate signal lines are adjacent to each other with sandwiching any one of said plurality of power supply lines therebetween and said respective source regions of said TFTs for electroluminescence driving of said two pixels are connected to said one of said plurality of power supply lines.

45. A display device according to claim 17, wherein:
two of said plurality of pixels disposed along a direction of provision of said plurality of gate signal lines are adjacent to each other with sandwiching any one of said plurality of power supply lines therebetween and said respective source regions of said TFTs for electroluminescence driving of said two pixels are connected to said one of said plurality of power supply lines.

46. A display device according to claim 18, wherein:
two of said plurality of pixels disposed along a direction of provision of said plurality of gate signal lines are adjacent to each other with sandwiching any one of said plurality of power supply lines therebetween and said respective source regions of said TFTs for electroluminescence driving of said two pixels are connected to said one of said plurality of power supply lines.

47. A display device according to claim 1, wherein said first TFT, said second TFT, and said third TFT are n-channel TFTs.

48. A display device according to claim 2, wherein said first TFT for switching, said second TFT for switching, and said TFT for erasing are n-channel TFTs.

49. A display device according to claim 3, wherein said first TFT for switching, said second TFT for switching, and said TFT for erasing are n-channel TFTs.

50. A display device according to claim 4, wherein said first TFT for switching, said second TFT for switching, and said TFT for erasing are n-channel TFTs.

51. A display device according to claim 5, wherein said first TFT for switching, said second TFT for switching, and said TFT for erasing are n-channel TFTs.

52. A display device according to claim 15, wherein said first TFT for switching, said second TFT for switching, and said TFT for erasing are n-channel TFTs.

53. A display device according to claim 16, wherein said first TFT for switching, said second TFT for switching, and said TFT for erasing are n-channel TFTs.

54. A display device according to claim 17, wherein said first TFT for switching, said second TFT for switching, and said TFT for erasing are n-channel TFTs.

55. A display device according to claim 18, wherein said first TFT for switching, said second TFT for switching, and said TFT for erasing are n-channel TFTs.

56. A display device according to claim 1, wherein said first TFT, said second TFT, and said third TFT are p-channel TFTs.

57. A display device according to claim 2, wherein said first TFT for switching, said second TFT for switching, and said TFT for erasing are p-channel TFTs.

58. A display device according to claim 3, wherein said first TFT for switching, said second IFT for switching, and said TFT for erasing are p-channel TFTs.

59. A display device according to claim 4, wherein said first TFT for switching, said second TFT for switching, and said TFT for erasing are p-channel TFTs.

60. A display device according to claim 5, wherein said first TFT for switching, said second TFT for switching, and said TFT for erasing are p-channel TFTs.

61. A display device according to claim 15, wherein said first TFT for switching, said second TFT for switching, and said TFT for erasing are p-channel TFTs.

62. A display device according to claim 16, wherein said first TFT for switching, said second TFT for switching, and said TFT for erasing are p-channel TFTs.

63. A display device according to claim 17, wherein said first TFT for switching, said second TFT for switching, and said TFT for erasing are p-channel TFTs.

64. A display device according to claim 18, wherein said first TFT for switching, said second TFT for switching, and said TFT for erasing are p-channel TFTs.

65. A display device according to claim 1, wherein said fourth TFT is driven in a linear region.

66. A display device according to claim 2, wherein said TFT for electroluminescence driving is driven in a linear region.

67. A display device according to claim 3, wherein said TFT for electroluminescence driving is driven in a linear region.

68. A display device according to claim 4, wherein said TFT for electroluminescence driving is driven in a linear region.

69. A display device according to claim 5, wherein said TFT for electroluminescence driving is driven in a linear region.

70. A display device according to claim 15, wherein said TFT for electroluminescence driving is driven in a linear region.

71. A display device according to claim 16, wherein said TFT for electroluminescence driving is driven in a linear region.

72. A display device according to claim 17, wherein said TFT for electroluminescence driving is driven in a linear region.

73. A display device according to claim 18, wherein said TFT for electroluminescence driving is driven in a linear region.

74. A display device according to claim 1, wherein said display device is a device selected from the group of consisting: a computer, a video camera and a DVD player.

75. A display device according to claim 2, wherein said display device is a device selected from the group of consisting: a computer, a video camera and a DVD player.

76. A display device according to claim 3, wherein said display device is a device selected from the group of consisting: a computer, a video camera and a DVD player.

77. A display device according to claim 4, wherein said display device is a device selected from the group of consisting: a computer, a video camera and a DVD player.

78. A display device according to claim 5, wherein said display device is a device selected from the group of consisting: a computer, a video camera and a DVD player.

79. A display device according to claim 15, wherein said display device is a device selected from the group of consisting: a computer, a video camera and a DVD player.

80. A display device according to claim 16, wherein said display device is a device selected from the group of consisting: a computer, a video camera and a DVD player.

81. A display device according to claim 17, wherein said display device is a device selected from the group of consisting: a computer, a video camera and a DVD player.

82. A display device according to claim 18, wherein said display device is a device selected from the group of consisting: a computer, a video camera and a DVD player.

* * * * *